United States Patent
Kim et al.

(10) Patent No.: US 11,195,726 B2
(45) Date of Patent: Dec. 7, 2021

(54) SEMICONDUCTOR DEVICE AND MANUFACTURING METHOD THEREOF

(71) Applicant: Amkor Technology Singapore Holding Pte. Ltd., Singapore (SG)

(72) Inventors: Dong Jin Kim, Gwangju (KR); Jin Han Kim, Namyangju-si (KR); Won Chul Do, Seoul (KR); Jae Hun Bae, Seoul (KR); Won Myoung Ki, Anyang-si (KR); Dong Hoon Han, Busan (KR); Do Hyung Kim, Seongnam-si (KR); Ji Hun Lee, Seoul (KR); Jun Hwan Park, Seoul (KR); Seung Nam Son, Seoul (KR); Hyun Cho, Yeosu-si (KR); Curtis Zwenger, Chandler, AZ (US)

(73) Assignee: Amkor Technology Singapore Holding Pte. Ltd., Singapore (SG)

(*) Notice: Subject to any disclaimer, the term of this patent is extended or adjusted under 35 U.S.C. 154(b) by 0 days.

(21) Appl. No.: 16/781,703

(22) Filed: Feb. 4, 2020

(65) Prior Publication Data

US 2020/0321222 A1    Oct. 8, 2020

Related U.S. Application Data

(63) Continuation of application No. 16/017,735, filed on Jun. 25, 2018, now Pat. No. 10,553,451, which is a
(Continued)

(30) Foreign Application Priority Data

Mar. 18, 2015    (KR) .................. 10-2015-0037481

(51) Int. Cl.
*H01L 21/48*    (2006.01)
*H01L 21/683*    (2006.01)
(Continued)

(52) U.S. Cl.
CPC ...... *H01L 21/4857* (2013.01); *H01L 21/6835* (2013.01); *H01L 23/49822* (2013.01);
(Continued)

(58) Field of Classification Search
CPC .......... H01L 21/4857; H01L 23/49822; H01L 23/5389; H01L 24/92; H01L 21/6835;
(Continued)

(56) References Cited

U.S. PATENT DOCUMENTS 8,618,648 B1    12/2013   Kwon et al.
9,490,231 B2 *  11/2016   Ko ..................... H01L 23/562
(Continued)

FOREIGN PATENT DOCUMENTS

JP    10-20040047902    6/2006
JP    2010239126 A    10/2010
(Continued)

OTHER PUBLICATIONS

PCT International Search Report and Written Opinion dated Jun. 16, 2016 for PCT Patent Application No. PCT/US2016/22746.
(Continued)

*Primary Examiner* — Yasser A Abdelaziez
(74) *Attorney, Agent, or Firm* — McAndrews, Held & Malloy, Ltd.

(57) ABSTRACT

A method for manufacturing a semiconductor device and a semiconductor device produced thereby. For example and without limitation, various aspects of this disclosure provide a method for manufacturing a semiconductor device, and a semiconductor device produced thereby, that comprises an interposer without through silicon vias.

13 Claims, 39 Drawing Sheets

Related U.S. Application Data continuation of application No. 15/041,649, filed on Feb. 11, 2016, now Pat. No. 10,008,393.

(51) Int. Cl.
  *H01L 23/538* (2006.01)
  *H01L 23/00* (2006.01)
  *H01L 23/498* (2006.01)
  H01L 23/31 (2006.01)
  H01L 21/56 (2006.01)

(52) U.S. Cl.
  CPC .......... *H01L 23/5389* (2013.01); *H01L 24/92* (2013.01); *H01L 21/4853* (2013.01); *H01L 21/56* (2013.01); *H01L 21/561* (2013.01); *H01L 21/568* (2013.01); *H01L 23/3128* (2013.01); *H01L 23/49816* (2013.01); *H01L 24/11* (2013.01); *H01L 24/13* (2013.01); *H01L 24/16* (2013.01); *H01L 24/32* (2013.01); *H01L 24/81* (2013.01); *H01L 24/83* (2013.01); *H01L 24/97* (2013.01); *H01L 2221/68304* (2013.01); *H01L 2221/68318* (2013.01); *H01L 2221/68331* (2013.01); *H01L 2221/68345* (2013.01); *H01L 2221/68363* (2013.01); *H01L 2224/1132* (2013.01); *H01L 2224/131* (2013.01); *H01L 2224/133* (2013.01); *H01L 2224/13294* (2013.01); *H01L 2224/16227* (2013.01); *H01L 2224/16237* (2013.01); *H01L 2224/16238* (2013.01); *H01L 2224/32225* (2013.01); *H01L 2224/73204* (2013.01); *H01L 2224/81005* (2013.01); *H01L 2224/8191* (2013.01); *H01L 2224/81192* (2013.01); *H01L 2224/81203* (2013.01); *H01L 2224/81224* (2013.01); *H01L 2224/81424* (2013.01); *H01L 2224/81439* (2013.01); *H01L 2224/81444* (2013.01); *H01L 2224/81447* (2013.01); *H01L 2224/81464* (2013.01); *H01L 2224/81815* (2013.01); *H01L 2224/81911* (2013.01); *H01L 2224/81913* (2013.01); *H01L 2224/81914* (2013.01); *H01L 2224/83* (2013.01); *H01L 2224/83005* (2013.01); *H01L 2224/83104* (2013.01); *H01L 2224/83192* (2013.01); *H01L 2224/92* (2013.01); *H01L 2224/9202* (2013.01); *H01L 2224/92125* (2013.01); *H01L 2224/97* (2013.01); *H01L 2924/1421* (2013.01); *H01L 2924/1433* (2013.01); *H01L 2924/14335* (2013.01); *H01L 2924/15311* (2013.01); *H01L 2924/15331* (2013.01); *H01L 2924/1815* (2013.01); *H01L 2924/18161* (2013.01)

(58) Field of Classification Search
  CPC ................ H01L 21/4853; H01L 21/56; H01L 2221/68304; H01L 2221/68363; H01L 2224/83; H01L 23/49816; H01L 24/11; H01L 24/13; H01L 24/16; H01L 24/32; H01L 24/81; H01L 24/83; H01L 2221/68331; H01L 2224/1132; H01L 2224/131; H01L 2224/13294; H01L 2224/133; H01L 2224/16237; H01L 2224/16238; H01L 2224/81192; H01L 2224/81203; H01L 2224/81224; H01L 2224/81424; H01L 2224/81439; H01L 2224/81444; H01L 2224/81447; H01L 2224/81464; H01L 2224/81815; H01L 2224/83192; H01L 2224/92; H01L 2224/9202; H01L 2924/1815; H01L 2224/8191; H01L 2224/83104; H01L 2224/81911; H01L 2224/81913; H01L 2224/81914; H01L 2221/68318; H01L 2221/68345; H01L 2224/83005; H01L 23/3128; H01L 21/561; H01L 21/568; H01L 24/97; H01L 2224/16227; H01L 2224/32225; H01L 2224/73204; H01L 2224/81005; H01L 2224/92125; H01L 2224/97; H01L 2924/1421; H01L 2924/1433; H01L 2924/14335; H01L 2924/15311; H01L 2924/15331; H01L 2924/18161

See application file for complete search history.

(56) References Cited

U.S. PATENT DOCUMENTS

| | | |
|---|---|---|
| 9,524,942 B2 | 12/2016 | Yu |
| 2003/0102546 A1 | 6/2003 | Lee et al. |
| 2003/0164540 A1 | 9/2003 | Lee et al. |
| 2004/0195686 A1 | 10/2004 | Jobetto et al. |
| 2007/0126127 A1 | 6/2007 | Jobetto et al. |
| 2007/0126128 A1 | 6/2007 | Jobetto et al. |
| 2009/0200665 A1 | 8/2009 | Jobetto et al. |
| 2011/0254156 A1 | 10/2011 | Lin |
| 2012/0074585 A1 | 3/2012 | Koo et al. |
| 2012/0077313 A1* | 3/2012 | Homma .................. H01L 25/50 438/109 |
| 2012/0153445 A1 | 6/2012 | Son et al. |
| 2013/0187292 A1 | 7/2013 | Semmelmeyer et al. |
| 2013/0277829 A1 | 10/2013 | Yee et al. |
| 2014/0061888 A1 | 3/2014 | Lin et al. |
| 2014/0147970 A1 | 5/2014 | Kim et al. |
| 2014/0217610 A1 | 8/2014 | Jeng et al. |
| 2014/0231991 A1 | 8/2014 | Yee et al. |
| 2014/0252599 A1 | 9/2014 | Kwon et al. |
| 2014/0327145 A9 | 11/2014 | Pagaila et al. |
| 2015/0017764 A1 | 1/2015 | Lin et al. |
| 2016/0118311 A1* | 4/2016 | Hu ........................ H01L 21/486 257/737 |
| 2016/0343695 A1 | 11/2016 | Lin |
| 2017/0263544 A1* | 9/2017 | Hiner ................. H01L 23/49827 |
| 2018/0151540 A1* | 5/2018 | Yu ..................... H01L 23/49822 |

FOREIGN PATENT DOCUMENTS

| | | |
|---|---|---|
| JP | 20100239126 | 10/2010 |
| JP | 5577760 B2 | 8/2014 |
| KR | 10-20110114155 | 10/2011 |
| KR | 10-20130118757 | 10/2013 |
| KR | 101366461 | 2/2014 |
| KR | 20-20140030014 | 3/2014 |
| KR | 10-20140042620 | 4/2014 |
| TW | 201501242 A | 1/2015 |

OTHER PUBLICATIONS

Second Office Action of PRC Patent Application No. 201680000787. 9, dated May 8, 2020.

* cited by examiner

SEMICONDUCTOR DEVICE AND MANUFACTURING METHOD THEREOF

CROSS-REFERENCE TO RELATED APPLICATIONS/INCORPORATION BY REFERENCE

The present application is a continuation of U.S. patent application Ser. No. 16/017,735, filed on Jun. 25, 2018, and titled "Semiconductor Device and Manufacturing Method Thereof," expected to issue as U.S. Pat. No. 10,553,451; which is a continuation of U.S. patent application Ser. No. 15/041,649, filed on Feb. 11, 2016, and titled "Semiconductor Device and Manufacturing Method Thereof," now U.S. Pat. No. 10,008,383; which makes reference to, claims priority to, and claims the benefit of Korean Patent Application No. 10-2015-0037481, filed on Mar. 18, 2015 in the Korean Intellectual Property Office and titled "SEMICONDUCTOR DEVICE AND MANUFACTURING METHOD THEREOF," the contents of each of which are hereby incorporated herein by reference in their entirety.

BACKGROUND

Present methods for forming various semiconductor devices, for example including an interposer with through silicon vias (TSVs), are inadequate, for example utilizing high-complexity and/or high-cost processes. Further limitations and disadvantages of conventional and traditional approaches will become apparent to one of skill in the art, through comparison of such approaches with the present disclosure as set forth in the remainder of the present application with reference to the drawings.

SUMMARY

Figure 1A:
FIGS. 1A to 1J show cross-sectional views illustrating a method of manufacturing a semiconductor device, in accordance with various aspects of the present disclosure.

Various aspects of this disclosure provide a method for manufacturing a semiconductor device and a semiconductor device produced thereby. For example and without limitation, various aspects of this disclosure provide a method for manufacturing a semiconductor device, and a semiconductor device produced thereby, that comprises an interposer without through silicon vias.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure. Additionally, the term "on" will be utilized in the document to mean both "on" and "directly on" (e.g., with no intervening layer).

In the drawings, various dimensions (e.g., layer thickness, width, etc.) may be exaggerated for illustrative clarity. Additionally, like reference numbers are utilized to refer to like elements through the discussions of various examples.

Various aspects of the present disclosure provide a semiconductor device comprising an interposer without a through silicon via and a manufacturing method thereof, for example comprising the utilization of bumping equipment without the need for specialized through silicon via equipment.

Various aspects of the present disclosure provide an example method of manufacturing a semiconductor device. The example method may, for example, comprise forming a dielectric layer on a carrier, forming a conductive layer on the dielectric layer (or providing a carrier with a dielectric layer and/or conductive layer formed thereon), removing the carrier, forming an opening in the dielectric layer to expose the conductive layer to the outside, connecting a semiconductor die to the conductive layer exposed to the outside through the opening, and molding the semiconductor die with a molding material.

Various aspects of the present disclosure also provide another example method of manufacturing a semiconductor device. The example method may, for example, comprise forming a dielectric layer on a carrier, forming a first conductive layer on the dielectric layer (or providing a carrier with a dielectric layer and/or conductive layer formed thereof), connecting a semiconductor die to the first conductive layer, molding the semiconductor die with a molding material; removing the carrier, forming an opening in the dielectric layer to expose the first conductive layer to the outside, and forming, on the dielectric layer, a second conductive layer connected to the first conductive layer through the opening.

Various aspects of the present disclosure provide another example method of manufacturing a semiconductor device. The example method may, for example, comprise forming a dielectric layer on a carrier (or providing a carrier with a dielectric layer formed thereon), a conductive layer on the dielectric layer, connecting a semiconductor die to the conductive layer, molding the semiconductor die with a molding material, removing the carrier, and forming an opening in the dielectric layer to expose the conductive layer to the outside.

Various aspects of the present disclosure provide an example semiconductor device. The example semiconductor device may, for example, comprise a first conductive layer (e.g., a redistribution layer) and a dielectric layer (e.g., a passivation layer) covering the first conductive layer, a semiconductor die electrically connected to the first conductive layer for example via an aperture in the dielectric layer, and a mold material around the semiconductor die, wherein the interposer is configured to allow a second conductive layer (e.g., a seed layer) and a third conductive layer (e.g., a redistribution layer) to be formed below the dielectric layer, where the third conductive layer extending into and/or through the dielectric layer is directly on the second conductive layer, and a micro bump pad connected to the semiconductor die is on the third conductive layer.

Various aspects of the present disclosure also provide another example semiconductor device. The second example semiconductor device may, for example, comprise an interposer (or signal redistribution structure of a package) comprising a dielectric layer, a first conductive layer above the dielectric layer, and a second dielectric layer below the dielectric layer, a semiconductor die connected to the first conductive layer, and a mold material around the semiconductor die, wherein the interposer is configured to allow a first seed layer and a first conductive layer to be formed above the dielectric layer and allow a second seed layer and a second conductive layer to be formed below the dielectric layer, and the first seed layer and the second seed layer are directly and electrically connected to each other.

Various aspects of the present disclosure also provide another example semiconductor device. The third example semiconductor device may, for example, comprise an interposer (or signal redistribution structure of a package) comprising a dielectric layer and a conductive layer formed on the dielectric layer, a semiconductor die connected to the conductive layer, and a mold material around the semiconductor die, wherein the interposer is configured to allow a first seed layer and a first conductive layer to be formed on the dielectric layer, an under bump seed layer extending into and/or through the dielectric layer is directly below the first seed layer, and an under bump metal is formed below the under bump seed layer.

The discussion will now refer to various example illustrations provided to enhance the understanding of the various aspects of the present disclosure. It should be understood that the scope of this disclosure is not limited by the specific characteristics of the examples provided and discussed herein.

Referring to FIGS. 1A to 1J, such figures show cross-sectional views illustrating a method of manufacturing a semiconductor device 100, in accordance with various aspects of the present disclosure. The example manufacturing method may, for example, comprise providing a carrier 110 with a first dielectric layer 111, forming a first conductive layer 121, forming a second conductive layer 123 and an under bump metal 125, attaching a first wafer support system 1, removing the carrier 110, forming an opening 111a in the first dielectric layer 111, forming a micro bump pad 126 at the opening 111a, attaching a semiconductor die 130 and molding with a mold material 140 (e.g., a resin, encapsulant, molding compound, etc.), separating the first wafer support system 1 and attaching a second wafer support system 2 and attaching a conductive interconnection structure 160, and separating the second wafer support system 2.

As shown in FIG. 1A, during the providing (or forming) of the carrier 110 with the first dielectric layer 111, the carrier 110 such as, for example, a silicon wafer with a planar top surface and a planar bottom surface is provided. The carrier 110 (or any carrier discussed herein) may comprise any of a variety of different types of carrier materials. The carrier 110 may, for example, comprise a semiconductor material (e.g., silicon, GaAs, etc.), glass, ceramic (e.g., porous ceramic, etc.), metal, etc. The carrier 110 may also comprise any of a variety of different types of configurations. For example, the carrier 110 may be in a mass form (e.g., a wafer form, a rectangular panel form, etc.). Also for example, the carrier 110 may be in a singular form (e.g., singulated from a wafer or panel, originally formed in a singular form, etc.). The carrier 110 may, for example, share any or all characteristics with any carrier discussed herein.

A first dielectric layer 111 such as, for example, an inorganic dielectric layer (e.g., a silicon oxide layer, a silicon nitride layer, oxide layer, nitride layer, etc.) may be (or may have been) formed on the surface of the carrier 110. For example, the first dielectric layer 111 may have been (or may be) formed through an oxidation process. For example, a silicon oxide layer and/or silicon nitride layer of a predetermined thickness may be formed by supplying oxygen gas and/or nitride gas to a silicon wafer at a temperature of approximately 900° C. or higher (e.g., a thermal oxidation process, etc.). The first dielectric layer 111, or a portion thereof, may also comprise a native oxide layer naturally formed on the carrier 110 without manufacturing process assistance. The first dielectric layer 111 may also be referred to herein as a protective layer. The first dielectric layer 111 may, for example, be from 0.01 to 0.8 microns thick.

In comparison to a polymer layer that is an organic material, a layer of inorganic material (e.g., a silicon oxide layer, a silicon nitride layer, etc.) may allow (or assist) a photo etching process to be performed more accurately, so that a conductive layer of a relatively finer line/space/thickness (e.g., trace width, spacing between adjacent traces, and/or trace thickness) may be formed on the layer of inorganic material. For example, a conductive layer with a line/space/thickness of about 2/2/2 μM to about 10/10/10 μM may be formed on a layer of inorganic material (e.g., on a silicon oxide (or silicon dioxide) layer, silicon nitride layer, oxide layer, nitride layer, etc.). Note that the scope of this disclosure is not limited to inorganic dielectric materials. For example, in various example implementations, the dielectric layer 111 may comprise an organic material. Additionally, note that the carrier 110 need not be provided with the dielectric layer 111.

Figure 1B:
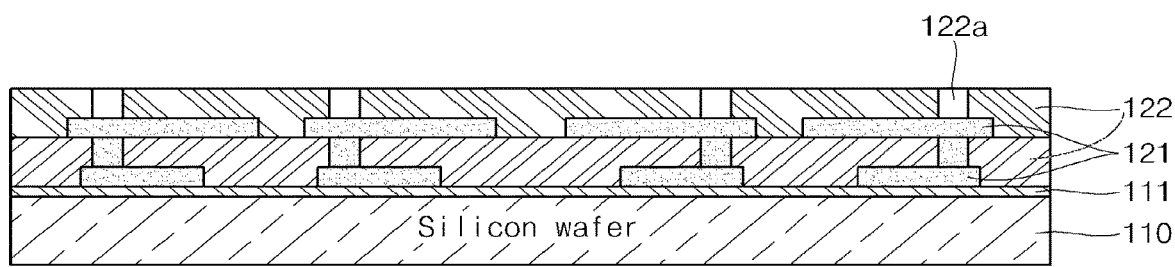

As shown in FIG. 1B, during the forming of the first conductive layer 121, which may also be referred to herein as a redistribution layer, the first conductive layer 121 may be formed on the first dielectric layer 111. In one example implementation, a first seed layer 121a (see, e.g., FIG. 3) is formed on the first dielectric layer 111, and the first conductive layer 121 is formed on the first seed layer 121a. The first conductive layer 121 may then be covered with a second dielectric layer 122, which may also be referred to herein as a passivation layer.

The first seed layer 121a (or any seed layer discussed herein) may be formed of any of a variety of materials, including but not limited to tungsten, titanium, equivalents thereof, combinations thereof, alloys thereof, etc. The first seed layer 121a may, for example, be formed utilizing any of a variety of processes. For example, the first seed layer 121a may be formed utilizing one or more of an electroless plating process, an electrolytic plating process, a sputtering process, etc. For example, the seed layer 121a may be formed of TiW with a Cu target. Note that the first seed layer 121a and/or any seed layer discussed herein may also be referred to as a conductive layer. Also note that any seed layer discussed herein may be formed utilizing the same or similar materials and/or processes, or may be formed utilizing different respective materials and/or processes. Additionally, note that the first seed layer 121a and/or any seed layer discussed herein may comprise multiple layers. As an example, a first layer may comprise TiW, and a second layer may comprise Cu.

The first conductive layer 121 may be formed of any of a variety of materials. For example, the first conductive layer 121 may be formed of copper, aluminum, gold, silver, palladium, equivalents thereof, combinations thereof, alloys thereof, other conductive materials, etc. The first conductive layer 121 may, for example, be formed utilizing any of a variety of processes. For example, the first conductive layer 121 may be formed utilizing one or more of an electroless plating process, an electrolytic plating process, a sputtering process, etc. The patterning or routing of the first conductive layer 121 may, for example, be accomplished utilizing any of a variety of processes. For example, the first conductive layer 121 may be patterned or routed utilizing a photo etching process using a photoresist, etc. For example, photo resist may be spin coated (or otherwise applied, such as a dry film, etc.) on the seed layer 121a. The photo resist may then be set using, for example, a masking and illumination process. Then portions of the photo resist may be etched away, residual photo resist may be removed in a descum process, and drying (e.g., spin rinse drying) may be performed. After forming the first conductive layer 121, the template may be stripped (e.g., chemically stripped, etc.), and the seed layer 121a that is exposed from the first conductive layer 121 may be etched.

Note that the first conductive layer 121 and/or any conductive layer discussed herein may also be referred to as a redistribution layer. Also note that any conductive layer discussed herein may be formed utilizing the same or similar materials and/or processes, or may be formed utilizing different respective materials and/or processes. Additionally, note that the first conductive layer 121, and/or the forming thereof, may share any or all characteristics with any other conductive layer, and/or the forming thereof, disclosed herein.

The second dielectric layer 122 may be formed of any of a variety of materials. For example, the second dielectric layer 122 may be formed of an organic material (e.g., polymers such as polyimide, Benzocyclobutene (BCB), Polybenzoxazole (PBO), equivalents thereof, combinations thereof, etc.). Also for example, the second dielectric layer 122 may be formed of an inorganic material. The second dielectric layer 122 may be formed utilizing any of a variety of processes. For example, the second dielectric layer 122 may be formed utilizing one or more of spin coating, spray coating, dip coating, rod coating, equivalents thereof, combinations thereof, etc. Note that the second dielectric layer 122 and/or any dielectric layer discussed herein may also be referred to as a passivation layer. Also note that any dielectric layer discussed herein may be formed utilizing the same or similar materials and/or processes, or may be formed utilizing different respective materials and/or processes. Additionally, note that the second dielectric layer 121, and/or the forming thereof, may share any or all characteristics with any other dielectric layer, and/or the forming thereof, disclosed herein.

As discussed herein, in an example implementation, since the first conductive layer 121 (e.g., with or without an underlying seed layer 121a) may be formed on the inorganic first dielectric layer 111 (e.g., directly on the inorganic first dielectric layer 111), it may be formed (or more easily formed) to have a finer line/space/thickness in comparison to other conductive layers, which may be formed on organic dielectric layers.

Formation of the first conductive layer 121 (e.g., with or without a seed layer 121a) and the second dielectric layer 122 may be repeated any number of times (e.g., utilizing the same materials and/or processes or different respective materials and/or processes). The example illustrations in FIGS. 1B-1J show two formations of such layers. As such, the layers are provided with similar labels in the figures (e.g., repeating the first conductive layer 121 and the second dielectric layer 122).

An opening 122a (or aperture) may, for example, be formed in the second dielectric layer 122, and a specific area of the first conductive layer 121 may be exposed to the outside through the opening 122a. The opening 122a may be formed in any of a variety of manners (e.g., mechanical and/or laser ablation, chemical etching, photolithography, etc.). Note that the second dielectric layer 122 (or any dielectric layer discussed herein) may also be originally formed having opening 122a, for example by masking, or other selective dielectric layer formation process.

Figure 1C:
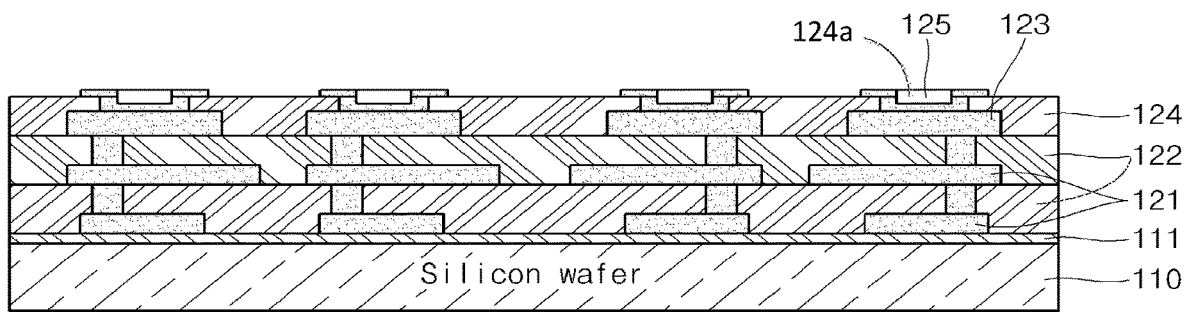

As shown in FIG. 1C, during the forming of the second conductive layer 123 and the under bump metal 125, the second conductive layer 123 and under bump metal 125 of at least one layer are formed on the first conductive layer 121 and/or on the second dielectric layer 122.

In one example implementation, a second seed layer 123a (see, e.g., FIG. 3) is formed at the inside of the opening 122a (e.g., on side walls of the opening 122a formed in the second dielectric layer 122 and/or on the first conductive layer 121 exposed by the opening 122a) and/or outside of the opening 122a (e.g., on the top surface of the second dielectric layer 122). As discussed herein, the second seed layer 123a may be formed using the same material(s) and/or process(es) as used to form the first seed layer 121a, or may be formed using different respective material(s) and/or process(es). The second seed layer 123a (or any seed layer discussed herein) may also be referred to herein as a conductive layer.

Continuing the example implementation, the second conductive layer 123 is formed on the second seed layer 123a. For example, the second conductive layer 123 may be formed to fill (or at least cover side surfaces of) the opening 122a in the second dielectric layer 122. The second conductive layer 123 may, for example, be formed using the same material(s) and/or processes as the first conductive layer 121, or may be formed using different respective material(s) and/or process(es). The second conductive layer 123 may also be referred to herein as a redistribution layer.

The second conductive layer 123 may then, for example, be covered with the third dielectric layer 124. The third dielectric layer 124 may be formed of any of a variety of materials and/or utilizing any of a variety of dielectric-forming processes. For example, the third dielectric layer 124 may be formed utilizing the same material(s) and/or process(es) as utilized to form the second dielectric layer 122.

An opening 124a (or aperture) may, for example, be formed in the third dielectric layer 124, and a specific area of the second conductive layer 123 may be exposed to the outside through the opening 124a. The opening 124a may be formed in any of a variety of manners (e.g., mechanical and/or laser ablation, chemical etching, etc.). Alternatively, for example, the third dielectric layer 124 may be originally formed with the opening 124a therein.

An under bump seed layer 125a (see, e.g., FIG. 3) may, for example, be formed at the inside of the opening 124a (e.g., on side walls of the opening 124a formed in the third dielectric layer 124 and/or on the second conductive layer 123 exposed by the opening 124a) and/or outside of the opening 124a (e.g., on the top surface of the third dielectric layer 124, for example around and/or encircling the opening 124a). As discussed herein, the under bump seed layer 125a may be formed using the same material(s) and/or process(es) as used to form the first seed layer 121a and/or the second seed layer 123a, or may be formed using different respective material(s) and/or process(es). The under bump seed layer 125a (or any seed layer discussed herein) may also be referred to herein as a conductive layer.

An under bump metal 125 is formed on the under bump seed layer 125a. The under bump metal 125 may be formed of any of a variety of materials, non-limiting examples of which are presented herein. For example, the under bump metal 125 may be formed of at least one of chrome, nickel, palladium, gold, silver, alloys thereof, combinations thereof, equivalents thereof, etc. The under bump metal 125 may, for example, comprise Ni and Au. Then under bump metal 125 may also, for example, comprise Cu, Ni, and Au. The under bump metal 125 may be also formed utilizing any of a variety of processes, non-limiting examples of which are presented herein. For example, the under bump metal 125 may be formed utilizing one or more of an electroless plating process, electroplating process, sputtering process, etc. The under bump metal 125 may, for example, prevent or inhibit the formation of an intermetallic compound at the interface between the conductive interconnection structure 160 and the second conductive layer 123, thereby improving the reliability of the connection to the conductive interconnection structure 160. The under bump metal 125 may also be referred to herein as a conductive layer. Note that the under bump metal 125 may comprise multiple layers. For example, the under bump metal 125 may comprise a first layer of Ni and a second layer of Au.

Though not illustrated in FIGS. 1A-1J, following formation of the under bump metal 125, an edged trim (or profile) process may be performed, for example in which an edge of the wafer being processed is trimmed (or profiled). Such trimming may be performed in a variety of manners, for example by grinding. Such edge trimming may, for example, protect the wafer from chipping and flaking during subsequent processing.

For discussion purposes herein, the first conductive layer 121, the second dielectric layer 122, the second conductive layer 123, and the third dielectric layer 124 may be considered to be components of an interposer 120. Furthermore, the under bump metal 125 and the micro bump pad 126 described herein may also be considered to be components of the interposer 120. Note that term "interposer" is used herein to refer to a general package structure (e.g., a dielectric and conductor layered structure) that is interposed between other structures, and the scope of this disclosure should not be limited or defined by arbitrary notions regarding interposer composition.

Figure 1D:
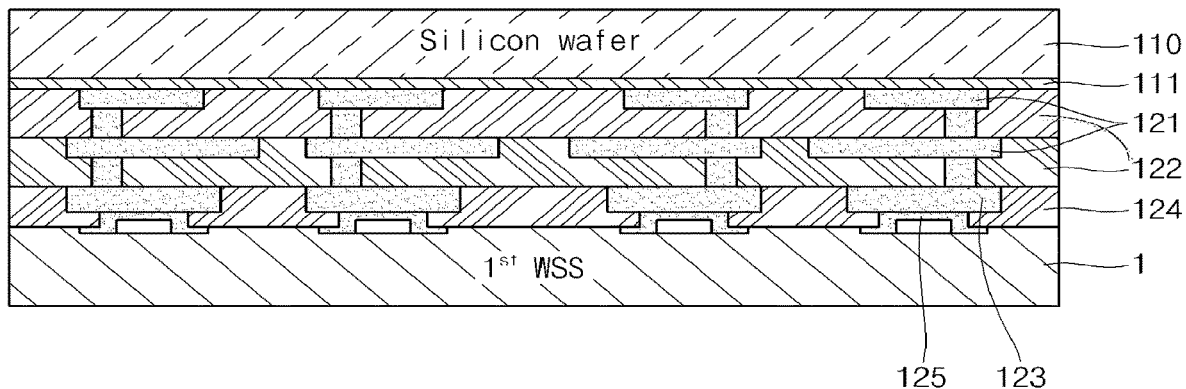

As shown in FIG. 1D, during the attaching of the first wafer support system 1 (WSS), the first wafer support system 1 is attached to the third dielectric layer 124. For example, the first wafer support system 1 may be attached to the third dielectric layer 124 and to the under bump metal 125. At this point, the carrier 110 that is shown at the bottom of FIG. 1C is repositioned to the top of FIG. 1D (e.g., the diagram is inverted or rotated). The first WSS 1 may be attached to the third dielectric layer 124 and/or to the under bump metal 125 in any of a variety of manners, non-limiting examples of which are provided herein. For example, the first WSS 1 (or any WSS discussed herein) may be attached to the third dielectric layer 124 and/or to the under bump metal 125 utilizing a temporary adhesive that loses its adhesion when exposed to thermal energy or light energy, when exposed to particular chemicals, etc. One or more additional release layers may also be utilized to ease subsequent release of the first wafer support system 1. The attachment process may, for example, comprise baking the assembly (e.g., at 250° for 30 mins, etc.). The first wafer support system 1 may be formed from any of a variety of materials. For example, the first WSS 1 (or any WSS discussed herein) may be formed from one or more of a silicon wafer, a glass wafer, a ceramic wafer, a metal wafer, etc. Though the first WSS 1 is generally presented herein in the form of a wafer, the scope of this disclosure is not limited to such shape.

Figure 1E:
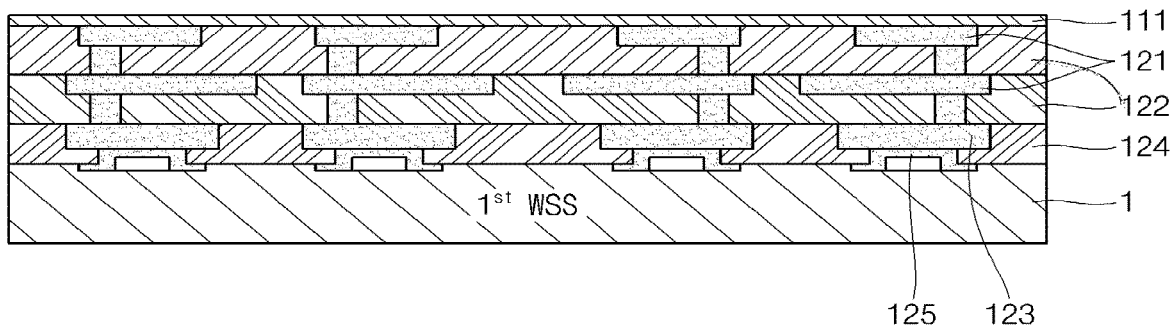

As shown in FIG. 1E, during the removing of the carrier 110, the carrier 110 (for example, a silicon wafer on which the first dielectric layer 111 was formed) on a side of the structure opposite the first wafer support system 1 is removed. In an example implementation, most of the carrier 110 may be removed through a mechanical grinding process and then, the remaining carrier 110 may be removed through a chemical etching process. For example, a silicon carrier may be ground to 10-30 um thickness, and then the remainder may be removed by a process other than grinding (e.g., by chemical etching, etc.). In another example scenario in which the first wafer support system 1 comprises a glass wafer or plate, such glass wafer or plate is removed. In such a manner, as a result, only the first dielectric layer 111 (for example, a silicon oxide layer and/or a silicon nitride layer) formed on the surface of the carrier 110 remains. For example, as illustrated in FIG. 1E, only the first dielectric layer 111 of a predetermined thickness remains on the first conductive layer 121 and the second dielectric layer 122. Note that the carrier removal process may also remove a portion of the first dielectric layer 111; for example, the first dielectric layer 111 may be thinner after removal of the carrier 110 than when originally formed on the carrier 110. In an example implementation, the first dielectric layer 111 may be formed of an inorganic material, and the second and third dielectric layers 122 and 124 may be formed of an organic material. Note, however, that the scope of the present disclosure is not limited to such example types of material.

Figure 1F:
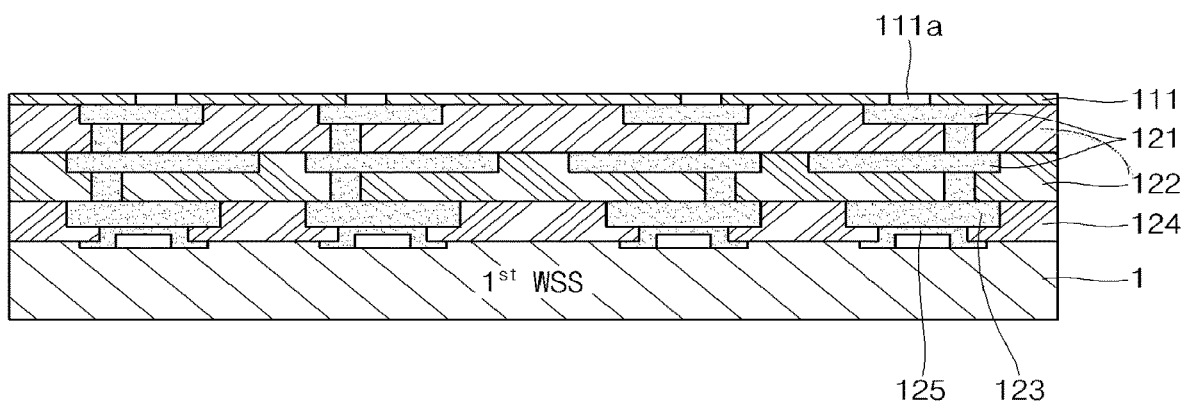

As shown in FIG. 1F, during the forming of the openings 111*a* (or apertures) in the first dielectric layer 111, a plurality of openings 111*a* are selectively formed in the first dielectric layer 111. The openings 111*a* may be formed in any of a variety of manners (e.g., mechanical and/or laser ablation, chemical etching, photo etching process, photo-masking and etching process, etc.). Each of the openings 111*a* may, for example, correspond to a respective specific area of the first conductive layer 121 exposed to the outside by the opening 111*a*. In an example implementation, an opening 111*a* exposes a respective specific area of the first conductive layer 121 to the outside through the inorganic first dielectric layer 111. In an example implementation in which the first conductive layer 121 was formed on a first seed layer 121*a*, a specific area of the first seed layer 121*a* on which the first conductive layer 121 was formed is exposed to the outside through the inorganic first dielectric layer 111. Note that in an example scenario in which a dielectric layer (or passivation layer) mask is utilized during a process of etching the openings 111*a*, the dielectric layer may be stripped after such etching, but may also remain (e.g., as a passivation layer, etc.).

Figure 1G:
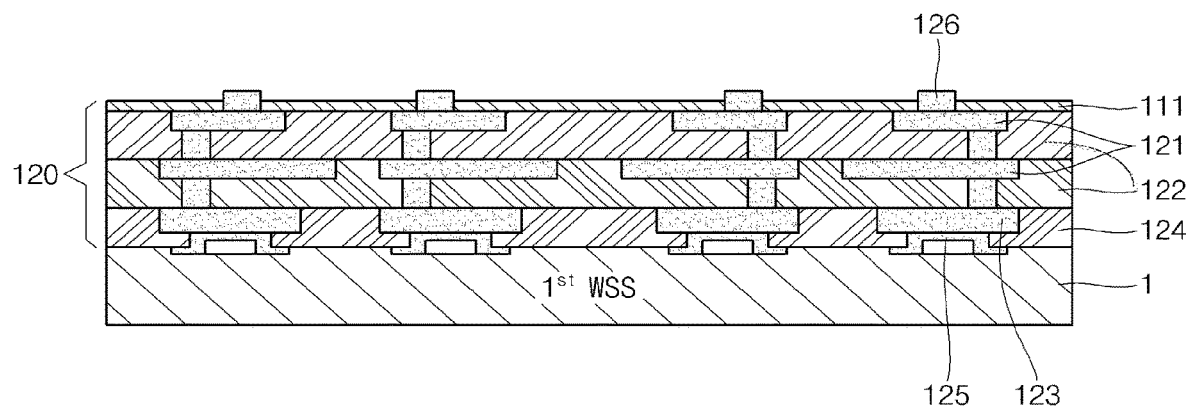

As shown in FIG. 1G, during the forming of the micro bump pad 126 (or other pad, land, attachment structure, die attachment structure, etc.) in the opening 111*a*, the micro bump pad 126 is formed in the opening 111*a* so that the micro bump pad 126 is electrically connected to the first conductive layer 121 (e.g., directly connected, connected via a seed layer, etc.). In an example implementation, the micro bump seed layer 126*a* (e.g., as shown in FIGS. 2-6) is formed at the inside of the opening 111*a* (e.g., on side walls of the opening 111*a* formed in the first dielectric layer 111 and/or on the first conductive layer 121) and/or outside of the opening 111*a* (e.g., on the top surface (in FIG. 1G) of the first dielectric layer 111 surrounding the opening 111*a*). The micro bump seed layer 126*a* may, for example, be formed utilizing the same material(s) and/or process(es) discussed herein with regard to other seed layers or conductive layers, or may be formed utilizing different respective material(s) and/or process(es). The micro bump seed layer 126*a* and/or micro bump pad 126 may also be referred to herein as a conductive layer.

The micro bump pad 126 may then, for example, be formed on the micro bump seed layer 126*a*. In an example implementation, the first seed layer 121*a* (e.g., on which the first conductive layer 121 was formed) and the micro bump seed layer 126*a* (e.g., on which the micro bump pad 126 is formed) may be interposed between the first conductive layer 121 and the micro bump pad 126. For example, the first seed layer 121*a* and the micro bump seed layer 126*a* may be directly connected to each other, mutually facing each other. Note that in various example implementations, the forming of the micro bump seed layer 126*a* might be skipped, and the micro bump pad 126 formed on the first seed layer 121*a* exposed through the opening 111*a* (e.g., in an example implementation in which the first seed layer 121*a* is adequately formed to be utilized in such manner).

The micro bump pad 126 may comprise any of a variety of materials, non-limiting examples of which are provided herein. For example, the micro bump pad 126 may comprise copper, aluminum, gold, silver, palladium, general conductive material, conductive material, equivalents thereof, combinations thereof, alloys thereof, any conductive material discussed herein, etc. In an example implementation, the micro bump pad 126 may comprise Ni and Au. In another example implementation, the micro bump pad 126 may comprise Ni, Au, and Cu. The micro bump pad 126 may be formed utilizing any of a variety of processes, non-limiting examples of which are provided herein. For example, the micro bump pad 126 may be formed utilizing one or more of an electroless plating process, an electrolytic plating process, a sputtering process, etc.

The micro bump pad 126 is shown in FIG. 1G extending past (or protruding from) the top surface of the first dielectric layer 111, but the scope of this disclosure is not limited thereto. For example, the micro bump pad 126 may comprise a top surface that is coplanar with the top surface of the first dielectric layer 111, or may comprise a top surface that is below the top surface of the first dielectric layer 111. Though generally shown comprising a cylindrical shape, the micro bump pad 126 may comprise any of a variety of geometric configurations, various non-limiting examples of which are provided herein.

Also note that the micro bump pad 126 may alternatively be formed in an aperture in the first dielectric layer 111 near the beginning of the overall process shown in FIGS. 1A-1J. For example, between FIGS. 1A and 1B, an aperture may be formed in the first dielectric layer 111 (if such layer exists) and the micro bump pad 126 may be formed on the carrier 110 in such aperture before formation of the first conductive layer 121 thereon.

Figure 1H:
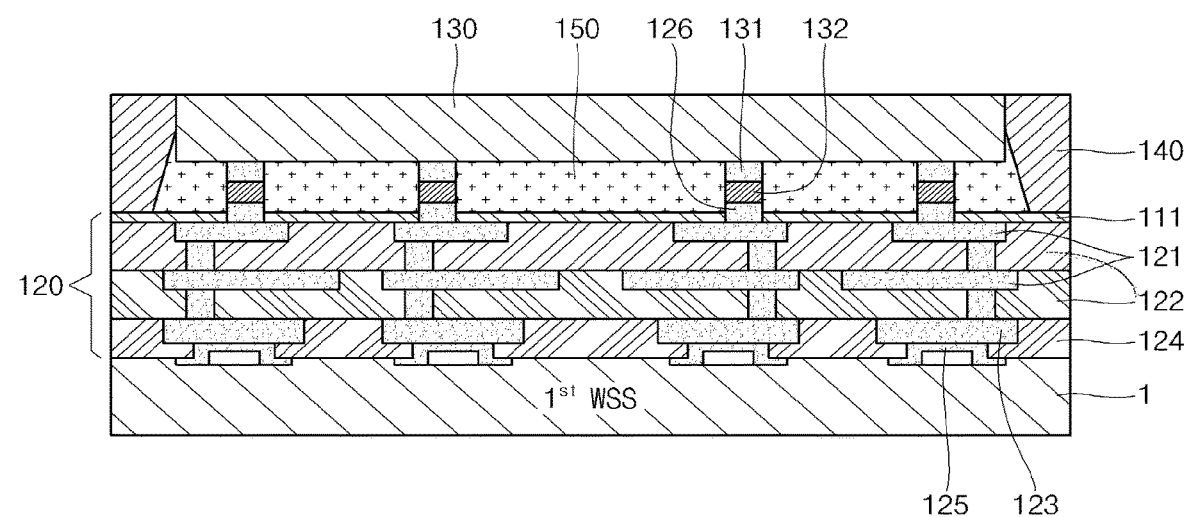

As shown in FIG. 1H, during the attaching of the semiconductor die 130 and the molding with the mold material 140, the semiconductor die 130 is electrically connected to the micro bump pad 126 and is molded with the mold material 140. For example, the conductive bump 131 (or other conductive attachment structure, for example conductive pillar, etc.) of the semiconductor die 130 is electrically connected to the micro bump pad 126 through the solder 132. The conductive bump 131 of the semiconductor die 130 may be attached to the micro bump pad 126 in any of a variety of manners, non-limiting examples of which are presented herein. For example, the conductive bump 131 may be soldered to the micro bump pad 126 utilizing any of a variety of solder attachment processes (e.g., a mass reflow process, a thermal compression process, a laser soldering process, etc.). Also for example, the conductive bump 131 may be coupled to the micro bump pad 126 utilizing a conductive adhesive, paste, etc. In an example scenario, a solder paste may be applied to the micro bump pad 126 utilizing a stencil and squeegee, the conductive bump 131 of the semiconductor die 130 may be positioned on or in the solder paste (e.g., utilizing a pick-and-place process), and the solder paste may then be reflowed. After attachment of the semiconductor die 130, the assembly may be cleaned (e.g., with hot DI water, etc.), subjected to a flux clean and bake process, subjected to a plasma treatment process, etc.

In an example implementation, an underfill 150 may be formed between the semiconductor die 130 and the first dielectric layer 111, for example surrounding portions of the conductive bumps 131 and micro bump pads 126 that are exposed to (and thus encapsulated by) the underfill 150. The underfill 150 may comprise any of a variety of underfill materials. Also the underfill 150 may be formed utilizing any of a variety of processes (e.g., a capillary underfilling process, utilizing a pre-applied underfill material, etc.). The underfill 150 between the semiconductor die 130 and the interposer 120 (as various layers are illustratively grouped in FIG. 1H) may, for example, prevent or reduce warpage, for example due to thermal expansion coefficient difference between the semiconductor die 130 and the interposer 120.

In the molding (or encapsulating) process, the semiconductor die 130 and/or interposer 120 may be encapsulated with a mold material 140 (e.g., a molding resin or other mold material or encapsulant), which may then be cured. In an example implementation, the mold material 140 covers the side surfaces and top surface of the semiconductor die 130. In another example implementation, the mold material 140 only covers the side surfaces of the semiconductor die 130 (or only respective portions thereof), thus leaving the top surface of the semiconductor die 130 exposed from the mold material 140. The mold material 140 may be formed in any of a variety of manners (e.g., compression molding, transfer molding, flood molding, etc.). The mold material 140 may comprise any of a variety of types of mold material. For example, the mold material 140 may comprise a resin, an epoxy, a thermosetting epoxy molding compound, a room temperature curing type, etc.

When the size of a filler (e.g., in inorganic filler or other particle component) of the mold material 140 is smaller (or substantially smaller) than the size of a space or a gap between the interposer 120 and the semiconductor die 130, the underfill 150 might not be utilized, and the mold material 140 may instead fill a space or gap between the interposer 120 and the semiconductor die 130. In such an example scenario, the underfilling process and the molding process may be combined into a single molding process with a molded underfill.

The semiconductor die 130, for example, may comprise any of a variety of types of semiconductor die, non-limiting examples of which are provided herein. For example, the semiconductor die 130 may comprise a digital signal processor (DSP), a microcontroller, a microprocessor, a network processor, a power management processor, an audio processor, a video processor, an RF circuit, a wireless baseband system-on-chip (SoC) processor, a sensor, an application specific integrated circuit, etc. Note that one or more passive electrical components may also be mounted instead of and/or in addition to the semiconductor die 130.

Figure 1I:
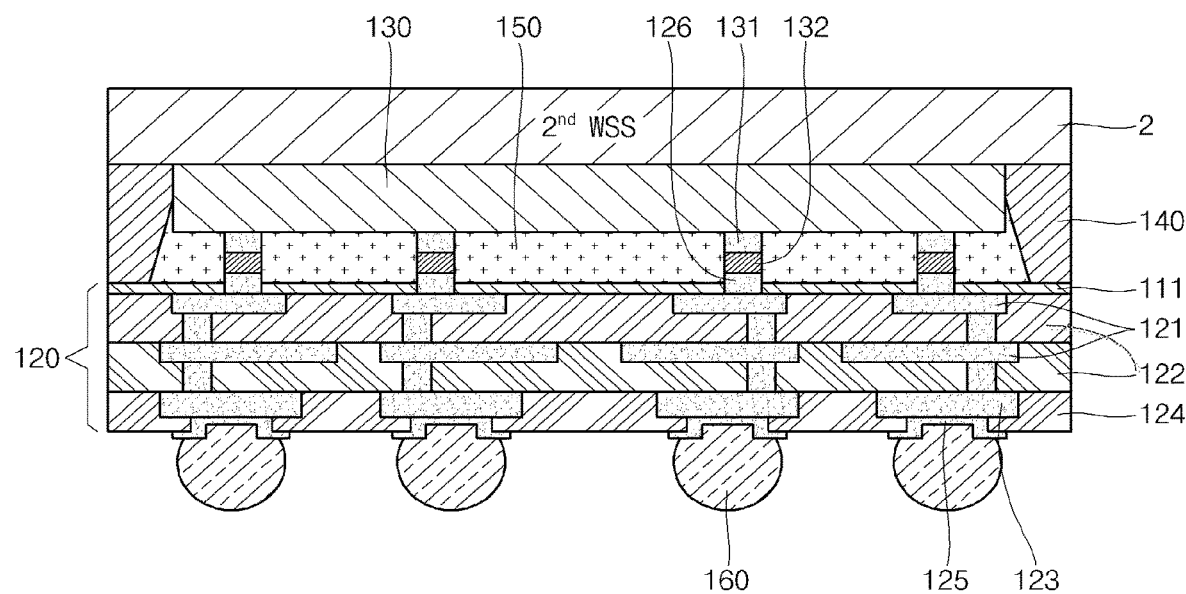

As shown in FIG. 1I, during the attaching of the second wafer support system (WSS) 2, the separating of the first wafer support system 1, and the attaching of the conductive interconnection structure 160, the second WSS 2 may be attached to the semiconductor die 130 and/or mold material 140. For example, the second WSS 2 may share any or all characteristics with the first WSS 1. The second WSS 2 may, for example, be attached in a same manner as the first WSS 1 (e.g., utilizing a temporary adhesive, vacuum, mechanical attachment mechanism, etc.).

After attachment of the second WSS 2, the first wafer support system 1 attached to the third dielectric layer 124 is separated from the third dielectric layer 124 and/or under bump metal 125. As discussed herein, the first WSS 1 may have been attached to the third dielectric layer 124 and/or to the under bump metal 125 utilizing a temporary adhesive that loses it adhesion (or a substantial portion thereof) when exposed to thermal energy, laser energy, chemical agents, etc. The separation of the first WSS 1 from the third dielectric layer 124 and/or under bump metal 125 may, for example, be performed by exposing the temporary adhesive to the energy and/or chemicals that cause the adhesive to loosen. In an example scenario in which a release layer was utilized to attach a glass first WSS 1, the release layer (e.g., between the adhesive and the first WSS 1) may be subjected to laser irradiation through the glass first WSS 1, to effect or assist with the release of the first WSS 1 from the adhesive. Note that other forms of WSS attachment/detachment may be utilized (e.g., vacuum attachment, mechanical attachment, etc.). Adhesive utilized to attach the first WSS 1 may, for example, be removed with a solvent if necessary.

The conductive interconnection structure 160 (or a plurality thereof) may be electrically connected to the exposed under bump metal 125 (e.g., exposed after removal of the first WSS 1). At this point, for example while the second wafer support system 2 is attached to the semiconductor die 130 and the mold material 140, the conductive interconnection structure 160 may be electrically connected to the under bump metal 125.

The conductive interconnection structure 160 may comprise any of a variety of characteristics, non-limiting examples of which are presented herein. For example, the conductive interconnection structure 160 may be formed of one of a eutectic solder (Sn37Pb), a high lead solder (Sn95Pb), a lead-free solder (SnAg, SnAu, SnCu, SnZn, SnZnBi, SnAgCu, and SnAgBi), combination thereof, equivalents thereof, etc. The conductive interconnection structure 160 (and/or any conductive interconnection structure discussed herein) may, for example, comprise a conductive ball (e.g., a solder ball, a copper-core solder ball, etc.), a conductive bump, a conductive pillar or post (e.g., a copper pillar, a solder-capped copper pillar, a wire, etc.), etc.

The conductive interconnection structure 160 may, for example, be connected to the under bump metal 125 utilizing any of a variety of reflow and/or plating processes. For example, volatile flux may be deposited (e.g., dotted, printed, etc.) on the under bump metal 125, the conductive interconnection structure 160 may be deposited (e.g., dropped, etc.) on the volatile flux, and then a reflow temperature of about 150° C. to about 250° C. may be provided. At this point, the volatile flux may, for example, be volatized and completely removed.

The conductive interconnection structure 160, as mentioned above, may be referred to as a conductive bump, a conductive ball, a conductive pillar, a conductive post, a conductive wire, etc., and may, for example, be mounted on a rigid printed circuit board, a flexible printed circuit board, a lead frame, etc. For example, the semiconductor die 130 including the interposer 120 may then be electrically connected (e.g., in a flip-chip form or similar to a flip-chip form, etc.) to any of a variety of substrates (e.g., motherboard substrates, packaging substrates, lead frame substrates, etc.).

Figure 1J:
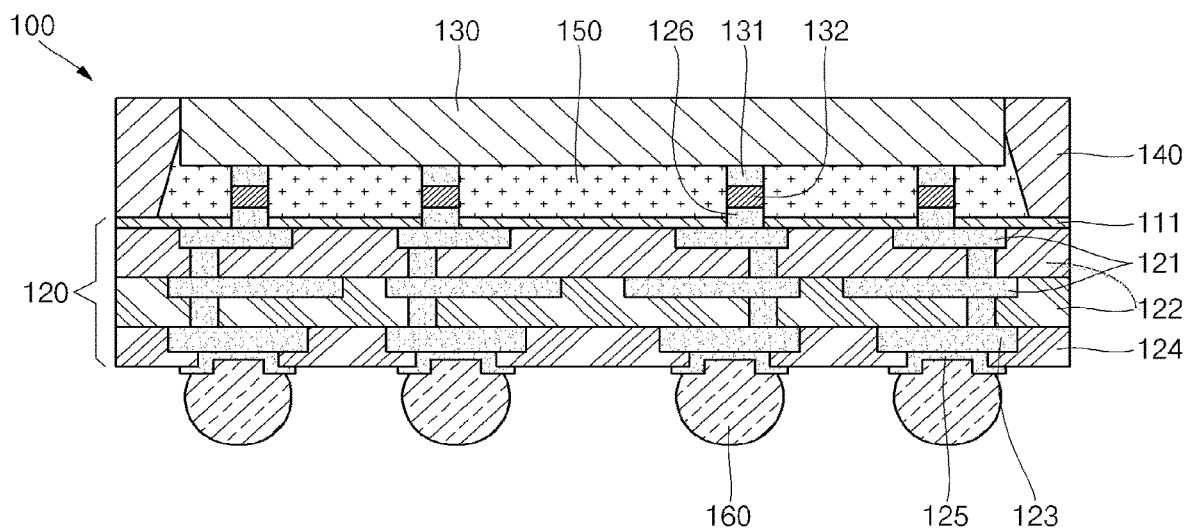

As shown in FIG. 1J, during the separating of the second wafer support system 2, the second wafer support system 2 attached to the semiconductor die 130 and/or the mold material 140 is separated from the semiconductor die 130 and/or mold material 140. For example, in the completed semiconductor device 100, the top surface of the semiconductor die 130 may be exposed to the outside through the top surface of the mold material 140. For example, the top surface of the semiconductor die 130 and the top surface of the mold material 140 may be coplanar. In another example implementation, the mold material 140 may cover the top surface of the semiconductor die 130.

The interposer 120 (or package or device 100) may, for example, be formed in a mass configuration (e.g., in a wafer, panel, strip, matrix, etc.) or as a single unit. In a scenario in which the interposer 120 (or package or device 100) is formed in a mass configuration, after the separating of the second wafer support system 2 (or before such separation), the interposer 120 and the mold material 140 may be singulated or cut (e.g., sawn by a diamond blade or laser beam, snap-separated, pull-separated, etc.). In such a scenario, the side surfaces of the interposer 120 and the mold material 140 may be made coplanar by such a singulation process. In an example scenario, a plurality of the packages or devices 100 may be placed (e.g., mold side down) on a saw tape, and then sawed. The saw may, for example, cut through the packages or devices 100 and partially through the saw tape. After sawing, the packages or devices 100 may be baked. After singulation, the individual packages or devices 100 may be individually inserted into trays (e.g., utilizing a pick and place process).

In accordance with the example illustrated provided in FIG. 1 and discussed herein, the present disclosure provides a semiconductor device 100 (and manufacturing method thereof) comprising the interposer 120, for example without a through silicon via. Such a semiconductor device 100 may, for example, be manufactured utilizing general bumping equipment, for example without utilizing complex and expensive through silicon via production processes. For example, according to various aspects of the present disclosure, a conductive layer having a relatively fine line/space/thickness may be formed first on the carrier 110 (for example, a silicon wafer), and then such carrier 110 may be removed.

Figure 2:
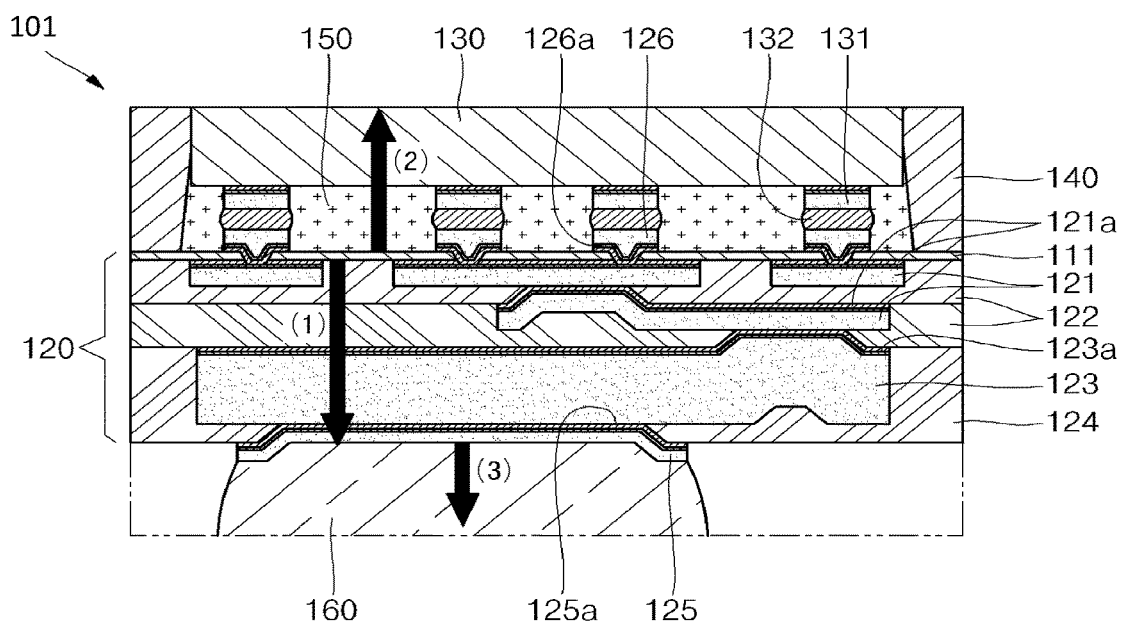
FIG. 2 shows a cross-sectional view illustrating a semiconductor device, in accordance with various aspects of the present disclosure.
Figure 3:
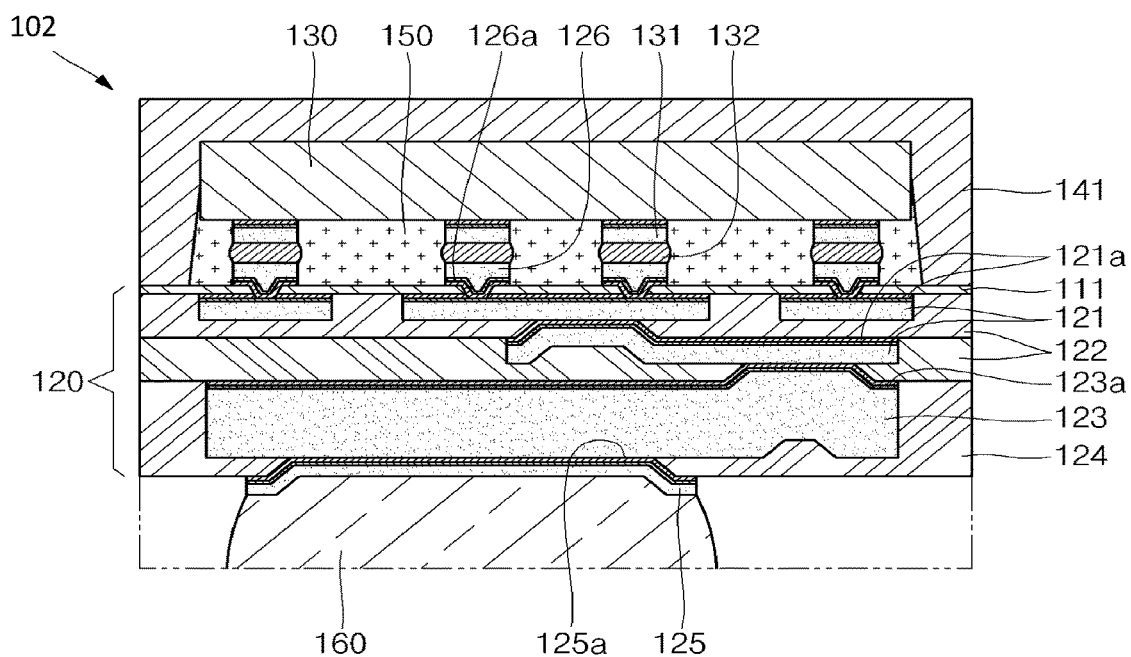
FIG. 3 shows a cross-sectional view illustrating a semiconductor device, in accordance with various aspects of the present disclosure.

Referring to FIG. 2, such figure shows a cross-sectional view of the semiconductor device 101, in accordance with various aspects of the present disclosure, and referring to FIG. 3, such figure shows a cross-sectional view of a semiconductor device 102, in accordance with various aspects of the present disclosure. For illustrative clarity, only one conductive interconnection structure 160 is shown.

As shown in FIG. 2, the example semiconductor device 101 may comprise an interposer 120, a semiconductor die 130, a mold material 140, an underfill 150, and a conductive interconnection structure 160. The semiconductor device 101 may, for example, share any or all characteristics with any or all other semiconductor devices presented herein (e.g., the example semiconductor device 100 shown in FIGS. 1A-1J, etc.).

The interposer 120, or general grouping of layers, may for example comprise a first seed layer 121a below a first dielectric layer 111 (for example, a silicon oxide layer and/or a silicon nitride layer), a first conductive layer 121 below the first seed layer 121a, a second dielectric layer 122 covering the first conductive layer 121 (or portions thereof), a second seed layer 123a below the first conductive layer 121, a second conductive layer 123 below the second seed layer 123a, and a third dielectric layer 124 covering the second conductive layer 123 (or portions thereof). The line/space/thickness of the first conductive layer 121 may, for example, be smaller than those of the second conductive layer 123.

The interposer 120 may, for example, comprise a micro bump seed layer 126a extending into and/or through the first dielectric layer 111 (e.g., through an opening formed therein) and on the first seed layer 121a, a micro bump pad 126 on the micro bump seed layer 126a, an under bump seed layer 125a below the second conductive layer 123, and an under bump metal 125 below the under bump seed layer 125a. In an example implementation, the first seed layer 121a and the micro bump seed layer 126a are directly and electrically connected to each other.

As discussed herein, the term "interposer" may be utilized herein to conveniently group various layers for discussion. It should be understood, however, that an interposer or interposer structure may comprise any of a variety of the layers discussed herein, and is not limited to any particular set of layers.

The conductive bump 131 is on the semiconductor die 130, and the conductive bump 131 is electrically connected to the micro bump pad 126 through the solder 132. The underfill 150 is between the semiconductor die 130 and the interposer 120 (e.g., the first dielectric layer 111), and the mold material 140 surrounds side surfaces of the semiconductor die 130 and the underfill 150. In the illustrated example, since the mold material 140 surrounds the only the side surfaces of the semiconductor die 130 but does not surround (or cover) the top surface, the top surface of the semiconductor die 130 may be exposed to the outside. Furthermore, the top surface of the semiconductor die 130 and the top surface of the mold material 140 may be coplanar.

The conductive interconnection structure 160 may, for example, be connected to the under bump metal 126 and may also be mounted on a substrate as discussed herein.

Labels (1), (2), and (3) shown in FIG. 2 may, for example, show a lamination and/or formation order. For example, in relation to the semiconductor device 101, in accordance with various aspects of the present disclosure, the interposer 120 is formed in the direction (1) (e.g., building from the first dielectric layer 111), and then the semiconductor die 130 is connected to the interposer 120 in the direction (2) (e.g., building from the interposer 120), and then the conductive interconnection structure 160 is attached to the interposer 120 in the direction (3) (e.g., building from the interposer 120).

As discussed herein, the mold material 140 may surround (or cover) the top surface of the semiconductor die 130. An example semiconductor device 102 in this configuration is shown in FIG. 3. The example semiconductor device 102 may, for example, share any or all characteristics with any or all example semiconductor devices discussed herein (e.g., the semiconductor device 100, the semiconductor device 101, etc.). For example, in the example semiconductor device 102, the mold material 141 may completely cover the top surface in addition to the side surfaces of the semiconductor die 130. Since the semiconductor die 130 is generally surrounded at top and side surfaces by the mold material 141, the semiconductor die 130 may be protected from an external environment.

Also, in comparison to the semiconductor device 100 discussed with regard to FIGS. 1A-1J, the example semiconductor devices 101 and 102 each comprise a pad 126 (e.g., a micro bump pad) that is wider at a top end (e.g., to be connected with a conductive bump 131 of the semiconductor die 130) than at a bottom end (e.g., extending through the first dielectric layer 111). For example, rather than being cylindrically shaped as shown in the micro bump pad 126 of FIGS. 1G-1J, the micro bump pad 126 may be cup-shaped or mushroom-shaped (e.g., with sloped stem sidewalls or vertical stem sidewalls). The micro bump pad 126 is also illustrated with vertical cap sidewalls.

Figure 4:
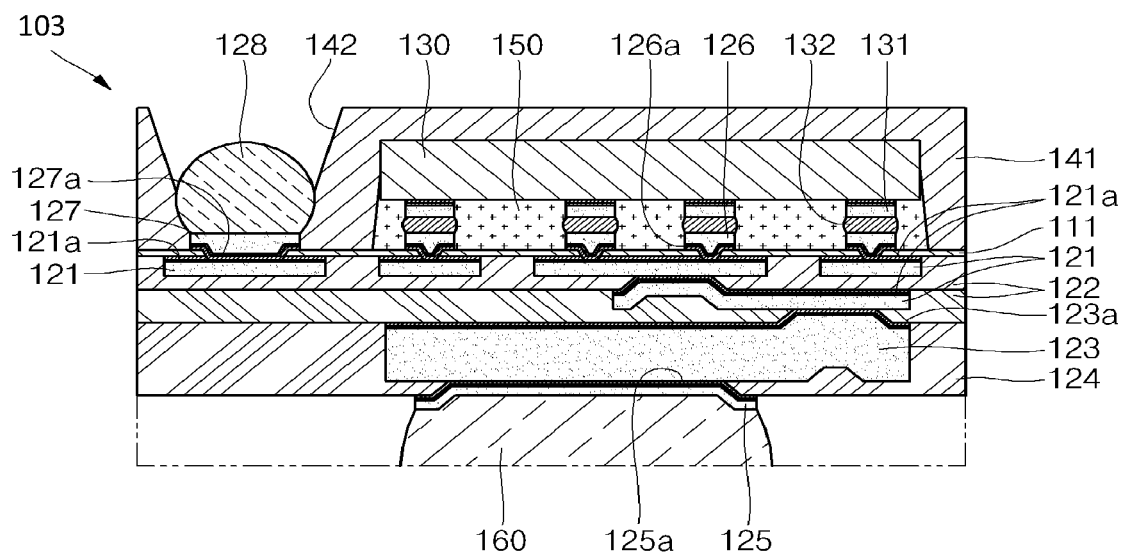
FIG. 4 shows a cross-sectional view illustrating a semiconductor device, in accordance with various aspects of the present disclosure.

Referring to FIG. 4, a cross-sectional view of a semiconductor device 103 in accordance with various aspects of the present disclosure is shown. The example semiconductor device 103 may, for example, share any or all characteristics with the other example semiconductor devices discussed herein (e.g., semiconductor device 100, semiconductor device 101, semiconductor device 102, etc.).

As shown in FIG. 4, the first conductive layer 121 of the example semiconductor device 103 may be formed at the outside of a mounting area (or footprint) of the semiconductor die 130, and a ball pad 127 may be formed on the first conductive layer 121. For example, a ball pad opening (or aperture) may be formed through the first dielectric layer 111, for example in a same manner as other openings discussed herein (e.g., by ablation, etching, etc.). A pad seed layer 127a may be formed in and/or around the ball pad opening (or aperture), for example in a same manner as other seed layers discussed herein. The ball pad 127 may then be formed on the ball pad seed layer 127a. The ball pad seed layer 127a may, for example, be directly connected to the first seed layer 121a.

After forming the mold material 141, a through mold via 142 (TMV) may be formed through the mold material 141 to expose the ball pad 127. The conductive ball 128 may then, for example, be formed in the through mold via 142 and connected to the ball pad 127 (e.g., electrically and/or mechanically connected to the ball pad 127). The conductive ball 128 may be exposed to the outside of the mold material 141 through the through mold via 142. Accordingly, an additional semiconductor device or component (not shown) may be electrically connected to the semiconductor device 103 utilizing the conductive ball 128. Note that in an alternative implementation, the conductive ball 128 may be molded into the mold material 141 and then exposed by forming the TMV to expose the conductive ball 128.

Though the example semiconductor device 103 comprises a conductive ball 128, any of a variety of interconnection structures may be utilized (e.g., conductive bumps, conductive pillars or posts, wires, etc.). Also, though the example semiconductor device 103 is illustrated with the mold material 141 covering the top surface of the semiconductor die 130, the top surface of the semiconductor die 130 may also be exposed from the mold material 141, for example as illustrated for other semiconductor devices herein.

Figure 5:
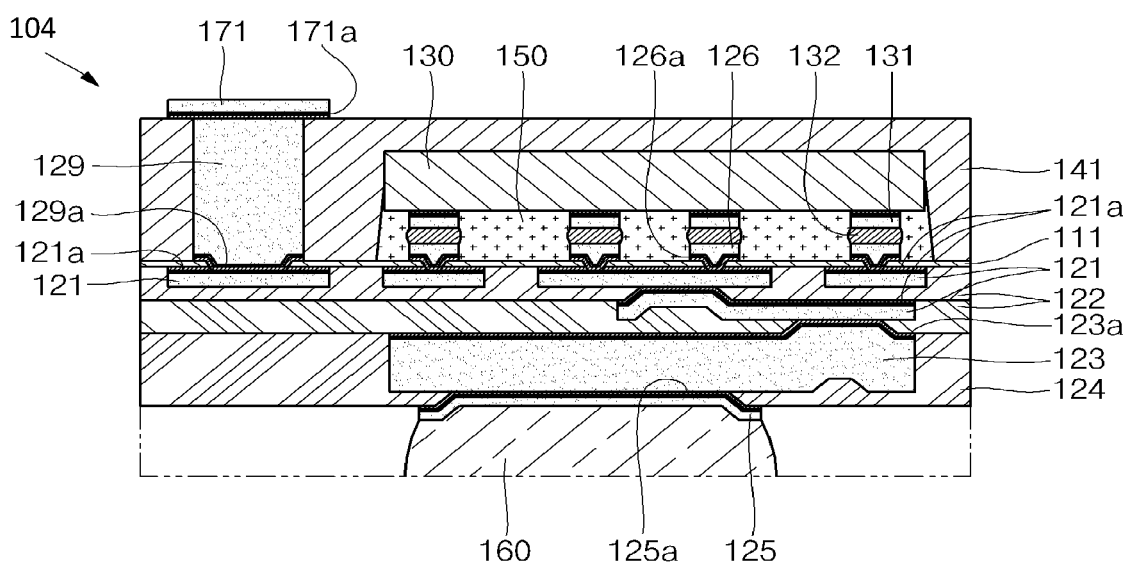
FIG. 5 shows a cross-sectional view illustrating a semiconductor device, in accordance with various aspects of the present disclosure.

Referring now to FIG. 5, such figure shows a cross-sectional view of a semiconductor device 104, in accordance with various aspects of the present disclosure. The example semiconductor device 104 may, for example, share any or all characteristics with the other example semiconductor devices discussed herein (e.g., semiconductor devices 100, 101, 102, 103, etc.).

As shown in FIG. 5, the first conductive layer 121 of the semiconductor device 104 may be formed at the outside of a mounting area (or footprint) of the semiconductor die 130, and a metal pillar 129 may be formed on the first conductive layer 121. For example, a pillar opening (or aperture) may be formed through the first dielectric layer 111, for example in a same manner as other openings discussed herein (e.g., by ablation, etching, etc.). A pillar seed layer 129a may be formed in and/or around the pillar opening (or aperture), for example in a same manner as other seed layers discussed herein.

After forming the mold material 141, a through mold via 142 (TMV) may be formed through the mold material 141 to expose the pillar seed layer 129a. The metal pillar 129 may then, for example, be formed on the pillar seed layer 129a. The metal pillar 129 may, for example, be formed in any of a plurality of manners (e.g., by plating, by pasting and reflowing, by wiring, etc.). The pillar seed layer 129a may, for example, be directly connected to the first seed layer 121a. Furthermore, a metal pad 171 may be formed on the metal pillar 129 (e.g., with or without a metal pad seed layer 171a). Accordingly, an additional semiconductor device or component (not shown) may be electrically connected to the semiconductor device 104.

Note that the orders of operation are merely examples, and the scope of the disclosure should not be limited thereto. For example, referring to the example semiconductor device 104 shown in FIG. 5, the metal pillar 129 may be formed before the mold material 149. Also note that, the pillar seed layer 129a need not necessarily be formed. For example, in an example implementation, the metal pillar 129 may be formed on the first seed layer 121a (e.g., on a surface of the first seed layer 121a opposite the surface on which the first conductive layer 121 is formed).

Figure 6:
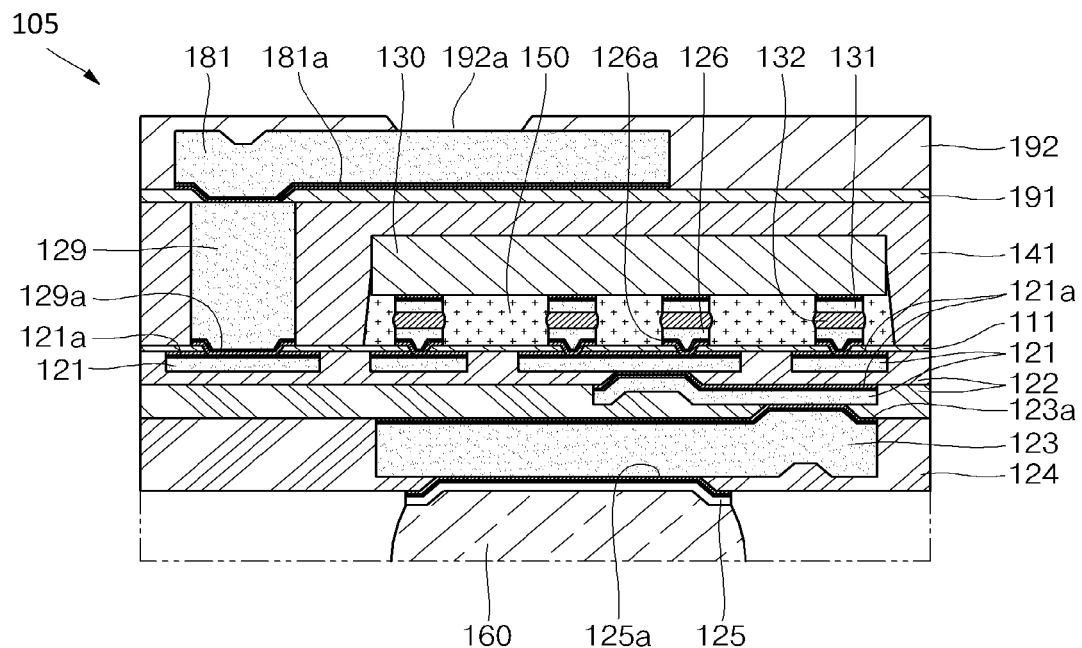
FIG. 6 shows a cross-sectional view illustrating a semiconductor device, in accordance with various aspects of the present disclosure.

Referring now to FIG. 6, such figure shows a cross-sectional view of a semiconductor device 105, in accordance with various aspects of the present disclosure. The example semiconductor device 105 may, for example, share any or all characteristics with the other example semiconductor devices discussed herein (e.g., semiconductor devices 100, 101, 102, 103, 104, etc.).

As shown in FIG. 6, an additional conductive layer 181 (e.g., a redistribution layer) may be further formed on a metal pillar 129. The additional conductive layer 181 may, for example, share any or all characteristics with any conductive layer discussed herein. Additionally, the metal pillar 129 may, for example, share any or all characteristics with any metal pillar or conductive interconnection structure discussed herein (e.g., the metal pillar 129 of FIG. 5, etc.).

For example, a first additional dielectric layer 191, which may also be referred to herein as a passivation layer, is formed on the mold material 141 around the metal pillar 129. The first additional dielectric layer 191 may, for example, share any or all characteristics with any dielectric layer discussed herein. The additional conductive layer 181 is connected to the metal pillar 129 via an opening (or aperture) in the first additional dielectric layer 191 and is further formed on the first additional dielectric layer 191. Note that the additional conductive layer 181 may be formed on an additional seed layer 191*a*, which may for example share any or all characteristics with any seed layer discussed herein.

The additional conductive layer 181 is then covered by the second additional dielectric layer 192, and an opening 192*a* is formed in a predetermined area of the second additional dielectric layer 192. The second additional dielectric layer 192 may, for example, share any or all characteristics with any other dielectric layer discussed herein. A specific area of the additional conductive layer 181 may, for example, be exposed to the outside through the opening 192*a*. Accordingly, an additional conductive layer 181 (e.g., which may also be referred to herein as a redistribution layer) may be formed on the top surface of the mold material 141 and an additional semiconductor device or component (not shown) may be electrically connected to the additional conductive layer 181.

Herein, the structures (or any portion thereof) of the semiconductor devices 100, 101, 102, 103, 104 and 105 shown in FIGS. 1A-1J, 2, 3, 4, 5, and 6, respectively, may be applied to structures of the various semiconductor devices to be described below, and the present disclosure is not limited to a specific structure of a semiconductor device. Similarly, the method of forming such structure may also be utilized in conjunction with any of the example methods disclosed herein.

Turning next to FIGS. 7A to 7H, such figures show cross-sectional views illustrating a method of manufacturing a semiconductor device 200, in accordance with various aspects of the present disclosure. The example semiconductor devices and/or methods illustrated at FIGS. 7A to 7H may, for example, share any or all characteristics with any or all of the other example semiconductor devices and/or methods presented herein (e.g., with regard to FIGS. 1A to 1J, FIGS. 2-6, etc.).

The example method of manufacturing the semiconductor device 200 may, for example, comprise providing a carrier 210 with a first dielectric layer 211, forming a first conductive layer 221, attaching a semiconductor die 230 and molding with a mold material 240, attaching a wafer support system 1 and removing the carrier 240, forming an opening 211*a* through the first dielectric layer 211, forming a second conductive layer 225 and an under bump metal 227, attaching a conductive interconnection structure 260, and separating the wafer support system 1.

Figure 7A:
FIGS. 7A to 7H show cross-sectional views illustrating a method of manufacturing a semiconductor device, in accordance with various aspects of the present disclosure.

As shown in FIG. 7A, during the providing of the carrier 210 with the first dielectric layer 211, the carrier 210, such as, for example, a silicon wafer with a planar top surface and a planar bottom surface, is provided. The carrier 210 and/or the providing or forming thereof may, for example, share any or all characteristics with any carrier and/or the providing or forming thereof discussed herein (e.g., the carrier 110 of FIGS. 1-6, etc.).

The first dielectric layer 211, such as a silicon oxide layer and/or a silicon nitride layer, may be formed on the surface of a silicon wafer through an oxidation process. The first dielectric layer 211, and the providing or forming thereof, may for example share any or all characteristics with any dielectric layer discussed herein (e.g., the first dielectric layer 111 of FIGS. 1-6, etc.). The first dielectric layer 211 may also be referred to herein as a protective layer.

Figure 7B:
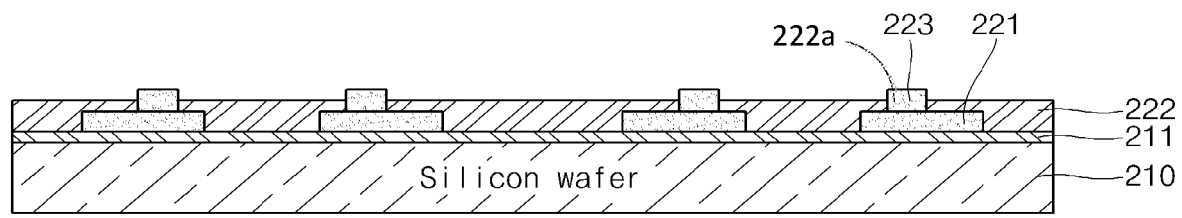

As shown in FIG. 7B, during the forming of the first conductive layer 221, which may also be referred to as a redistribution layer, the first conductive layer 221 may be formed on the first dielectric layer 211. The first conductive layer 221 and/or the forming thereof may, for example, share any or all characteristics with any other conductive layer and/or the forming thereof discussed herein (e.g., with regard to FIGS. 1-6, etc.). In one example implementation, a first seed layer 221*a* (see, e.g., FIG. 8) is formed on the first dielectric layer 211, and the first conductive layer 221 is formed on the first seed layer 221*a*. The first conductive layer 221 may then be covered with a second dielectric layer 222. The second dielectric layer 222, and/or the forming thereof may, for example, share any or all characteristics with any other dielectric layer and/or the forming thereof discussed herein (e.g., with regard to FIGS. 1-6, etc.).

The forming of the first conductive layer 221 (e.g., with or without a seed layer 221*a*) and the second dielectric layer 222 may be repeated any number of times (e.g., utilizing the same materials and/or processes or different respective materials and/or processes). The example illustrations in FIGS. 7B-7H show two formations of such layers. As such, the layers are provided with similar labels in the figures (e.g., repeating the first conductive layer 221 and the second dielectric layer 222).

Additionally, an opening 222*a* (or aperture) may be formed in the second dielectric layer 222 corresponding to the first conductive layer 221 (or a portion thereof). The opening 222*a* and/or the forming thereof, may share any or all characteristics with other openings and/or the forming thereof discussed herein. For example, the opening 222*a* may share any or all characteristics with the opening 122*a* discussed herein (e.g., with regard to FIGS. 1-6, etc.).

A micro bump pad 223 (or other pad, landing, or attachment structure) may, for example, be formed in the opening 222*a*. The micro bump pad 223 and/or the forming thereof may, for example, share any or all characteristics with other pads discussed herein (e.g., the micro bump pad 126 of FIGS. 1-6, etc.). For example, a micro bump seed layer 223*a* (see, e.g., FIG. 8) may be formed on (e.g., directly on) the first conductive layer 221 exposed through the opening 222*a*, and the micro bump pad 223 may be formed on the micro bump seed layer 223*a*. The micro bump seed layer 223*a* and/or micro bump pad 223 may also be referred to herein conductive layers.

As discussed herein (e.g., with regard to FIGS. 1-6, etc.), in an example implementation, since the first conductive layer 221 (e.g., with or without an underlying seed layer 221*a*) may be formed on the inorganic first dielectric layer 211, it may be formed (or more easily formed) to have a finer line/space/thickness in comparison to other conductive layers, which may be formed on organic dielectric layers.

Figure 7C:
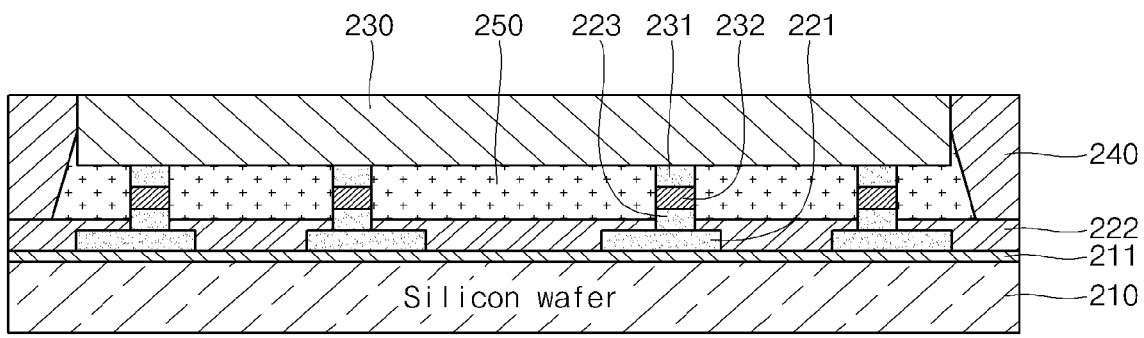

As shown in FIG. 7C, during the attaching of the semiconductor die 230 and the molding with the mold material 240, the semiconductor die 230 is electrically connected to the micro bump pad 223 and is molded with the mold material 240. The semiconductor die 230 and/or the attaching thereof may share any or all characteristics with other semiconductor dies and/or the attaching thereof discussed herein (e.g., the semiconductor die 130 and/or the attaching thereof discussed herein with regard to FIGS. 1-6, etc.).

For example, the conductive bump 231 (or other conductive attachment structure) of the semiconductor die 230 is electrically connected to the micro bump pad 223 through the solder 232. The conductive bump 231 of the semiconductor die 230 may be attached to the micro bump pad 223 (or other pad or landing structure) in any of a variety of manners, non-limiting examples of which are presented herein. For example, the conductive bump 231 may be soldered to the micro bump pad 223 utilizing any of a variety of solder attachment processes (e.g., a mass reflow process, a thermal compression process, etc.). Also for example, the conductive bump 231 may be coupled to the micro bump pad 223 utilizing a conductive adhesive, paste, etc.

In an example implementation, an underfill 250 may be formed between the semiconductor die 230 and the interposer 220 (e.g., the second dielectric layer 222), for example, surrounding portions of the conductive bumps 231 and micro bump pads 223 that are exposed to the underfill 250. The underfill 250 and/or the formation thereof, may share any or all characteristics with other underfills and/or the formation thereof discussed herein (e.g., the underfill 150 discussed herein with regard to FIGS. 1-6, etc.). The underfill 250 may comprise any of a variety of underfill materials. Also the underfill 250 may be formed utilizing any of a variety of processes (e.g., a capillary underfilling process, utilizing a pre-applied underfill material, etc.). The under fill 250 between the semiconductor die 230 and the interposer 220 (as various layers are illustratively group in FIGS. 7F-7H) may, for example prevent or reduce warpage, for example due to thermal expansion coefficient difference between the semiconductor die 230 and the interposer 220.

In the molding process, the semiconductor die 230 and/or interposer 220 may be encapsulated with a mold material 240 (e.g., a molding resin or other mold material). The mold material 240 and/or the forming thereof may, for example, share any or all characteristics with other mold materials and/or the forming thereof discussed herein (e.g., the mold material 140 discussed herein with regard to FIGS. 1-6, etc.). In an example implementation, the mold material 240 covers the side surfaces and top surface of the semiconductor die 230. In another example implementation, the mold material 240 only covers the side surfaces of the semiconductor die 230 (or only respective portions thereof), thus leaving the top surface of the semiconductor die 230 exposed from the mold material 240. The mold material 240 may be formed in any of a variety of manners (e.g., compression molding, transfer molding, flood molding, etc.). The mold material 240 may comprise any of a variety of types of mold material. For example, the mold material 240 may comprise a resin, an epoxy, a thermosetting epoxy molding compound, a room temperature curing type, etc. As discussed herein, the mold material 240 may also be utilized to form a molded underfill, for example instead of the underfill 250.

Figure 7D:
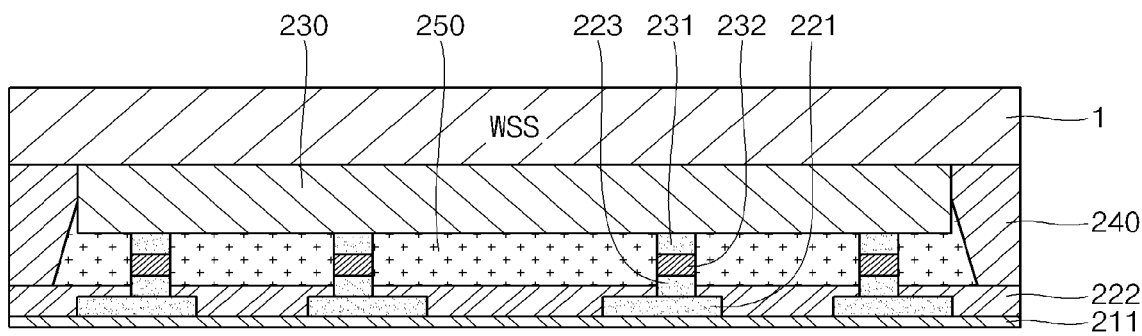

As shown in FIG. 7D, during the attaching of the wafer support system 1 and the removing of the carrier 210, the wafer support system 1 is attached to the top surfaces of the semiconductor die 230 and the mold material 240, and the carrier 210 (for example, a silicon wafer) below the first dielectric layer 211 is removed, for example, through a grinding process and/or an etching process. The wafer support system 1 and/or the attachment thereof may, for example, share any or all characteristics with other wafer support systems discussed herein (e.g., the example first wafer support system 1 and/or second wafer support system 2 discussed herein with regard to FIGS. 1-6, etc.). Additionally, the removing of the carrier 210 may, for example, share any or all characteristics with any carrier removal discussed herein (e.g., the removal of the carrier 110 discussed herein with regard to FIGS. 1-6, etc.). In an example implementation, after removal of the carrier 210, only the first dielectric layer 211 remains on the bottom surfaces of the first redistribution layer 221 and the second dielectric layer 222.

Figure 7E:
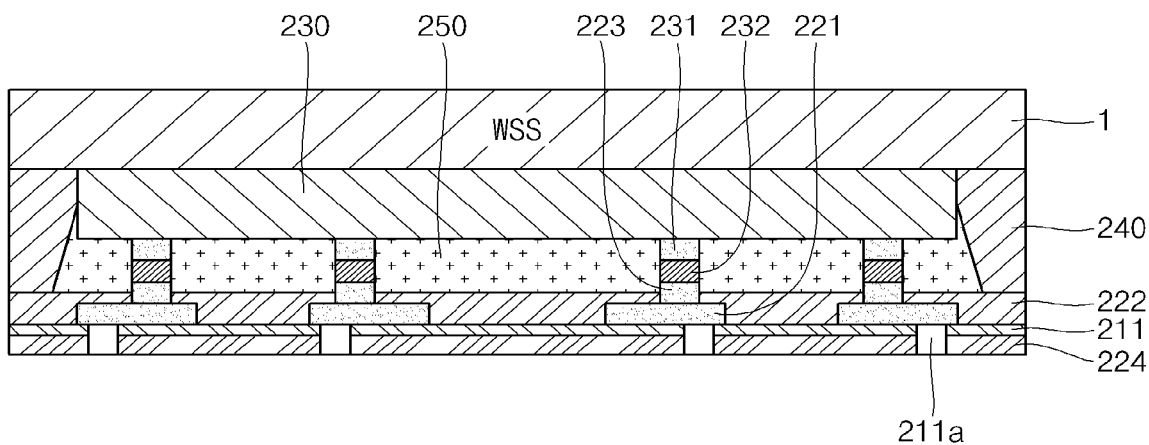

As shown in FIG. 7E, during the forming of the openings 211a (or apertures) in the first dielectric layer 211, a plurality of openings 211a are selectively formed in the first dielectric layer 211. The openings 211a and/or the forming thereof may, for example, share any or all characteristics with other openings and/or the forming thereof discussed herein (e.g., with regard to FIGS. 1-6, etc.). For example, the openings 211a may be formed in any of a variety of manners (e.g., mechanical and/or laser ablation, chemical etching, photo etching process, etc.). Each of the openings 211a may, for example, correspond to a respective specific area of the first conductive layer 221 exposed to the outside by the opening 211a. In an example implementation, an opening 211a exposes a respective specific area of the first conductive layer 221 to the outside through the inorganic first dielectric layer 211. In an example implementation in which the first conductive layer 221 was formed on a first seed layer 221a, a specific area of the first seed layer 221a on which the first conductive layer 221 was formed is exposed to the outside through the inorganic first dielectric layer 211.

The example illustration of FIG. 7E also shows a third dielectric layer 224 formed on (e.g., directly on) the first dielectric layer 211. Such a third dielectric layer 224 and/or the forming thereof may share any or all characteristics with the other dielectric layers or the forming thereof discussed herein (e.g., with regard to FIGS. 1-6, etc.). In an example scenario, the third dielectric layer 224 may comprise an organic layer, and the first dielectric layer 211 may comprise an inorganic layer. In such an example implementation, the openings 211a may be formed through both the third dielectric layer 224 and the first dielectric layer 211 in a same forming process.

Figure 7F:
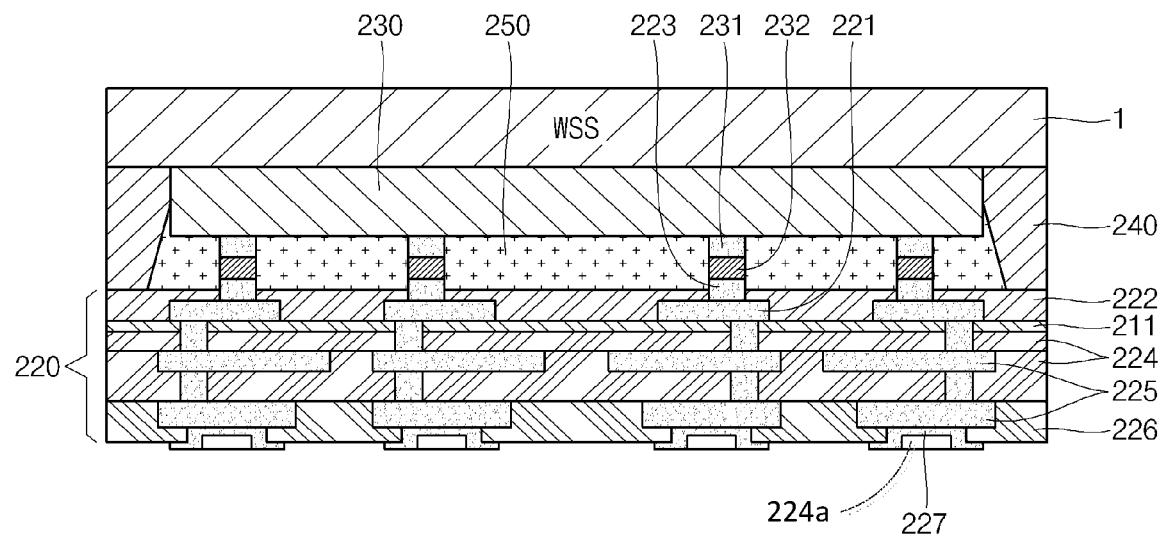

As shown in FIG. 7F, during the forming of the second conductive layer 225 and the under bump metal 227, the second conductive layer 225 and under bump metal 227 of at least one layer are formed below the first conductive layer 221 and/or below the third dielectric layer 224.

In one example implementation, a second seed layer 225a (see, e.g., FIG. 8) is formed at the inside of the opening 211a (e.g., on side walls of the opening 211a formed in the first 211 and/or third dielectric layers 224, and/or on the first conductive layer 221) and/or outside of the opening 211a (e.g., on the bottom surface of the third dielectric layer 224 around and/or extending from the opening 211a). The second seed layer 225a may also be referred to herein as a conductive layer. In an example implementation, the second seed layer 225a may be formed directly on the first seed layer 221a. In various example implementations, however, forming the second seed layer 225a may be skipped and the second conductive layer 225 formed on the first seed layer 221a.

Continuing the example implementation, the second conductive layer 225 is formed on the second seed layer 225a. For example, the second conductive layer 225 may be formed to fill (or at least cover side surfaces of) the opening 211a in the third dielectric layer 224 and/or in the first dielectric layer 211. The second conductive layer 225 may, for example, be formed using the same material(s) and/or processes as other conductive layers presented herein (e.g., the first conductive layer 121 of FIGS. 1-6, etc.), or may be formed using different respective material(s) and/or process (es). The second conductive layer 225 may also be referred to herein as a redistribution layer.

The second conductive layer 225 may then, for example, be covered with the fourth dielectric layer 226, The fourth dielectric layer 226 may, for example, be formed utilizing the same material(s) and/or process(es) as utilized to form the second 222 and third 224 dielectric layers, or may be formed utilizing different respective material(s) and/or process(es).

Figure 7G:
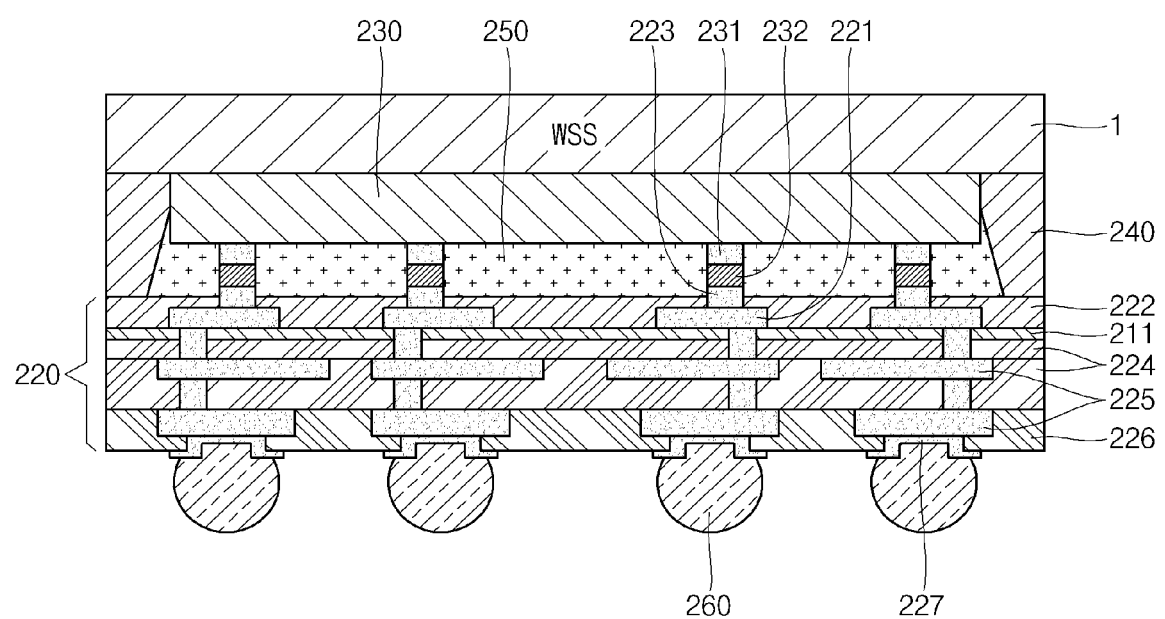
Figure 7H:
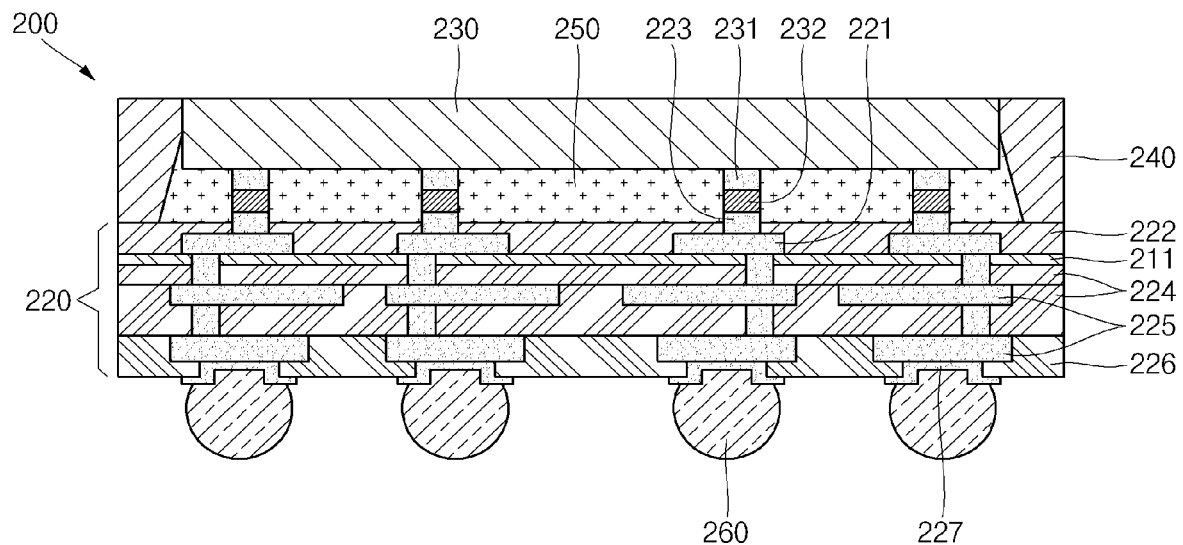

Formation of the third dielectric layer 224 and the second conductive layer 225 (e.g., with or without a seed layer 225a) may be repeated any number of times (e.g., utilizing the same materials and/or processes or different respective materials and/or processes). The example illustrations in FIGS. 7F-7H show two formations of such layers. As such, the layers are provided with similar labels in the figures (e.g., repeating the third dielectric layer 224 and the second conductive layer 225).

An opening 224a (or aperture) may, for example, be formed in the fourth dielectric layer 226, and a specific area of the second conductive layer 225 may be exposed to the outside through the opening 224a. As with all openings discussed herein, the opening 224a may be formed in any of a variety of manners (e.g., mechanical and/or laser ablation, chemical etching, masking during formation of the dielectric layer, etc.).

An under bump seed layer 227a (see, e.g., FIG. 8) may, for example, be formed at the inside of the opening 224a (e.g., on side walls of the opening 224a formed in the fourth dielectric layer 226 and/or on the second conductive layer 225 exposed by the opening 224a) and/or outside of the opening 224a (e.g., on the bottom surface of the fourth dielectric layer 226, for example around and/or encircling the opening 224a). As discussed herein, the under bump seed layer 227a may be formed using the same material(s) and/or process(es) as used to form any of the seed layers discussed herein (e.g., the first seed layer 121a, the second seed layer 123a, and/or the under bump seed layer 125a of FIGS. 1-6, etc.), or may be formed using different respective material(s) and/or process(es). The under bump seed layer 227a (or any seed layer discussed herein) may also be referred to herein as a conductive layer.

An under bump metal 227 is formed on the under bump seed layer 227a. The under bump metal 227 and/or the forming thereof may share any or all characteristics with other under bump metals and/or the forming thereof discussed herein (e.g., the under bump metal 125 of FIGS. 1-6, etc.).

For discussion purposes herein, the first conductive layer 221, the second dielectric layer 222, the second conductive layer 225, the third dielectric layer 224, and the fourth dielectric layer 226 may be considered to be components of an interposer 220. Furthermore, the micro bump pad 223 and under bump metal 227 may also be considered to be components of the interposer 220.

As shown in FIG. 7G, during the attaching of the conductive interconnection structure 260, the conductive interconnection structure 260 may be electrically connected to the under bump metal 227. At this point, for example while the wafer support system 1 is attached to the semiconductor die 230 and the mold material 240, the conductive interconnection structure 260 may be electrically connected to the under bump metal 227. The conductive interconnection structure 260 and/or method of attaching thereof may, for example, share any or all characteristics with any conductive interconnection structure and/or method of attaching thereof discussed herein (e.g., the conductive interconnection structure 160 of FIGS. 1-6, etc.).

As shown in FIG. 7H, during the separating of the wafer support system 1, the wafer support system 1 attached to the semiconductor die 230 and/or the mold material 240 is separated from the semiconductor die 230 and/or mode material 240. The wafer support system 1 and/or the method of separating thereof may, for example, share any or all characteristics with any other wafer support system and/or method of separating thereof discussed herein (e.g., the first wafer support system 1 and/or second wafer support system 2 of FIGS. 1-6, etc.).

In the completed example semiconductor device 200, the top surface of the semiconductor die 230 may, for example, be exposed to the outside through the top surface of the mold material 240. For example, the top surface of the semiconductor die 230 and the top surface of the mold material 240 may be coplanar. In another example implementation, the mold material 240 may cover the top surface of the semiconductor die 230.

As with any or all of the examples discussed herein (e.g., with regard to FIGS. 1-6, etc.), the interposer 220 (or package 200) may, for example, be formed in a mass configuration or as a single unit. As discussed herein, in an example scenario in which the interposer 220 (or package 200) is formed in a mass configuration, a singulation process may be performed.

Figure 8:
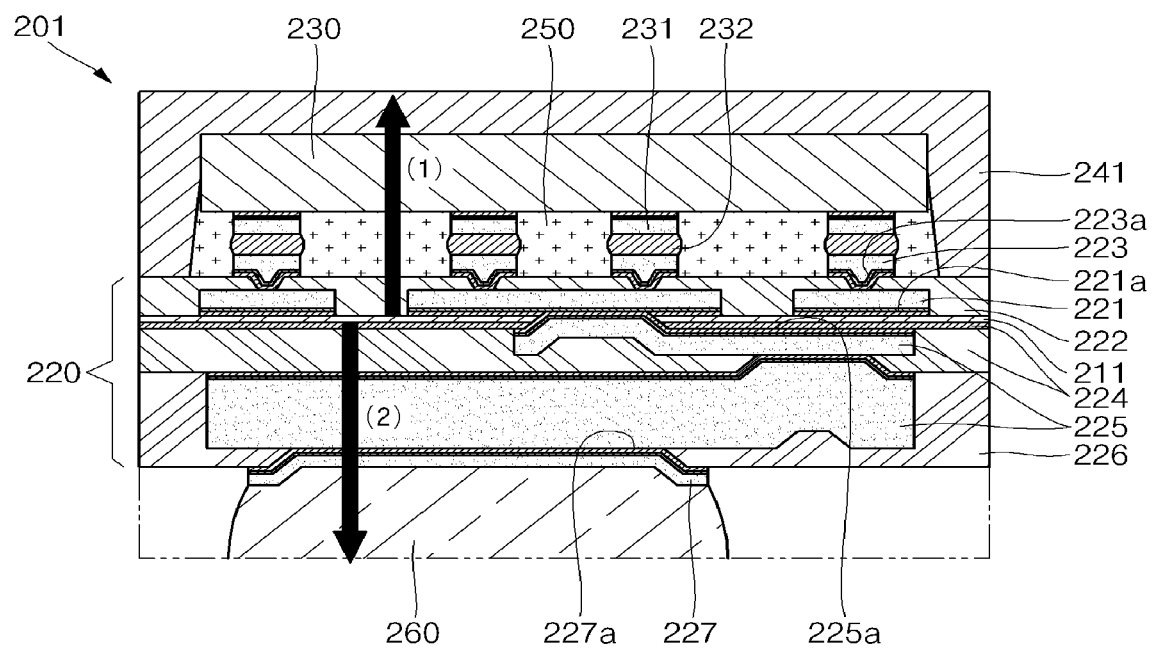
FIG. 8 shows a cross-sectional view illustrating a semiconductor device, in accordance with various aspects of the present disclosure.

Referring to FIG. 8, such figure shows a cross-sectional view illustrating a semiconductor device 201, in accordance with various aspects of the present disclosure.

As shown in FIG. 8, the example semiconductor device 201 may comprise an interposer 220, a semiconductor die 230, a mold material 240, an underfill 250, and a conductive interconnection structure 260. The semiconductor device 201 may, for example, share any or all characteristics with the example semiconductor device 200 shown in FIGS. 7A-7H, and/or with any other semiconductor device presented herein (e.g., with respect to FIGS. 1-6, etc.).

The interposer 220, for example, comprises a first seed layer 221a on a first dielectric layer 211 (for example, a silicon oxide layer and/or a silicon nitride layer), a first conductive layer 221 on the first seed layer 221a, a second dielectric layer 222 covering the first conductive layer 221, a second seed layer 225a below the first dielectric layer 211 and directly connected to the first seed layer 221a, a second conductive layer 225 below the second seed layer 225a, and a third dielectric layer 224 covering the second conductive layer 225. The line/space/thickness of the first conductive layer 221 may, for example, be smaller than those of the second conductive layer 225.

The interposer 220, or general grouping of layers, may for example comprise a micro bump seed layer 223a extending into and/or through the second dielectric layer 222 (e.g., via an opening formed therein) and on the first conductive layer 221, a micro bump pad 223 on the micro bump seed layer 223a, an under bump seed layer 227a below the second conductive layer 225, and an under bump metal 227 below the under bump seed layer 227a. In an example implementation, the first seed layer 221a and the second seed layer 225a are directly and electrically connected to each other.

The conductive bump 231 is on the semiconductor die 230, and the conductive bump 231 is electrically connected to the micro bump pad 223 through the solder 232. The underfill 250 is between the semiconductor die 230 and the interposer 220 (e.g., the second dielectric layer 222), and the mold material 240 surrounds side surfaces of the semiconductor die 230 and the underfill 250. In the illustrated example, the mold material 240 surrounds the side surfaces of the semiconductor die 230 and also the top surface thereof.

The conductive interconnection structure 260 may, for example, be connected to the under bump metal 227 and may also be mounted on a substrate as discussed herein.

Labels (1) and (2) shown in FIG. 8 may, for example, show a lamination and/or formation order. For example, in relation to the semiconductor device 201, in accordance with various aspects of the present disclosure, a first portion of the interposer 220 is formed in the direction (1) (e.g., building from the first dielectric layer 211) and the semiconductor die 230 is electrically connected to such first portion, and then the second remaining portion of the interposer 220 is formed in the direction (2) (e.g., building from the first dielectric layer 211) and the conductive interconnection structure 260 is attached to such second remaining portion.

Referring to FIGS. 9A to 9J, such figures show cross-sectional views illustrating a method of manufacturing a semiconductor device 300, in accordance with various aspects of the present disclosure. The example semiconductor devices and/or methods illustrated at FIGS. 9A to 9J may, for example, share any or all characteristics with any or all of the other example semiconductor devices and/or methods presented herein (e.g., with regard to FIGS. 1A to 1J, FIGS. 2-6, FIGS. 7A-7H, FIG. 8, etc.).

The example method of manufacturing the semiconductor device 300 may, for example, comprise providing a carrier 310 with a first dielectric layer 311, forming a first conductive layer 321, forming a second conductive layer 323, forming a micro bump pad 325, attaching a semiconductor die 330 and molding with a mold material 340, attaching a wafer support system 1, removing the carrier 310, forming an opening 311a in the first dielectric layer 311, forming an under bump metal 327 in and/or around the opening 311a, connecting a conductive interconnection structure 360, and separating the wafer support system 1.

Figure 9A:
FIGS. 9A to 9J show cross-sectional views illustrating a method of manufacturing a semiconductor device, in accordance with various aspects of the present disclosure.

As shown in FIG. 9A, during the forming or providing of the carrier 310 with the first dielectric layer 311, the carrier 310, such as, for example, a silicon wafer with a planar top surface and a planar bottom surface, is provided. The carrier 310, and the providing or forming thereof, may for example share any or all characteristics with any carrier and discussed herein (e.g., the carrier 110 of FIGS. 1-6, the carrier 210 of FIGS. 7-8, etc.).

The first dielectric layer 311, such as a silicon oxide layer and/or a silicon nitride layer, may be formed on the surface of a silicon wafer through an oxidation process. The first dielectric layer 311, and the providing or forming thereof, may for example share any or all characteristics with any dielectric layer discussed herein (e.g., the first dielectric layer 111 of FIGS. 1-6, the first dielectric layer 211 of FIGS. 7-8, etc.). The first dielectric layer 311 may also be referred to herein as a protective layer.

Figure 9B:
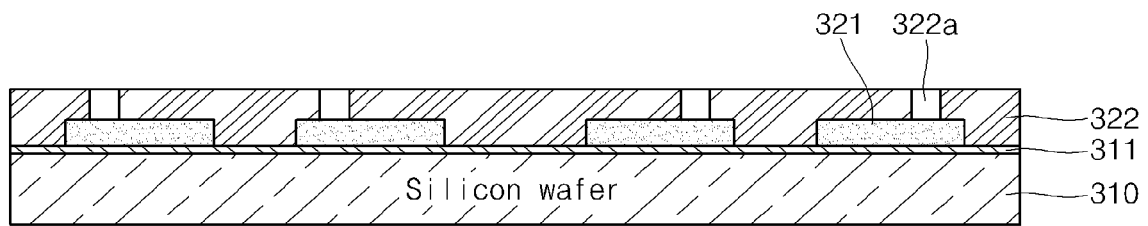

As shown in FIG. 9B, during the forming of the first conductive layer 321, which may also be referred to as a redistribution layer, the first conductive layer 321 may be formed on the first dielectric layer 311. The first conductive layer 321 and/or the forming thereof may share any or all characteristics with other conductive layers discussed herein (e.g., with regard to FIGS. 1-8, etc.). In one example implementation, a first seed layer 321a (see, e.g., FIG. 10) is formed on the first dielectric layer 311, and the first conductive layer 321 is formed on the first seed layer 321a.

The first conductive layer 321 may then be covered with a second dielectric layer 322. The second dielectric layer 322, and/or the forming thereof may, for example, share any or all characteristics with any other dielectric layer, and/or the forming thereof discussed herein (e.g., with regard to FIGS. 1-8, etc.).

The forming of the first conductive layer 321 (e.g., with or without a seed layer 321a) and the second dielectric layer 322 may be repeated any number of times (e.g., utilizing the same materials and/or processes or different respective materials and/or processes). The example illustrations in FIGS. 9C-9J show two formations of such layers. As such, the layers are provided with similar labels in the figures (e.g., repeating the first conductive layer 321 and the second dielectric layer 322).

In the example illustrated in FIG. 9, since the conductive interconnection structure 360 is later connected to the first conductive layer 321, the line/space/thickness of the first conductive layer 321 may, for example, be formed larger in comparison to the line/space/thickness of the second conductive layer 323 discussed below. The scope of this disclosure, however, is not limited to such relative dimensions.

Figure 9C:
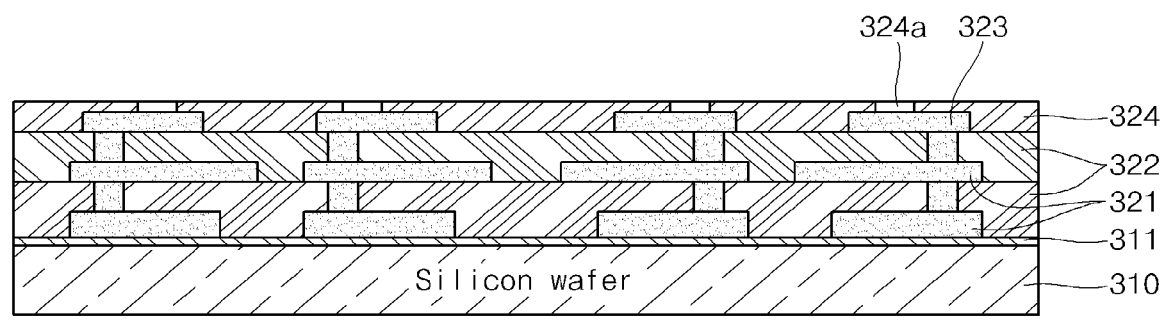

As shown in FIG. 9C, during the forming of the second conductive layer 323, the second conductive layer 323 is formed on the first conductive layer 321 and/or on the second dielectric layer 322. In an example implementation, a second seed layer 323a (see, e.g., FIG. 10) is formed on a top surface of the second dielectric layer 322 and/or in an opening (or aperture) thereof extending through the second dielectric layer 322 to the first conductive layer 321, a second conductive layer 323 is formed on the second seed layer 323a, and the second conductive layer 323 is covered with the third dielectric layer 324. Also, an opening 324a may be formed in the third dielectric layer 324 so that a specific area of the second conductive layer 323 corresponding to the opening 324a is exposed to the outside. The second conductive layer 323, the third dielectric layer 324, and/or openings (or apertures) therein, and/or the formation thereof, may share any or all characteristics with the other conductive layers, dielectric layers, and openings, and the formation thereof discussed herein (e.g., with regard to FIGS. 1-8, etc.). For example, such formation may be repeated any number of times.

Figure 9D:
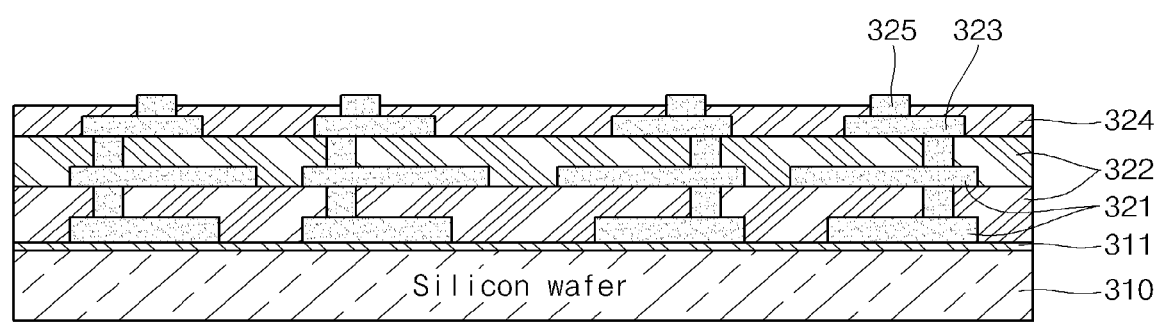

As shown in FIG. 9D, during the forming of the micro bump pad 325 (or other pad, land, attachment structure, die attachment structure, etc.) in the opening 324a, the micro bump pad 325 is formed in the opening 324a so that the micro bump pad 325 is electrically connected to the second conductive layer 323. In an example implementation, a micro bump seed layer 325a (see, e.g., FIG. 10) is formed at the inside of the opening 324a (e.g., on the second conductive layer 323 exposed by the opening 324a and/or on side walls of the opening 324a) and/or outside of the opening 324a (e.g., on the top surface (in FIG. 9D) of the third dielectric layer 324). The micro bump seed layer 325a may, for example, be formed utilizing the same material(s) and/or process(es) discussed herein with regard to other seed layers, or may be formed utilizing different respective material(s) and/or process(es). The micro bump seed layer 325a and/or micro bump pad 325 may also be referred to herein as a conductive layer.

The micro bump pad 325 may then, for example, be formed on the micro bump seed layer 325a. For example, in an example implementation, the micro bump seed layer 325a is interposed between the second conductive layer 323 and the micro bump pad 325. The micro bump pad 325 and/or the forming thereof may, for example, share any or all characteristics with any other pad or micro bump pad and/or the forming thereof discussed herein (e.g., with regard to FIGS. 1-6, FIGS. 7-8, etc.). The micro bump seed layer 325a and/or micro bump pad 325 may also be referred to herein as a conductive layer.

Though not illustrated in FIGS. 9A-9J, following formation of the under bump metal 325, an edged trim (or profile) process may be performed, for example in which an edge of the wafer being processed is trimmed (or profiled). Such trimming may be performed in a variety of manners, for example by grinding. Such edge trimming may, for example, protect the wafer from chipping and flaking during subsequent processing.

Figure 9E:
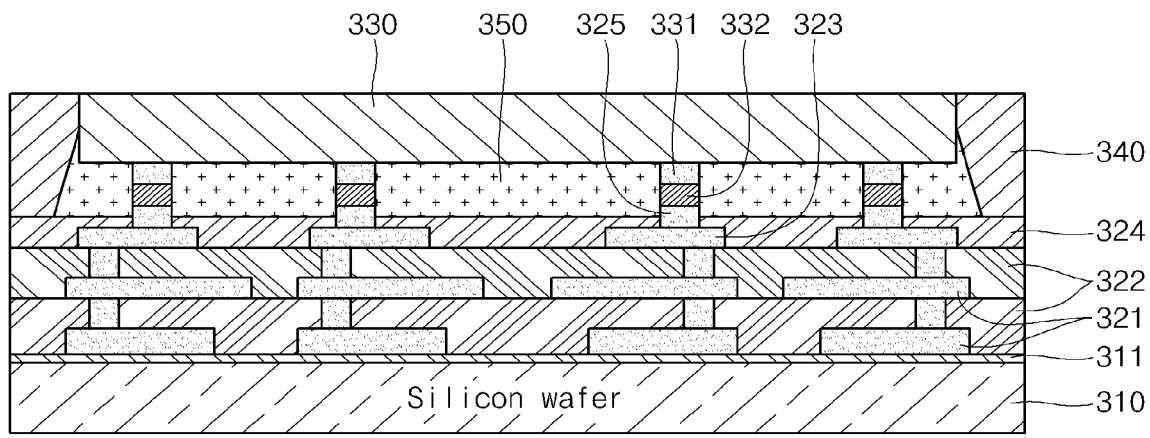

As shown in FIG. 9E, during the attaching of the semiconductor die 330 and the molding with the mold material 340, the semiconductor die 330 is electrically connected to the micro bump pad 325 and is molded with the mold material 340. The semiconductor die 330 and/or the attaching thereof may share any or all characteristics with other semiconductor dies and/or the attaching thereof discussed herein (e.g., with regard to FIGS. 1-6, FIGS. 7-8, etc.). For example, in an example scenario, a solder paste may be applied to the micro bump pad 326 utilizing a stencil and squeegee, the conductive bump 331 of the semiconductor die 330 may be positioned on or in the solder paste (e.g., utilizing a pick-and-place process), and the solder paste may then be reflowed. After attachment of the semiconductor die 330, the assembly may be cleaned (e.g., with hot DI water, etc.), subjected to a flux clean and bake process, subjected to a plasma treatment process, etc.

For example, the conductive bump 331 (or other conductive attachment structure) of the semiconductor die 330 is electrically connected to the micro bump pad 325 through the solder 332. The conductive bump 331 of the semiconductor die 330 may be attached to the micro bump pad 325 (or other pad or landing structure) in any of a variety of manners, non-limiting examples of which are presented herein. For example, the conductive bump 331 may be soldered to the micro bump pad 325 utilizing any of a variety of solder attachment processes (e.g., a mass reflow process, a thermal compression process, etc.). Also for example, the conductive bump 331 may be coupled to the micro bump pad 325 utilizing a conductive adhesive, paste, etc.

In an example implementation, an under fill 350 may be formed between the semiconductor die 330 and the interposer 320 (e.g., the third dielectric layer 324), for example, surrounding portions of the conductive bumps 331 and micro bump pads 325 that are exposed to the underfill 350. The underfill 350, or the formation thereof, may share any or all characteristics with other underfills discussed herein (e.g., with regard to FIGS. 1-6, FIGS. 7-8, etc.).

In the molding process, the semiconductor die 330 and/or interposer 320 may be encapsulated with a mold material 340 (e.g., a molding resin or other mold material or encapsulant), which may then be cured. The mold material 340 and/or the forming thereof, may share any or all characteristics with other mold materials and/or the forming thereof discussed herein (e.g., with regard to FIGS. 1-6, FIGS. 7-8, etc.). In an example implementation, the mold material 340 covers the side surfaces and top surface of the semiconductor die 330. In another example implementation, the mold material 340 only covers the side surfaces of the semiconductor die 330 (or only respective portions thereof), thus leaving the top surface of the semiconductor die 330 exposed from the mold material 340. As discussed herein, the mold material 340 may also be utilized to form a molded underfill, for example instead of the underfill 350.

Figure 9F:
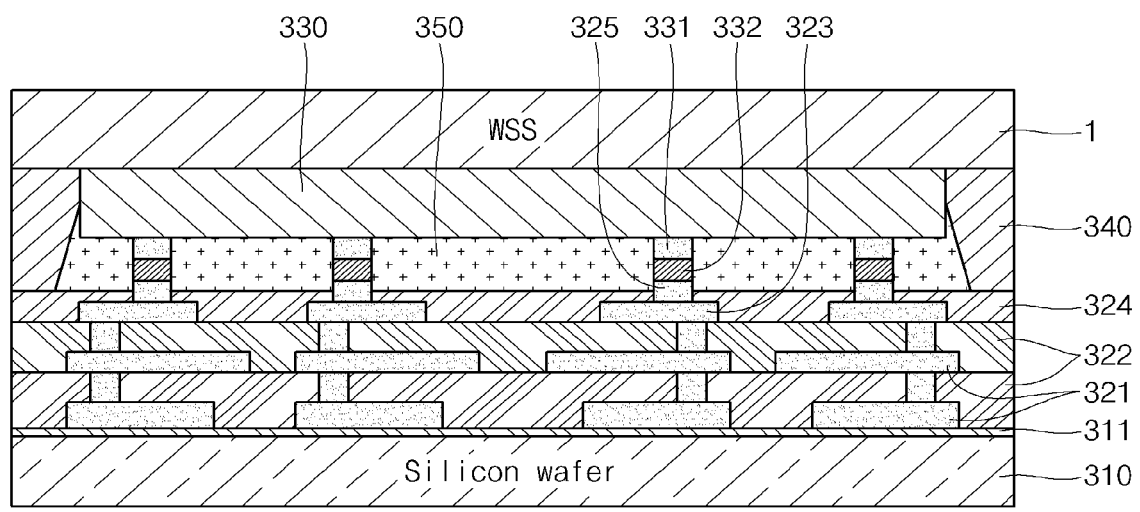

As shown in FIG. 9F, during the attaching of the wafer support system 1, the wafer support system 1 is attached to the top surfaces of the semiconductor die 330 and the mold material 340. In another example implementation, when the mold material 340 covers the top surface of the semiconductor die 330, the wafer support system 1 is attached to the top surface of the mold material 340. The wafer support system 1 and/or the attachment thereof may, for example, share any or all characteristics with other wafer support systems and/or the attachment thereof discussed herein (e.g., with regard to FIGS. 1-6, FIGS. 7-8, etc.).

Figure 9G:
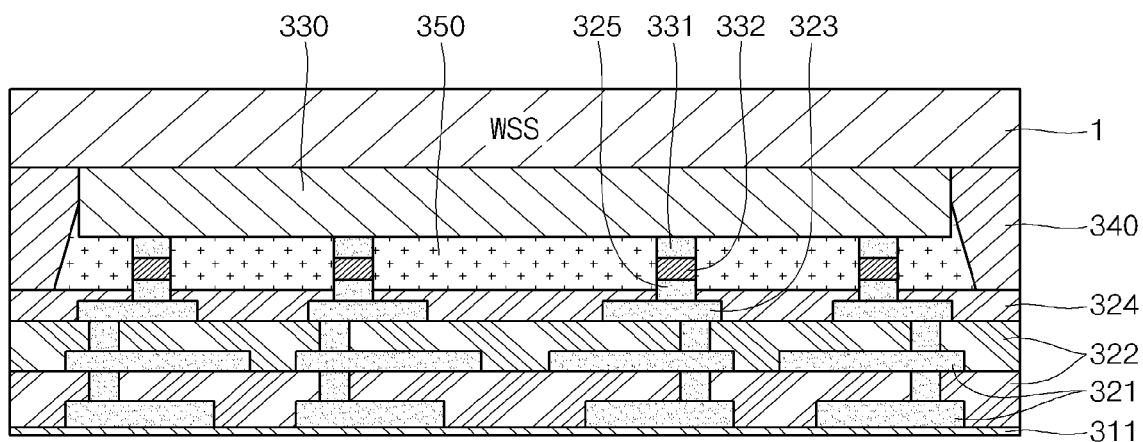

As shown in FIG. 9G, during the removing of the carrier 310, the carrier 310 (for example, a silicon wafer) attached to the first dielectric layer 311 is removed. For example, most or all of the carrier 310 may be removed through a mechanical grinding process and then, any remaining carrier 310 may be removed completely through a chemical etching process. The removing of the carrier 310 may, for example, share any or all characteristics with any carrier removal discussed herein (e.g., with regard to FIGS. 1-6, FIGS. 7-8, etc.). In an example implementation, after removal of the carrier 310 only the first dielectric layer 311 (for example, a silicon oxide layer and/or a silicon nitride layer) originally formed or provided on the surface of the carrier 310 remains.

Figure 9H:
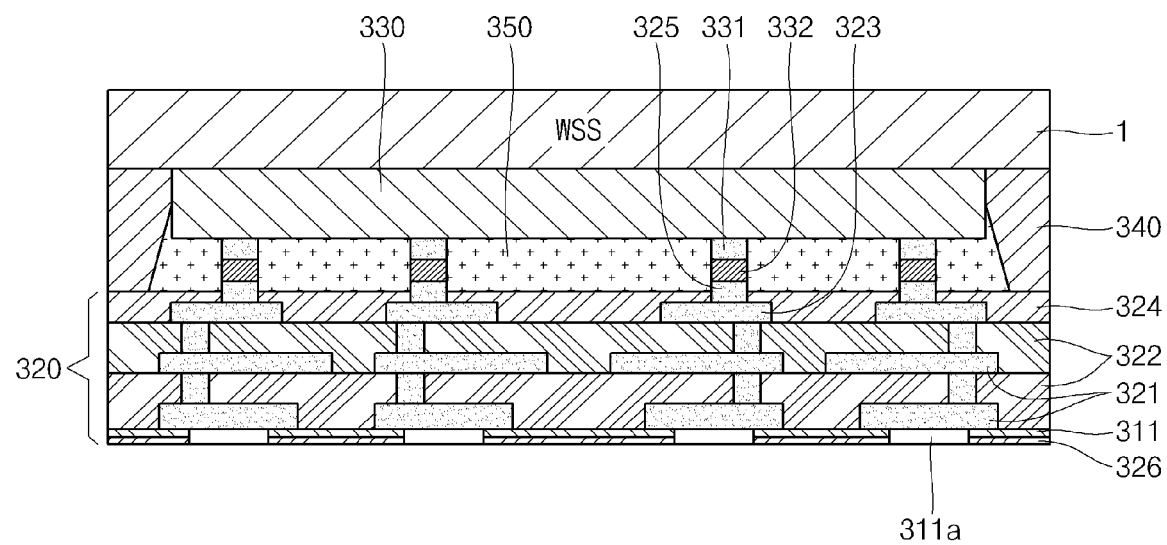

As shown in FIG. 9H, during the forming of the openings 311a (or apertures) in the first dielectric layer 311, a plurality of openings 311a are selectively formed in the first dielectric layer 311. The openings 311a and/or the forming thereof may, for example, share any or all characteristics with other openings and/or the forming thereof discussed herein (e.g., with regard to FIGS. 1-6, FIGS. 7-8, etc.). For example, the openings 311a may be formed in any of a variety of manners (e.g., mechanical and/or laser ablation, chemical etching, photo etching process, photo-masking and etching process, etc.). Each of the openings 311a may, for example, correspond to a respective specific area of the first conductive layer 321 exposed to the outside by the opening 311a. In an example implementation, an opening 311a exposes a respective specific area of the first conductive layer 321 to the outside through the inorganic first dielectric layer 311. In an example implementation in which the first conductive layer 321 was formed on a first seed layer 321a, a specific area of the first seed layer 321a on which the first conductive layer 321 was formed is exposed to the outside through the inorganic first dielectric layer 311.

The example illustration of FIG. 9H also shows a fourth dielectric layer 326 formed on (e.g., directly on) or under the first dielectric layer 311. Such a fourth dielectric layer 326 and/or the forming thereof may share any or all characteristics with the other dielectric layers and/or the forming thereof discussed herein (e.g., with regard to FIGS. 1-6, FIGS. 7-8, etc.). In an example implementation, the fourth dielectric layer 326 may comprise an organic layer, and the first dielectric layer 311 may comprise an inorganic layer. In such an example implementation, the openings 311a may be formed through both the fourth dielectric layer 326 and the first dielectric layer 311 in a same forming process.

Figure 9I:
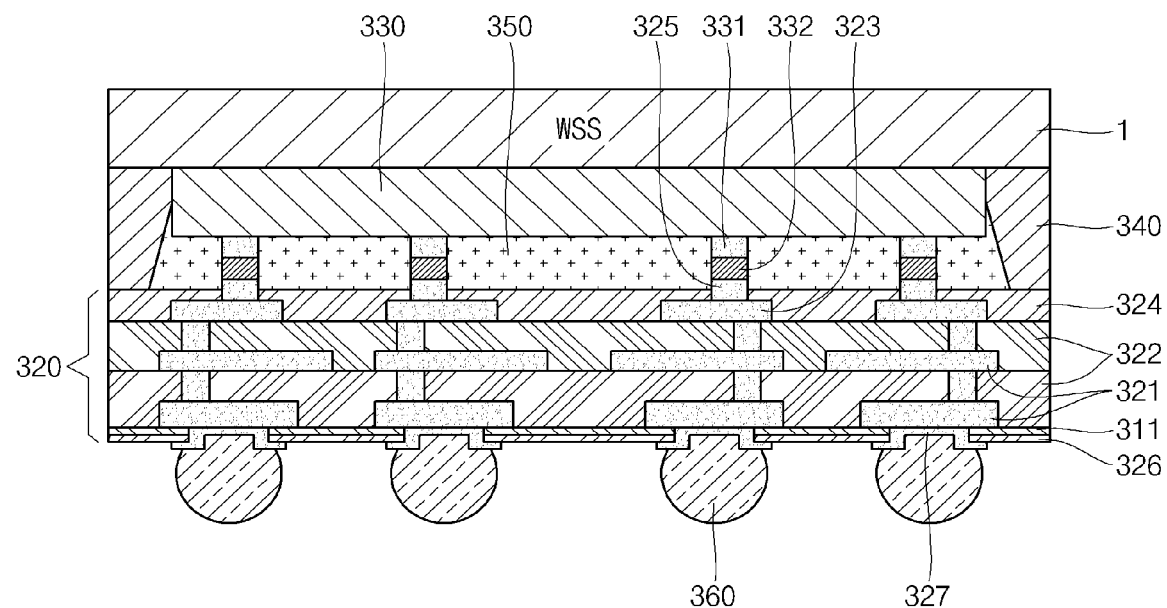

As shown in FIG. 9I, the under bump metal 327 is formed in and/or on the opening 311*a*, and the conductive interconnection structure 360 is attached to the under bump metal 327. The under bump metal 327 and/or the forming thereof may share any or all characteristics with other under bump metals and/or the forming thereof discussed herein (e.g., with regard to FIGS. 1-6, FIGS. 7-8, etc.). Additionally, the conductive interconnection structure 360 and/or the attachment thereof may share any or all characteristics with other conductive interconnection structures and/or the attachment thereof discussed herein (e.g. with regard to FIGS. 1-6, FIGS. 7-8, etc.).

For example, an under bump seed layer 327*a* (see, e.g., FIG. 10) may, for example, be formed at the inside of the opening 311*a* (e.g., on side walls of the opening 311*a* formed in the fourth dielectric layer 326 and/or formed in the first dielectric layer 311, and/or on the first conductive layer 321 or corresponding seed layer 321*a*) and outside of the opening 311*a* (e.g., on the bottom surface of the fourth dielectric layer 326 surrounding or encircling the opening 311*a*). As discussed herein, the under bump seed layer 327*a* may be formed using the same material(s) and/or process(es) as used to form any of the seed layers discussed herein (e.g., with regard to FIGS. 1-6, FIGS. 7-8, etc.), or may be formed using different respective material(s) and/or process(es). The under bump seed layer 327*a* may also be referred to herein as a conductive layer.

As the under bump metal 327 is formed on the opening 311*a* of the first dielectric layer 311 and the conductive interconnection structure 360 is connected to the under bump metal 327, the conductive interconnection structure 360 is electrically connected to the first conductive layer 321. In the example provided, the first seed layer 321*a* and the under bump seed layer 327*a* are directly and electrically connected to each other, mutually facing each other. In an alternative configuration, the first conductive layer 321 may be formed on a first side of the first seed layer 321*a*, and the under bump metal layer 327 may be formed on a second side of the first seed layer 321*a*, for example without a dedicated under bump seed layer 327*a* being formed.

For discussion purposes herein, the first conductive layer 321, the second dielectric layer 322, the second conductive layer 323, and the third dielectric layer 324 may be considered to be components of an interposer 320. Furthermore, the above-mentioned micro bump pad 325 and under bump metal 327 also may be considered to be components of the interposer 320.

Figure 9J:
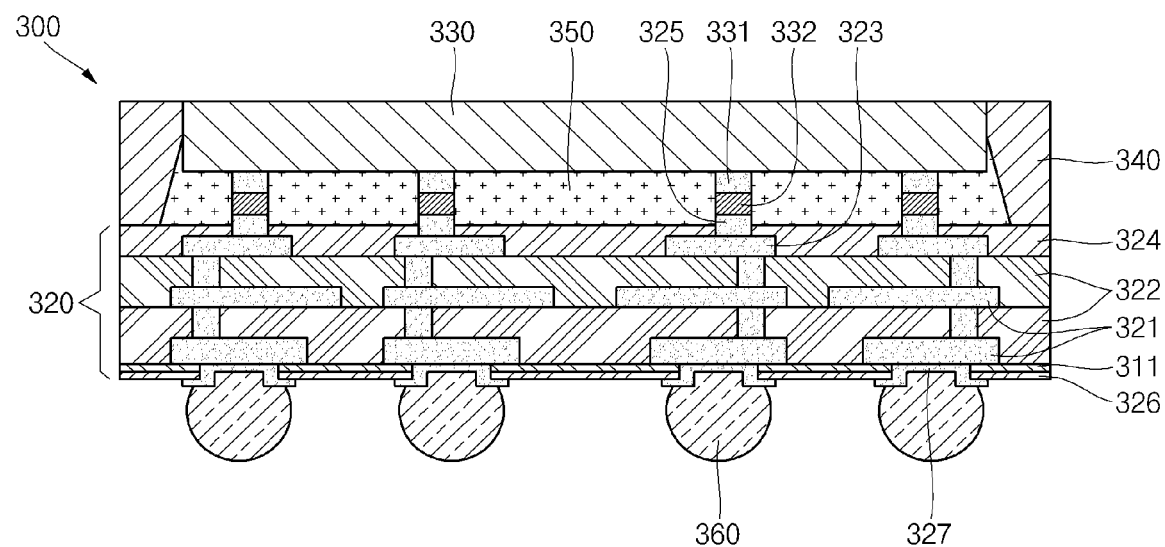

As shown in FIG. 9J, during the separating of the wafer support system 1, the wafer support system 1 is separated from the semiconductor die 330 and/or the mold material 340. The wafer support system 1 and/or the method of separating thereof may, for example, share any or all characteristics with any wafer support system and/or method of separating thereof discussed herein (e.g., with regard to FIGS. 1-6, FIGS. 7-8, etc.).

In the completed example semiconductor device 300, the top surface of the semiconductor die 330 may, for example, be exposed to the outside through the top surface of the mold material 340. For example, the top surface of the semiconductor die 330 and the top surface of the mold material 340 may be coplanar. In another example implementation, the mold material 340 may cover the top surface of the semiconductor die 330.

As with any or all of the examples discussed herein (e.g., with regard to FIGS. 1-8, etc.), the interposer 320 (or package 300) may, for example, be formed in a mass configuration or as a single unit. As discussed herein, in an example scenario in which the interposer 320 (or package 300) is formed in a mass configuration, a singulation process may be performed.

Figure 10:
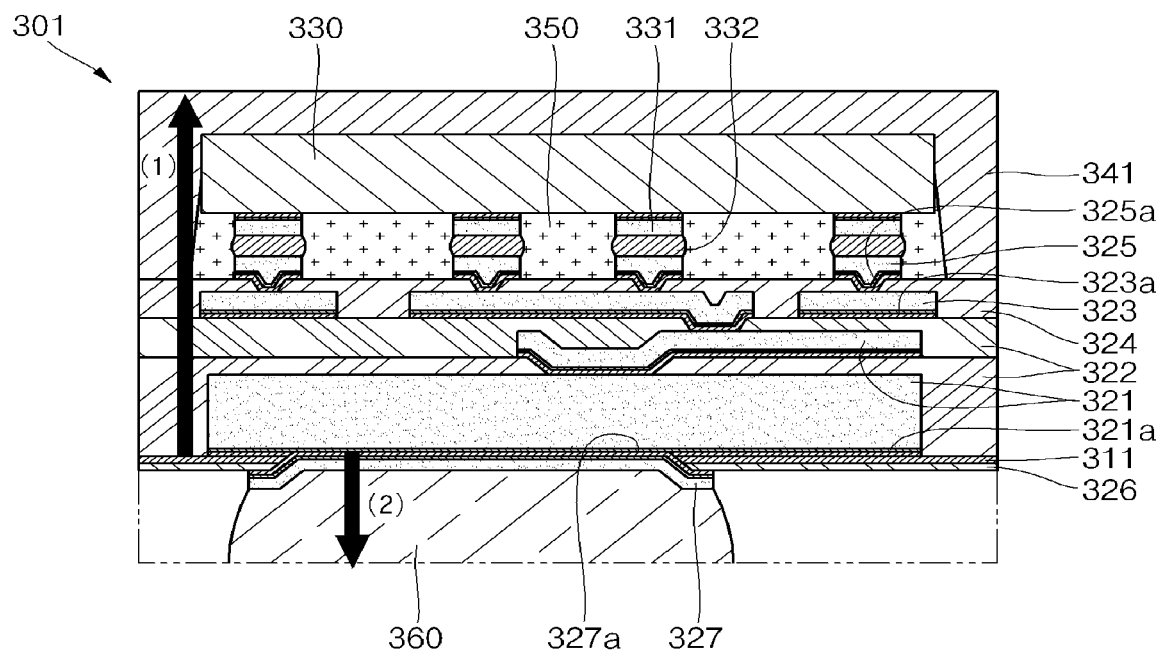
FIG. 10 shows a cross-sectional view illustrating a semiconductor device, in accordance with various aspects of the present disclosure.

Referring to FIG. 10, such figure shows a cross-sectional view illustrating a semiconductor device 301, in accordance with various aspects of the present disclosure.

As shown in FIG. 10, the example semiconductor device 301 may comprise an interposer 320, a semiconductor die 330, a mold material 340, an underfill 350, and a conductive interconnection structure 360. The semiconductor device 301 may, for example, share any or all aspects with the example semiconductor device 300 shown in FIGS. 9A-9J, and/or with any other semiconductor device presented herein (e.g., with respect to FIGS. 1-8, etc.).

The interposer 320 may, for example, comprise a first seed layer 321*a* above a first dielectric layer 311 (for example, a silicon oxide layer and/or a silicon nitride layer), a first conductive layer 321 on the first seed layer 321*a*, a second dielectric layer 322 covering the first conductive layer 321, a second seed layer 323*a* on the first conductive layer 321, a second conductive layer 323 on the second seed layer 323*a*, and a third dielectric layer 324 covering the second conductive layer 323. The line/space/thickness of the first conductive layer 321 may, for example, be larger than those of the second conductive layer 323.

The interposer 320, or general grouping of layers, may for example comprise a micro bump seed layer 325*a* extending into and/or through the third dielectric layer 324 (e.g., via an opening formed therein) and on the second conductive layer 323, a micro bump pad 325 on the micro bump seed layer 325*a*, an under bump seed layer 327*a* below the first conductive layer 321, and an under bump metal 327 below the under bump seed layer 327*a*. In an example implementation, the first seed layer 321*a* and the under bump seed layer 327*a* are directly and electrically connected to each other.

The conductive bump 331 is on the semiconductor die 330, and the conductive bump 331 is electrically connected to the micro bump pad 325 through the solder 332. The underfill 350 is between the semiconductor die 330 and the interposer 320 (e.g., the third dielectric layer 324), and the mold material 340 surrounds side parts of the semiconductor die 330 and the underfill 350. In the illustrated example, the mold material 340 surrounds the side surfaces of the semiconductor die 330 and also the top surface thereof.

The conductive interconnection structure 360 may, for example, be connected to the under bump metal 327 and may also be mounted on a substrate, as discussed herein.

Labels (1) and (2) shown in FIG. 10 may, for example, show a lamination and/or formation order. For example, in relation to the semiconductor device 301, in accordance with various aspects of the present disclosure, the interposer 320 (or a first portion thereof) is formed in the direction (1) (e.g., building from the first dielectric layer 311), the semiconductor die 330 is connected to the interposer 320, and then under bump seed layer 327*a* and under bump metal 327 (which may, for example, be considered a second portion of the interposer 320) and the conductive interconnection structure 360 is connected to the interposer 320 in the direction (2) (e.g., building from the first conductive layer 321 or first seed layer 321*a*).

Figure 11A:
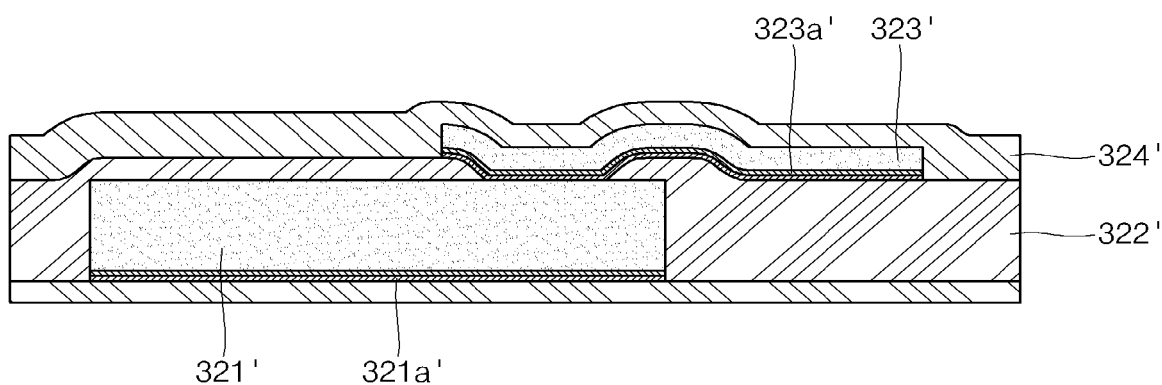
FIG. 11A shows a cross-sectional view of a structure in an example scenario in which a process of planarizing an interposer is not performed.
Figure 11B:
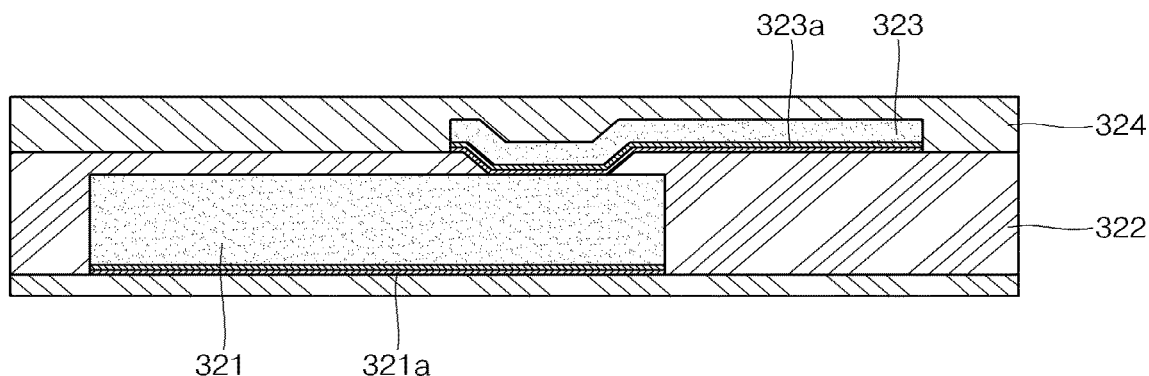
FIG. 11B shows a cross-sectional view of a structure in an example scenario in which a process of planarizing an interposer is performed, in accordance with various aspects of the present disclosure.

Referring to FIG. 11A, such figure shows a cross-sectional view of a structure in an example scenario in which the planarization process of an interposer is not performed, and referring to FIG. 11B, such figures shows a cross-sectional view for a structure in an example scenario in which a planarization process of an interposer is performed, in accordance with various aspects of the present disclosure.

As shown in FIG. 11A, since the line/space/thickness of the first conductive layer 321' are larger than those of the second conductive layer 323' formed thereon, if a planarization process is not performed, the flatness of the second conductive layer 323' may be diminished. Furthermore, when another third conductive layer (not shown) is formed on the second conductive layer 323', the flatness of the third conductive layer may be diminished further. Example seed layers 321a' and 323a' are also shown.

As shown in FIG. 11B, after the first conductive layer 321 is formed, a planarization process may be performed, and thus the flatness of the second conductive layer 323 may be improved. Additionally, the flatness of another third conductive layer (not shown) formed on the second conductive layer 323 may also be improved. Example seed layers 321a and 323a are also shown.

Figure 12A:
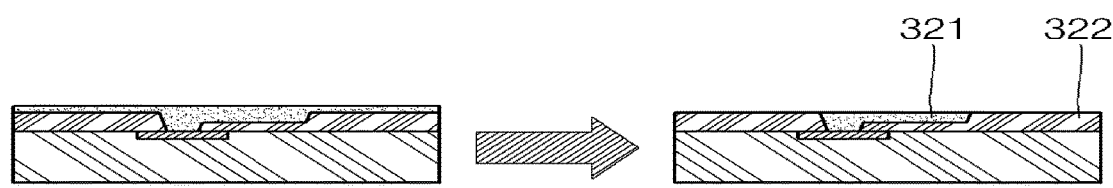
FIG. 12A shows a cross-sectional view illustrating a first example planarization process.
Figure 12B:
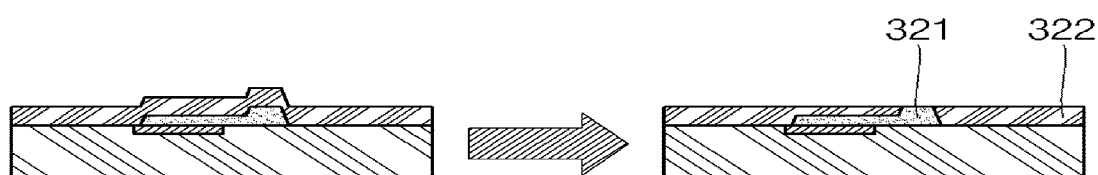
FIG. 12B shows a cross-sectional view illustrating a second example planarization process, in accordance with various aspects of the present disclosure.

Referring to FIG. 12A, such figure shows a cross-sectional view illustrating a first example planarization process, and referring to FIG. 12B, such figure shows a cross-sectional view illustrating a second example planarization process (e.g., of conductive and/or dielectric layers, etc.).

In the first example planarization process shown in FIG. 12A, only the conductive layer 321 is planarized. For example, after the conductive layer 321 is formed in the illustrated recess of the dielectric layer 322 and outside of the recess, as a chemical and/or mechanical planarization process is applied to the conductive layer 321 outside of the recess. For example, the top surfaces of the conductive layer 321 and/or the dielectric layer 322 may be planarized through a damascene method.

In the second example planarization process shown in FIG. 12B, only the dielectric layer 322 is planarized. For example, after the conductive layer 321 is formed and covered with the dielectric layer 322, a chemical and/or mechanical planarization process is applied to the dielectric layer 322. For example, the top surfaces of the conductive layer 321 and/or the dielectric layer 322 may be planarized. Note that in either of the example planarization processes shown in FIGS. 12A and 12B, both the conductive layer 321 and the dielectric layer 322 may be planarized (e.g., each subjected to chemical or mechanical planarization).

The planarization may, for example, assist efforts to minimize line/space/thickness of the one or more conductive layers. Note that the planarization process may be included in any of the process flows discussed herein (e.g., after formation of a conductive layer and/or dielectric layer).

Referring to FIGS. 13A to 13J, such figures show cross-sectional views illustrating a method of manufacturing a semiconductor device 400, in accordance with various aspects of the present disclosure. The example semiconductor devices and/or methods illustrated in FIGS. 13A to 13J may, for example, share any or all characteristics with any or all of the other example semiconductor devices and/or methods presented herein (e.g., with regard to FIGS. 1A to 1J, for example substituting a glass, ceramic, metal, or other type of for the illustrated silicon carrier material, or any other figure).

The example manufacturing method may, for example, comprise providing a carrier 410 with a first dielectric layer 411, forming a first conductive layer 421, forming a second conductive layer 423 and an under bump metal 425, attaching a first wafer support system 1, removing the carrier 410, forming an opening 411a in the first dielectric layer 411, forming a micro bump pad 426 at the opening 411a, attaching a semiconductor die 430 and molding with a mold material 440 (e.g., a resin, encapsulant, molding compound, etc.), separating the first wafer support system 1 and attaching a second wafer support system 2 and attaching a conductive interconnection structure 460, and separating the second wafer support system 2.

Figure 13A:
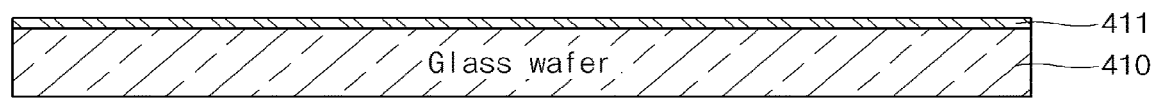
FIGS. 13A to 13J show cross-sectional views illustrating a method of manufacturing a semiconductor device, in accordance with various aspects of the present disclosure.

As shown in FIG. 13A, during the providing (or forming) of the carrier 410 with the first dielectric layer 411, the carrier 410 such as, for example, a glass, porous ceramic, or metal with a planar top surface and a planar bottom surface is provided. The carrier 410 may, for example, comprise a semiconductor material (e.g., silicon, GaAs, etc.), glass, ceramic (e.g., porous ceramic, etc.), metal, etc. The carrier 410 may also comprise any of a variety of different types of configurations. For example, the carrier 410 may be in a mass form (e.g., a wafer form, a rectangular panel form, etc.). Also for example, the carrier 410 may be in a singular form (e.g., singulated from a wafer or panel, originally formed in a singular form, etc.). The carrier 410 may, for example, share any or all characteristics with any carrier discussed herein.

A first dielectric layer 411, for example an organic dielectric layer (e.g., formed of polyimide, Benzo Cyclo Butene or Poly Benz Oxazole, etc.) may be (or may have been) formed on the surface of the carrier 410, for example through a coating process. For example, the first dielectric layer 411 may be formed through any one or more of spin coating, spray coating, dip coating, rod coating, equivalents thereof, etc., but the present disclosure is not limited thereto. Note that the scope of this disclosure is not limited to organic materials. The first dielectric layer 111 may, for example, be from 0.01 to 0.8 microns thick. The first dielectric layer 411 may, for example, share any or all characteristics with any dielectric layer discussed herein. For example, in various alternative example implementations, the dielectric layer 411 may comprise an inorganic material.

A conductive layer with a fine line/space/thickness may be formed on the organic first dielectric layer 411. For example, a conductive layer with a line/space/thickness of about 2/2/2 μM to about 10/10/10 μM may be formed.

Figure 13B:
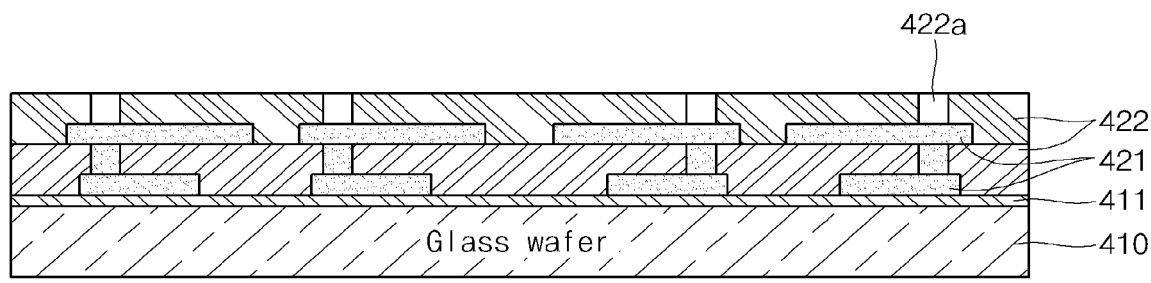

As shown in FIG. 13B, during the forming of the first conductive layer 421, which may also be referred to as a redistribution layer, the first conductive layer 421 may be formed on the first dielectric layer 411. In one example implementation, a first seed layer 421a (see, e.g., FIG. 14) is formed on the first dielectric layer 411, and the first conductive layer 421 is formed on the first seed layer 421a. The first conductive layer 421 may then be covered with a second dielectric layer 422, which may also be referred to herein as a passivation layer.

The first seed layer 421a and/or the forming thereof, may share any or all characteristics with any of the seed layers and/or the forming thereof discussed herein (e.g., the first seed layer 121 of FIG. 1, etc.). The first conductive layer 421 and/or the forming thereof, may share any or all characteristics with any of the conductive layers and/or the forming thereof discussed herein (e.g., the first conductive layer 121 of FIG. 1, etc.). For example, the first conductive layer 421 may be formed to have a finer line/space/thickness in comparison to the second conductive layer 423, discussed below.

The second dielectric layer 422 and/or the forming thereof, may share any or all characteristics with any of the dielectric layers and/or the forming thereof discussed herein (e.g., the second dielectric layer 122 of FIG. 1, etc.). An opening 422a (or aperture) may, for example, be formed in the second dielectric layer 422, and a specific area of the first conductive layer 421 may be exposed to the outside through the opening 422a. The opening 422a and/or the forming thereof may share any or all characteristics with any other opening and/or forming thereof discussed herein (e.g., the opening 122a of FIG. 1, etc.).

Figure 13C:
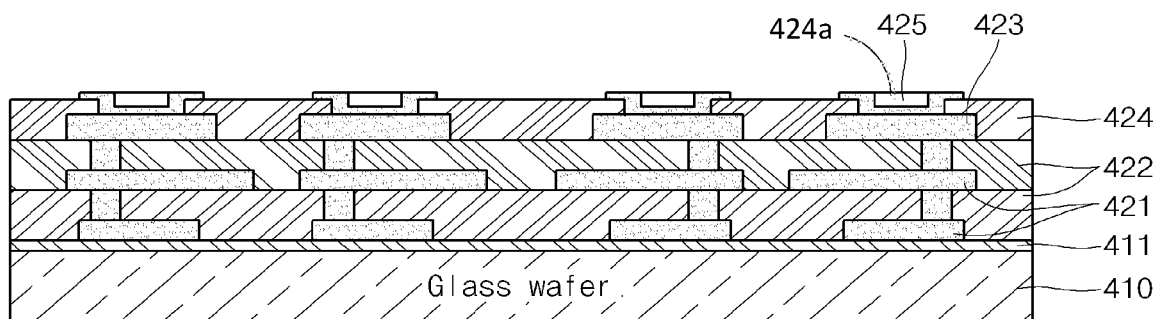

As shown in FIG. 13C, during the forming of the second conductive layer 423 and the under bump metal 425, the second conductive layer 423 and under bump metal 425 of at least one layer are formed on the first conductive layer 421 and/or on the second dielectric layer 422.

In one example implementation, a second seed layer 423a (see, e.g., FIG. 14) is formed at the inside of the opening 422a (e.g., on side walls of the opening 422a formed in the second dielectric layer 422 and/or on the first conductive layer 421 exposed by the opening 422a) and/or outside of the opening 422a (e.g., on the top surface of the second dielectric layer 422). As discussed herein, the second seed layer 423a may be formed using the same material(s) and/or process(es) as used to form the first seed layer 421a, or may be formed using different respective material(s) and/or process(es). The second seed layer 423a and/or the forming thereof may share any or all characteristics with any other seed layer and/or the forming thereof discussed herein (e.g., the second seed layer 123a of FIG. 1, etc.). The second seed layer 423a (or any seed layer discussed herein) may also be referred to herein as a conductive layer.

Continuing the example implementation, the second conductive layer 423 is formed on the second seed layer 423a. For example, the second conductive layer 423 may be formed to fill (or at least cover side surfaces of) the opening 422a in the second dielectric layer 422. The second conductive layer 423 may, for example, be formed using the same material(s) and/or processes as the first conductive layer 421, or may be formed using different respective material(s) and/or process(es). The second conductive layer 423 and/or the forming thereof may share any or all characteristics with any other conductive layer and/or the forming thereof discussed herein (e.g., the second conductive layer 123 of FIG. 1, etc.). The second conductive layer 423 may also be referred to herein as a redistribution layer.

The second conductive layer 423 may then, for example, be covered with the third dielectric layer 424. The third dielectric layer 424 may, for example, be formed utilizing the same material(s) and/or process(es) as utilized to form the second dielectric layer 422, or may be formed utilizing different respective material(s) and/or process(es). The third dielectric layer 424 and/or the forming thereof may share any or all characteristics with any other dielectric layer and/or the forming thereof discussed herein (e.g., the third dielectric layer 124 of FIG. 1, etc.).

An opening 424a (or aperture) may, for example, be formed in the third dielectric layer 424, and a specific area of the second conductive layer 423 may be exposed to the outside through the opening 424a. The opening 424a may be formed in any of a variety of manners (e.g., mechanical and/or laser ablation, chemical etching, etc.). Alternatively, for example, the third dielectric layer 124 may be originally formed with the opening 124a therein. The opening 424a and/or the forming thereof may share any or all characteristics with any opening and/or the forming thereof discussed herein (e.g., the opening 124a of FIG. 1, etc.).

An under bump seed layer 425a (see, e.g., FIG. 14) may, for example, be formed at the inside of the opening 424a (e.g., on side walls of the opening 424a formed in the third dielectric layer 424 and/or on the second conductive layer 423 exposed by the opening 424a) and/or outside of the opening 424a (e.g., on the top surface of the third dielectric layer 424, for example around and/or encircling the opening 424a). As discussed herein, the under bump seed layer 425a may be formed using the same material(s) and/or process(es) as used to form the first seed layer 421a and/or the second seed layer 423a, or may be formed using different respective material(s) and/or process(es). The under bump seed layer 425a and/or the forming thereof may share any or all characteristics with other under bump seed layers and/or the forming thereof discussed herein (e.g., the under bump seed layer 125a of FIG. 1, etc.). The under bump seed layer 425a (or any seed layer discussed herein) may also be referred to herein as a conductive layer.

An under bump metal 425 is formed on the under bump seed layer 425a. The under bump metal 425 may be formed of any of a variety of materials, non-limiting examples of which are presented herein. For example, the under bump metal 425 may be formed of at least one of chrome, nickel, palladium, gold, silver, alloys thereof, combination thereof, equivalents thereof, etc. The under bump metal 125 may, for example, comprise Ni and Au. Then under bump metal 125 may also, for example, comprise Cu, Ni, and Au. The under bump metal 425 may be also formed utilizing any of a variety of processes, non-limiting example of which are presented herein. For example, the under bump metal 425 may be formed utilizing one or more of an electroless plating process, electroplating process, sputtering process, etc. The under bump metal 425 may, for example, prevent or inhibit the formation of an intermetallic compound at the interface between the conductive interconnection structure 460 and the second conductive layer 423, thereby improving the reliability of the connection to the conductive interconnection structure 460. The under bump metal 425 and/or the forming thereof may share any or all characteristics with other under bump metals and/or the forming thereof discussed herein (e.g., the under bump metal 125 of FIG. 1, etc.). The under bump metal 425 may also be referred to herein as a conductive layer. Note that the under bump metal 125 may comprise multiple layers. For example, the under bump metal 125 may comprise a first layer of Ni and a second layer of Au.

Though not illustrated in FIGS. 13A-13J, following formation of the under bump metal 425, an edged trim (or profile) process may be performed, for example in which an edge of the wafer (or plate) being processed is trimmed (or profiled). Such trimming may be performed in a variety of manners, for example by grinding. Such edge trimming may, for example, protect the wafer from chipping and flaking during subsequent processing.

For discussion purposes herein, the first conductive layer 421, the second dielectric layer 422, the second conductive layer 423, and the third dielectric layer 424 may be considered to be component of an interposer 420. Furthermore, the under bump metal 425 and the micro bump pad 426 described herein may also be considered to be a component of the interposer 420. Note that term "interposer" is used herein to refer to a general package structure (e.g., a dielectric and conductor layered structure) that is interposed between other structures, and the scope of this disclosure should not be limited or defined by arbitrary notions regarding interposer composition.

Figure 13D:
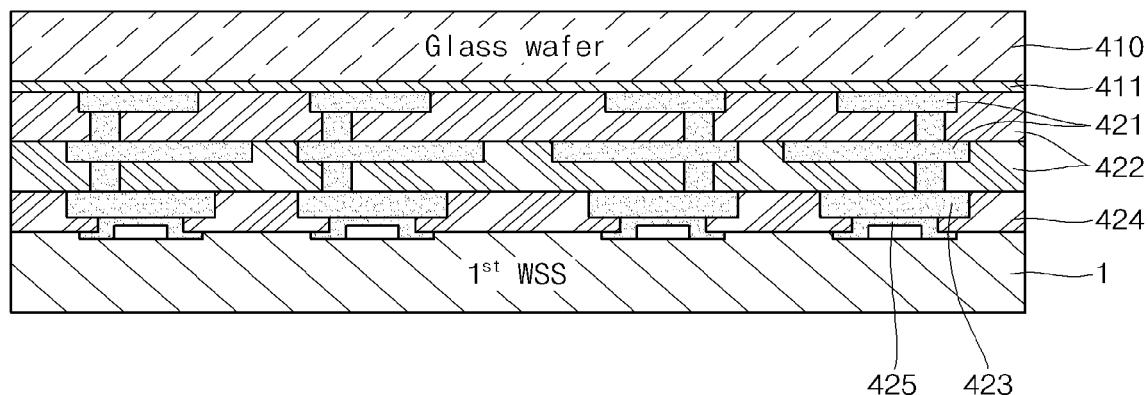

As shown in FIG. 13D, during the attaching of the first wafer support system 1 (WSS), the first wafer support system 1 is attached to the third dielectric layer 424. For example, the first wafer support system 1 may be attached to the third dielectric layer 424 and the under bump metal 425 and at this point, and the carrier 410 that is shown at the bottom of FIG. 13C is repositioned to the top of FIG. 14D (e.g., the diagram is inverted). The first WSS 1 may be attached to the third dielectric layer 424 and/or to the under bump metal 425 in any of a variety of manners, non-limiting examples of which are provided herein. For example, the first WSS 1 (or any WSS discussed herein) may be attached to the third dielectric layer 424 and/or to the under bump metal 425 utilizing a temporary adhesive that loses its adhesion when exposed to thermal energy or light energy, when exposed to particular chemicals, etc. One or more additional release layers may also be utilized to ease subsequent release of the first wafer support system 1. The attachment process may, for example, comprise baking the assembly (e.g., at 250° for 30 mins, etc.). The first wafer support system 1 may be formed from any of a variety of materials. For example, the first WSS 1 (or any WSS discussed herein) may be formed from one or more of a silicon wafer, a glass wafer, a ceramic wafer, a metal wafer, etc. Though the first WSS 1 is generally presented herein in the form of a wafer, the scope of this disclosure is not limited to such shape. The WSS 1 of FIG. 13D and/or the attachment or detachment thereof may share any or all characteristics with any WSS and/or the attachment or detachment thereof discussed herein (e.g., the WSS 1 of FIG. 1D, etc.).

Figure 13E:
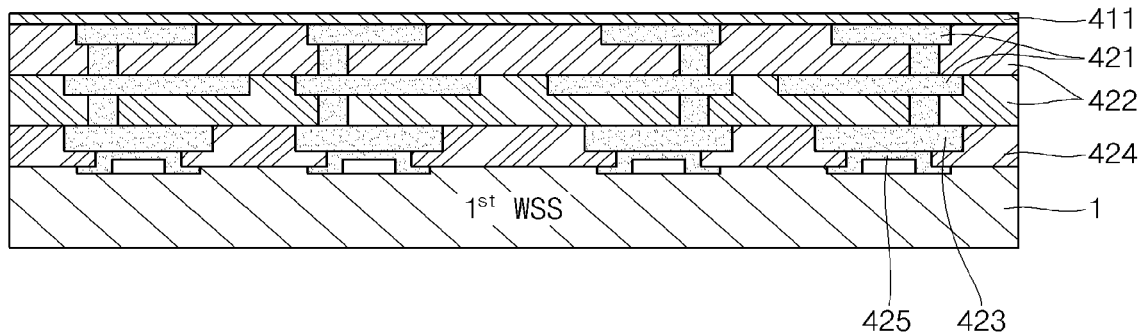

As shown in FIG. 13E, during the removing of the carrier 410, the carrier 410 (for example, a glass wafer on which the first dielectric layer 411 was formed) on a side of the structure opposite the first wafer support system 1 is removed. The first WSS 1 may be removed in any of a variety of manners, non-limiting examples of which are presented herein (e.g., with regard to any wafer support system discussed herein).

In an example implementation, as laser beam, thermal beam, or infrared beam is provided to the carrier 410, the carrier 410 may be separated from the first dielectric layer 411. For example, as light or thermal energy is provided to the interface of the carrier 410 and the first dielectric layer 411, an adhesion between the carrier 410 and the first dielectric layer 411 is reduced and accordingly, the carrier 410 is separated from the first dielectric layer 411.

In another example implementation, most of the carrier 410 may be removed through a mechanical grinding process and then, the remaining carrier 410 may be removed through a chemical etching process. In such a manner, as a result, only the first dielectric layer 411 (for example, a polyimide layer) formed on the surface of the carrier 410 remains. For example, as illustrated in FIG. 13E, only the first dielectric layer 411 of a predetermined thickness remains on the first conductive layer 421 and the second dielectric layer 422. Note that the carrier removal process may also remove a portion of the first dielectric layer 411; for example, the first dielectric layer 411 may be thinner after removal of the carrier 410 than when originally formed on the carrier 410. In an example implementation, as mentioned above, the first dielectric layer 411 may be formed of an organic material, and the second and third dielectric layers 422 and 424 may also be formed of an organic material. Note, however, that the scope of the present disclosure is not limited to such example types of materials.

Figure 13F:
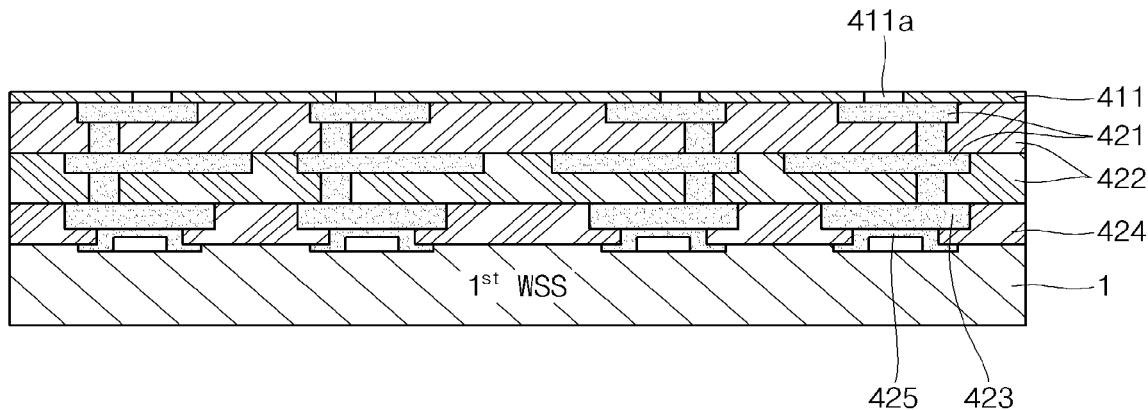

As shown in FIG. 13F, during the forming of the openings 411*a* (or apertures) in the first dielectric layer 411, a plurality of openings 411*a* are selectively formed in the first dielectric layer 411. The openings 411*a* may be formed in any of a variety of manners (e.g., mechanical and/or laser ablation, chemical etching, photo etching process, photo-masking and etching process, etc.). Each of the openings 411*a* may, for example, correspond to a respective specific area of the first conductive layer 421, exposed to the outside by the opening 411*a*. In an example implementation, an opening 411*a* exposes a respective specific area of the first conductive layer 421 to the outside through the organic first dielectric layer 411. In an example implementation in which the first conductive layer 421 was formed on a first seed layer 421*a*, a specific area of the first seed layer 421*a* on which the first conductive layer 421 was formed is exposed to the outside through the organic first dielectric layer 411. The openings 411*a* and/or the forming thereof may share any or all characteristics with any other opening and/or the forming thereof discussed herein (e.g., the opening 111*a* of FIG. 1, etc.). Note that in an example scenario in which a dielectric layer (or passivation layer) mask is utilized during a process of etching the openings 411*a*, the dielectric layer may be stripped after such etching, but may also remain (e.g., as a passivation layer, etc.).

Figure 13G:
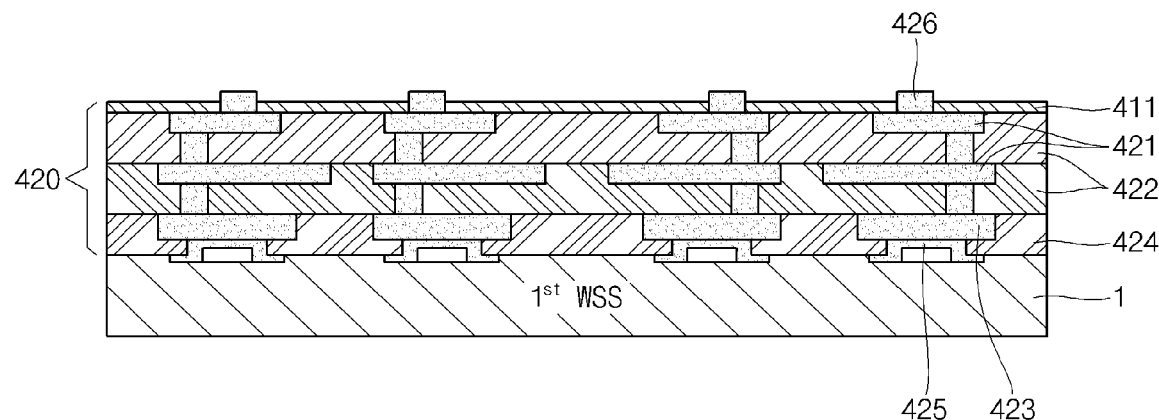
Figure 14:
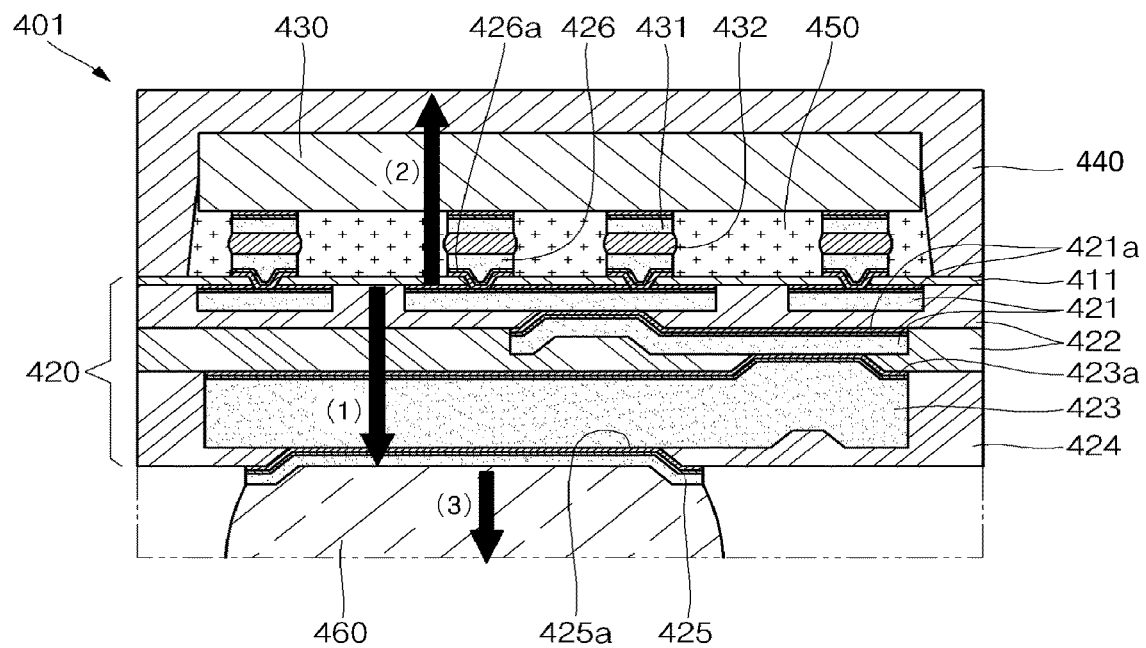
FIG. 14 shows a cross-sectional view illustrating a semiconductor device, in accordance with various aspects of the present disclosure.

As shown in FIG. 13G, during the forming of the micro bump pad 426 (or other pad, landing, attachment structure, etc.) in the opening 411*a*, the micro bump pad 426 is formed in the opening 411*a* so that the micro bump pad 426 is electrically connected to the first conductive layer 421 (e.g., directly connected, connected via a seed layer, etc.). In an example implementation, the micro bump seed layer 426*a* (e.g., as shown in FIG. 14) is formed at the inside of the opening 411*a* (e.g., on side walls of the opening 411*a* formed in the first dielectric layer 411 and/or on the first conductive layer 421) and/or outside of the opening 411*a* (e.g., on the top surface (in FIG. 13G) of the first dielectric layer 411 surrounding the opening 411*a*). The micro bump seed layer 426*a* may, for example, be formed utilizing the same material(s) and/or process(es) discussed herein with regard to other seed layers or conductive layers, or may be formed utilizing different respective material(s) and/or process(es). The micro bump seed layer 426*a* and/or the forming thereof may, for example, share any or all characteristics with any other micro bump seed layer and/or the forming thereof discussed herein (e.g., the micro bump seed layer 126*a* of FIG. 1, etc.).

The micro bump pad 426 may then, for example, be formed on the micro bump seed layer 426*a*. In an example implementation, the first seed layer 421*a* (e.g., on which the first conductive layer 421 was formed) and the micro bump seed layer 426*a* (e.g., on which the micro bump pad 426 is formed) may be interposed between the first conductive layer 421 and the micro bump pad 426. For example, the first seed layer 421*a* and the micro bump seed layer 426*a* may be directly connected to each other, mutually facing each other. Note that in various example implementations, the micro bump seed layer 426*a* might be skipped, and the micro bump pad 426 formed on the first seed layer 421*a* exposed through the opening 411*a* (e.g., in an example implementation in which the first seed layer 421*a* is adequately formed to be utilized in such manner). The micro bump seed layer 426*a* and/or micro bump pad 426 may also be referred to herein as a conductive layer.

The micro bump pad 426 may comprise any of a variety of materials, non-limiting examples of which are provided herein. For example, the micro bump pad 426 may comprise copper, aluminum, gold, silver, palladium, general conductive material, conductive material, equivalents thereof, combinations thereof, alloys thereof, any conductive material discussed herein, etc. In an example implementation, the micro bump pad 126 may comprise Ni and Au. In another example implementation, the micro bump pad 126 may comprise Ni, Au, and Cu. The micro bump pad 426 may be formed utilizing any of a variety of processes, non-limiting examples of which are provided herein. For example, the micro bump pad 426 may be formed utilizing one or more of an electroless plating process, an electrolytic plating process, a sputtering process, etc.

The micro bump pad 426 is shown in FIG. 13G as extending past (or protruding from) the top surface of the first dielectric layer 411, but the scope of this disclosure is not limited thereto. For example, the micro bump pad 426 may comprise a top surface that is coplanar with the top surface of the first dielectric layer 411, or may comprise a top surface that is below the top surface of the first dielectric layer 411. Though generally shown comprising a cylindrical shape, the micro bump pad 426 of FIG. 13G may comprise any of a variety of geometric configurations, various non-limiting examples of which are provided herein. The micro bump pad 426 and/or the forming thereof may, for example, share any or all characteristics with any other micro bump pad and/or the forming thereof discussed herein (e.g., the micro bump pad 126 of FIG. 1, etc.).

Also note that the micro bump pad 426 may alternatively be formed in an aperture in the first dielectric layer 411 near the beginning of the overall process shown in FIGS. 13A-13J. For example, between FIGS. 13A and 13B, an aperture may be formed in the first dielectric layer 411 (if such layer exists) and the micro bump pad 426 may be formed on the carrier 410 in such aperture before formation of the first conductive layer 421 thereon.

Figure 13H:
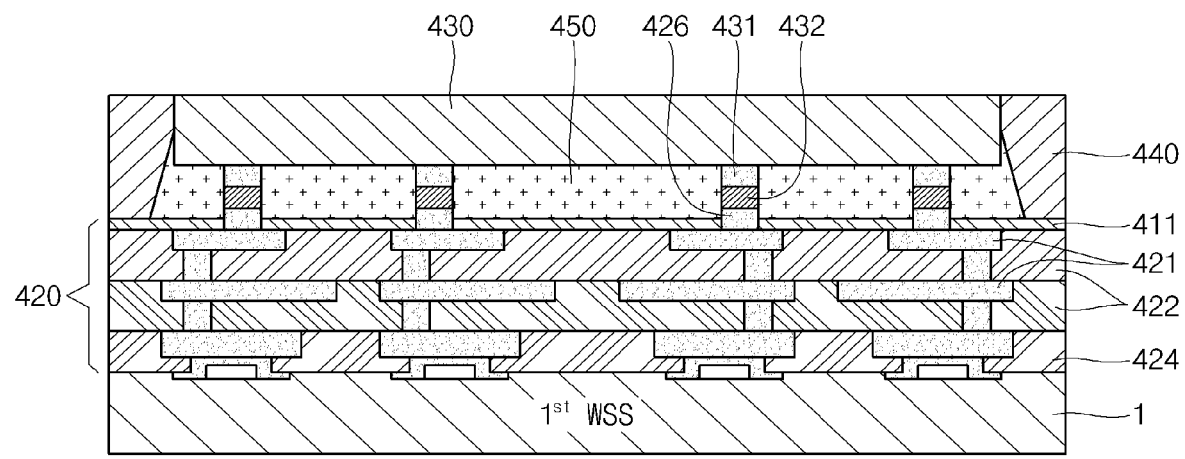

As shown in FIG. 13H, during the attaching of the semiconductor die 430 and the molding with the mold material 440, the semiconductor die 430 is electrically connected to the micro bump pad 426 and is molded with the mold material 440. For example, the conductive bump 431 (or other conductive attachment structure, for example conductive pillar, etc.) of the semiconductor die 430 is electrically connected to the micro bump pad 426 through the solder 432. The conductive bump 431 of the semiconductor die 430 may be attached to the micro bump pad 426 in any of a variety of manners, non-limiting examples of which are presented herein. For example, the conductive bump 431 may be soldered to the micro bump pad 426 utilizing any of a variety of solder attachment processes (e.g., a mass reflow process, a thermal compression process, a laser soldering process, etc.). Also for example, the conductive bump 431 may be coupled to the micro bump pad 426 utilizing a conductive adhesive, paste, etc. In an example scenario, a solder paste may be applied to the micro bump pad 126 utilizing a stencil and squeegee, the conductive bump 131 of the semiconductor die 130 may be positioned on or in the solder paste (e.g., utilizing a pick-and-place process), and the solder paste may then be reflowed. After attachment of the semiconductor die 130, the assembly may be cleaned (e.g., with hot DI water, etc.), subjected to a flux clean and bake process, subjected to a plasma treatment process, etc.

In an example implementation, an underfill 450 may be formed between the semiconductor die 430 and the first dielectric layer 411, for example surrounding portions of the bumps 431 and micro bump pads 426 that are exposed to (and thus encapsulated by) the underfill 450. The underfill 450 may comprise any of a variety of underfill materials. Also the underfill 450 may be formed utilizing any of a variety of processes (e.g., a capillary underfilling process, utilizing a pre-applied underfill material, etc.). The under fill 450 between the semiconductor die 430 and the interposer 420 (as various layers are illustratively grouped in FIG. 13H) may, for example, prevent or reduce warpage, for example due to a thermal expansion coefficient difference between the semiconductor die 430 and the interposer 420.

In the molding (or encapsulating) process, the semiconductor die 130 and/or interposer 120 may be encapsulated with a mold material 140 (e.g., a molding resin or other mold material or encapsulant), which may then be cured. In an example implementation, the mold material 440 covers the side surfaces and top surface of the semiconductor die 430. In another example implementation, the mold material 440 only covers the side surfaces of the semiconductor die 430 (or only respective portions thereof), thus leaving the top surface of the semiconductor die 430 exposed from the mold material 140. The mold material 440 may be formed in any of a variety of manners (e.g., compression molding, transfer molding, flood molding, etc.). The mold material 440 may comprise any of a variety of types of mold material. For example, the mold material 440 may comprise a resin, an epoxy, a thermosetting epoxy molding compound, a room temperature curing type, etc.

When the size of a filler (e.g., an organic filler or other particle component) of the mold material 440 is smaller (or substantially smaller) than the size of a space or a gap between the interposer 420 and the semiconductor die 430, the underfill 450 might not be utilized, and the mold material 440 may instead fill a space or gap between the interposer 420 and the semiconductor die 430. In such an example scenario, the underfilling process and the molding process may be combined into a single molding process with a molded underfill. The mold material 440 and/or the forming thereof may, for example, share any or all characteristics with any mold material and/or the forming thereof discussed herein (e.g., the mold material 140 of FIG. 1, etc.).

The semiconductor die 430, for example, may comprise any of a variety of types of semiconductor die, non-limiting examples of which are provided herein. For example, the semiconductor die 130 may comprise a digital signal processor (DSP), a microcontroller, a microprocessor, a network processor, a power management processor, an audio processor, a video processor, an RF circuit, a wireless baseband system-on-chip (SoC) processor, a sensor, an application specific integrated circuit, etc.

Figure 13I:
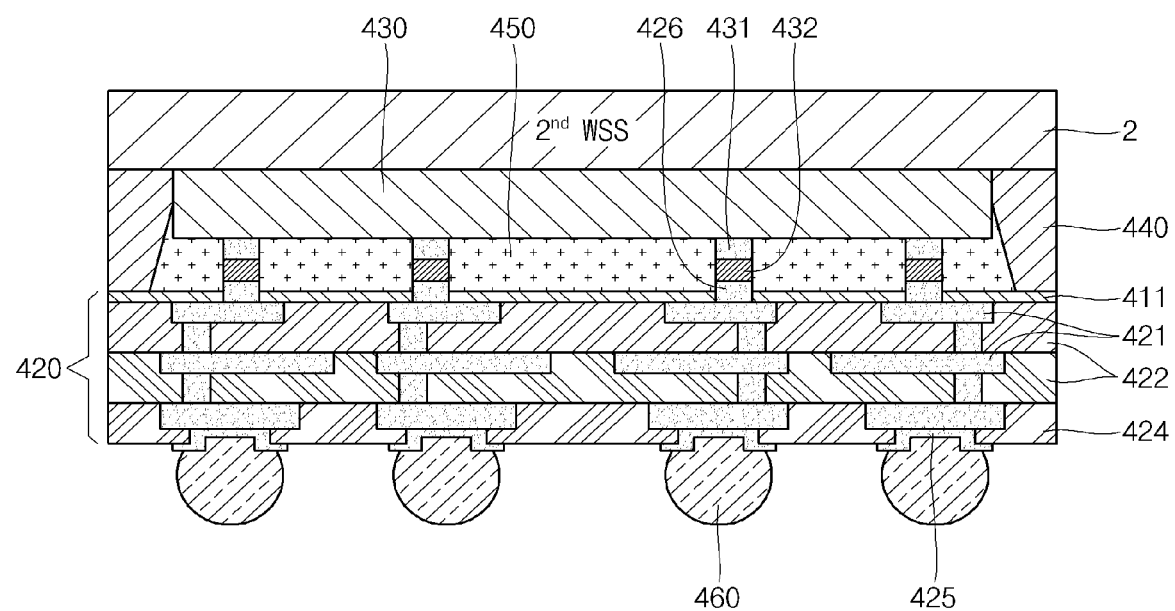

As shown in FIG. 13I, during the attaching of the second wafer support system 2, the separating of the first wafer support system 1, and the attaching of the conductive interconnection structure 460, the second WSS 2 may be attached to the semiconductor die 430 and/or mold material 440. For example, the second WSS 2 may share any or all characteristics with the first WSS 1. The second WSS 2 may, for example, be attached in a same manner as the first WSS 1 (e.g., utilizing a temporary adhesive, vacuum, mechanical attachment mechanism, etc.).

After attachment of the second WSS 2, the first wafer support system 1 attached to the third dielectric layer 424 is separated from the third dielectric layer 424 and/or under bump metal 425. As discussed herein, the first WSS 1 may have been attached to the third dielectric layer 424 and/or to the under bump metal 425 utilizing a temporary adhesive that loses it adhesion (or a substantial portion thereof) when exposed to thermal energy, laser energy, chemical agents, etc. The separation of the first WSS 1 from the third dielectric layer 424 and/or under bump metal 425 may, for example, be performed by exposing the temporary adhesive to the energy and/or chemicals that cause the adhesive to loosen. In an example scenario in which a release layer was utilized to attach a glass first WSS 1, the release layer (e.g., between the adhesive and the first WSS 1) may be subjected to laser irradiation through the glass first WSS 1, to effect or assist with the release of the first WSS 1 from the adhesive. Note that other forms of WSS attachment/detachment may be utilized (e.g., vacuum attachment, mechanical attachment, etc.). Adhesive utilized to attach the first WSS 1 may, for example, be removed with a solvent if necessary.

The conductive interconnection structure 460 (or a plurality thereof) may be electrically connected to the exposed under bump metal 425. At this point, for example while the second wafer support system 2 is attached to the semiconductor die 430 and the mold material 440, the conductive interconnection structure 460 may be electrically connected to the under bump metal 425.

The conductive interconnection structure 460 may comprise any of a variety of characteristics, non-limiting examples of which are presented herein. For example, the conductive interconnection structure 460 may be formed of one of a eutectic solder (Sn37Pb), a high lead solder (Sn95Pb), a lead-free solder (SnAg, SnAu, SnCu, SnZn, SnZnBi, SnAgCu, and SnAgBi), combination thereof, equivalents thereof, etc. The conductive interconnection structure 460 (and/or any conductive interconnection structure discussed herein) may, for example, comprise a conductive ball (e.g., a solder ball, a copper-core solder ball, etc.), a conductive bump, a conductive pillar or post (e.g., a copper pillar, a solder-capped copper pillar, a wire, etc.), etc.

The conductive interconnection structure 460 may, for example, be connected to the under bump metal 425 utilizing any of a variety of reflow and/or plating processes. For example, volatile flux may be deposited (e.g., dotted, printed, etc.) on the under bump metal 425, the conductive interconnection structure 460 may be deposited (e.g., dropped, etc.) on the volatile flux, and then a reflow temperature of about 150° C. to about 250° C. may be provided. At this point, the volatile flux may, for example, be volatized and completely removed.

The conductive interconnection structure 460, as mentioned above, may be referred to as a conductive bump, a conductive ball, a conductive pillar, a conductive pose, a conductive wire, etc., and may, for example, be mounted on a rigid printed circuit board, a flexible printed circuit board, a lead frame, etc. For example, the semiconductor die 430 including the interposer 420 may then be electrically connected (e.g., in a flip-chip form or similar to a flip-chip form) to any of a variety of substrates (e.g., motherboard substrates, packaging substrates, lead frame substrates, etc.).

Figure 13J:
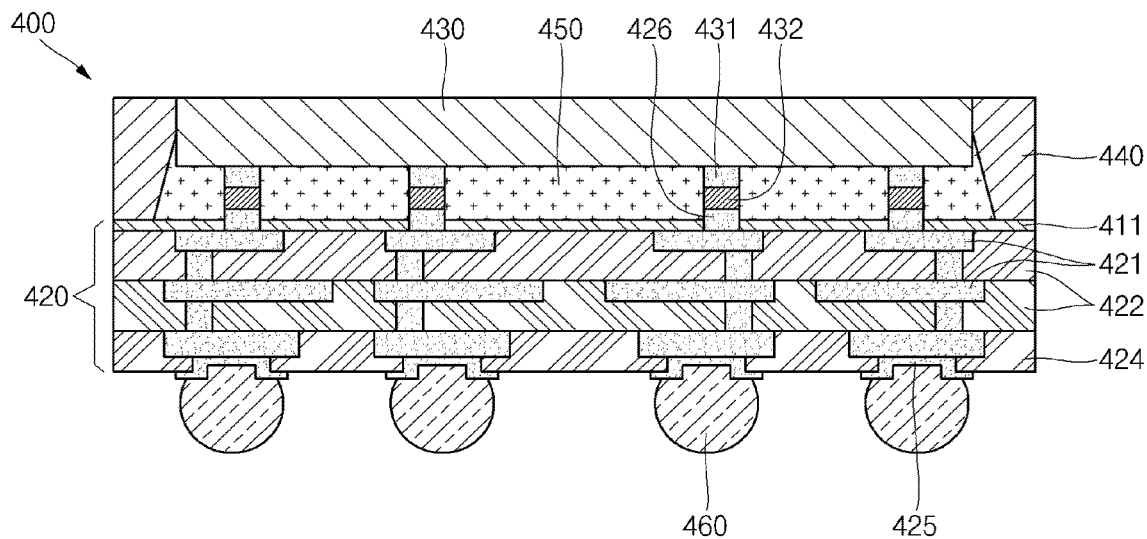

As shown in FIG. 13J, during the separating of the second wafer support system 2, the second wafer support system 2 attached to the semiconductor die 430 and/or the mold material 440 is separated from the semiconductor die 430 and/or mode material 440. For example, in the completed semiconductor device 400, the top surface of the semiconductor die 430 may be exposed to the outside through the top surface of the mold material 440. For example, the top surface of the semiconductor die 430 and the top surface of the mold material 440 may be coplanar. In another example implementation, the mold material 440 may cover the top surface of the semiconductor die 430.

The interposer 420 (or package or device 400) may, for example, be formed in a mass configuration (e.g., in a wafer, panel, strip, matrix, etc.) or as a single unit. In a scenario in which the interposer 120 (or package or device 400) is formed in a mass configuration, after the separating of the second wafer support system 2 (or before such separation), the interposer 420 and the mold material 440 may be singulated or cut (e.g., are by a diamond blade or laser beam, snap-separated, pull-separated, etc.). In such a scenario, the side surfaces of the interposer 420 and the mold material 440 may be made coplanar by such a singulation process. In an example scenario, a plurality of the packages or devices 400 may be placed (e.g., mold side down) on a saw tape, and then sawed. The saw may, for example, cut through the packages or devices 400 and partially through the saw tape. After sawing, the packages or devices 400 may be baked. After singulation, the individual packages or devices 400 may be individually inserted into trays (e.g., utilizing a pick and place process)

In accordance with the example illustrated provided in FIG. 1 and discussed herein, the present disclosure provides a semiconductor device 400 (and manufacturing method thereof) comprising the interposer 420, for example without a through silicon via. Such a semiconductor device 400 may, for example, be manufactured utilizing general bumping equipment, for example without utilizing complex and expensive through silicon via production processes. For example, according to various aspects of the present disclosure, as a conductive layer with a relatively fine line/space/thickness may be formed first on the carrier 410 (for example, a glass wafer), and then such carrier 410 may be removed.

Referring to FIG. 14, such figure shows a cross-sectional view of a semiconductor device 401, in accordance with various aspects of the present disclosure. For illustrative clarity, only one conductive interconnection structure 160 is shown.

As shown in FIG. 14, the example semiconductor device 401 may comprise an interposer 420, a semiconductor die 430, a mold material 440, an underfill 450, and a conductive interconnection structure 460. The semiconductor device 401 may, for example, share any or all aspects with any or all other semiconductor devices presented herein (e.g., the example semiconductor device 400 shown in FIGS. 13A-13J, any of the semiconductor devices shown in FIGS. 1-6, FIGS. 7-8, and FIGS. 9-12, etc.).

The interposer 420, or general grouping of layers, may for example comprise a first seed layer 421a below a first dielectric layer 411 (for example, a polyimide layer), a first conductive layer 421 below the first seed layer 421a, a second dielectric layer 422 covering the first conductive layer 421 (or portions thereof), a second seed layer 423a below the first conductive layer 421, a second conductive layer 423 below the second seed layer 423a, and a third dielectric layer 424 covering the second conductive layer 423 (or portions thereof). The line/space/thickness of the first conductive layer 421 may, for example, be smaller than that of the second conductive layer 423.

The interposer 420 may, for example, comprise a micro bump seed layer 426a extending into and/or through the first dielectric layer 411 (e.g., through an opening formed therein) and on the first seed layer 421a, a micro bump pad 426 on the micro bump seed layer 426a, an under bump seed layer 125a below the second conductive layer 423, and an under bump metal 425 below the under bump seed layer 425a. In an example implementation, the first seed layer 421a and the micro bump seed layer 426a are directly and electrically connected to each other.

As discussed herein, the term "interposer" may be utilized herein to conveniently group various layers for discussion. It should be understood, however, that an interposer or interposer structure may comprise any of a variety of the layers discussed herein, and is not limited to any particular set of layers.

The conductive bump 431 is on the semiconductor die 430 and the conductive bump 431 is electrically connected to the micro bump pad 426 through the solder 432. The underfill 450 is between the semiconductor die 430 and the interposer 420 (e.g., the first dielectric layer 411), and the mold material 440 surrounds side surfaces of the semiconductor die 430 and the underfill 450. In the illustrated example, as opposed to the example device 400 shown in FIG. 13J, the mold material 440 surrounds the side surfaces of the semiconductor die 430 and also the top surface thereof. The conductive interconnection structure 460 may, for example, be connected to the under bump metal 425 and may also be mounted on a substrate as discussed herein.

Labels (1), (2), and (3) shown in FIG. 14 may, for example, show a lamination and/or formation order. For example, in relation to the semiconductor device 401, in accordance with various aspects of the present disclosure, the interposer 420 is formed in the direction (1) (e.g., building from the first dielectric layer 411), and then, the semiconductor die 430 is connected to the interposer 420 in the direction (2) (e.g., building from the interposer 420), and then, the conductive interconnection structure 460 is attached to the interposer 120 in the direction (3) (e.g., building from the interposer 120).

In comparison to the semiconductor device 400 discussed with regard to FIG. 13A-13J, the example semiconductor device 401 comprises a pad 426 (e.g., a micro bump pad) that is wider at a top end (e.g., to be connected with a conductive bump 431 of the semiconductor die 430) than at a bottom end (e.g., extending through the first dielectric layer 411). For example, rather than being cylindrically shaped as shown in the micro bump pad 426 of FIGS. 13G-13J, the micro bump pad 426 may be cup-shaped or mushroom-shaped (e.g., with sloped stem sidewalls or alternatively vertical stem sidewalls). The micro bump pad 426 is also illustrated with vertical cap sidewalls.

Referring to FIGS. 15A to 15H, such figures show cross-sectional views illustrating a method of manufacturing a semiconductor device 500, in accordance with various aspects of the present disclosure. The example semiconductor devices and/or methods illustrated in FIGS. 15A to 15H may, for example, share any or all characteristics with any or all of the other example semiconductor devices and/or methods presented herein (e.g., with regard to FIGS. 7A to 7H, for example substituting a glass, ceramic, metal, or other type of carrier for the illustrated silicon carrier 210, or any other figure).

The example method of manufacturing the semiconductor device 500 may, for example, comprise providing a carrier 510 with a first dielectric layer 511, forming a first conductive layer 521, attaching a semiconductor die 530 and molding with a mold material 540, attaching a wafer support system 1 and removing the carrier 510, forming an opening 511a through the first dielectric layer 511, forming a second conductive layer 525 and an under bump metal 527, attaching a conductive interconnection structure 560, and separating the wafer support system 1.

Figure 15A:
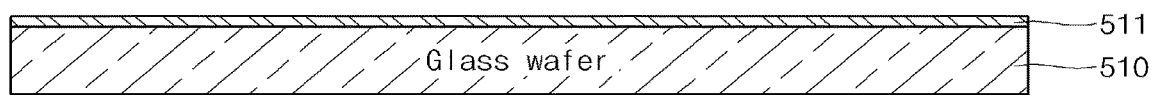
FIGS. 15A to 15H show cross-sectional views illustrating a method of manufacturing a semiconductor device, in accordance with various aspects of the present disclosure.

As shown in FIG. 15A, during the providing of the carrier 510 with the first dielectric layer 511, the carrier 510, such as, for example, a glass, porous ceramic, metal, etc. (e.g., with a planar top surface and a planar bottom surface) is provided. The carrier 510 and/or the providing or forming thereof may, for example, share any or all characteristics with any carrier and/or the providing or forming thereof discussed herein (e.g., the carrier 210 of FIGS. 7A-7H, etc.).

A first dielectric layer 511 (e.g., formed of polyimide, Benzo Cyclo Butene, Poly Benz Oxazole, etc.) may be formed on the surface of the carrier 511 through a coating process. The first dielectric layer 511 and/or the providing or forming thereof may, for example, share any or all characteristics with any dielectric layer and/or the forming thereof discussed herein (e.g., the first dielectric layer 411 of FIGS. 13-14, etc.).

Figure 15B:
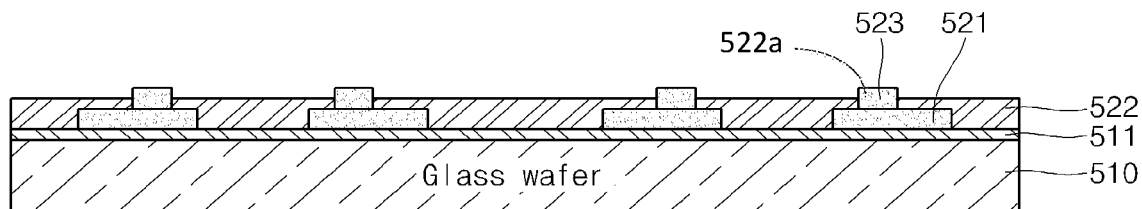

As shown in FIG. 15B, during the forming of the first conductive layer 521, which may also be referred to as a redistribution layer, the first conductive layer 521 may be formed on the first dielectric layer 511. The first conductive layer 521 and/or the forming thereof may, for example, share any or all characteristics with any other conductive layer and/or the forming thereof discussed herein (e.g., with regard to FIGS. 7-8, etc.). In one example implementation, a first seed layer 521a (see, e.g., FIG. 17) is formed on the first dielectric layer 511, and the first conductive layer 521 is formed on the first seed layer 521a.

The first conductive layer 521 may then be covered with a second dielectric layer 522. The second dielectric layer 522, and/or the forming thereof may, for example, share any or all characteristics with any other dielectric layer and/or the forming thereof discussed herein (e.g., with regard to FIGS. 7-8, etc.).

The forming of the first conductive layer 521 (e.g., with or without a seed layer 521a) and the second dielectric layer 522 may be repeated any number of times (e.g., utilizing the same materials and/or processes or different respective materials and/or processes).

Additionally, an opening 522a (or aperture) may be formed in the second dielectric layer 522 corresponding to the first conductive layer 521 (or a portion thereof). The opening 522a and/or the forming thereof may share any or all characteristics with other openings and/or the forming thereof discussed herein. For example, the opening 522a may share any or all characteristics with the opening 222a discussed herein (e.g., with regard to FIGS. 7-8, etc.).

A micro bump pad 523 or other pad, landing, or attachment structure) may, for example formed in the opening 522a. The micro bump pad 523 and/or the forming thereof may, for example, share any or all characteristics with other pads discussed herein (e.g., the micro bump pad 226 of FIGS. 7-8, etc.). For example, a micro bump seed layer 523a may be formed on (e.g., directly on) the first conductive layer 521 exposed through the opening 522a, and the micro bump pad 523 may be formed on the micro bump seed layer 523a. The micro bump seed layer 523a and/or micro bump pad 523 may also be referred to herein as conductive layers.

Figure 15C:
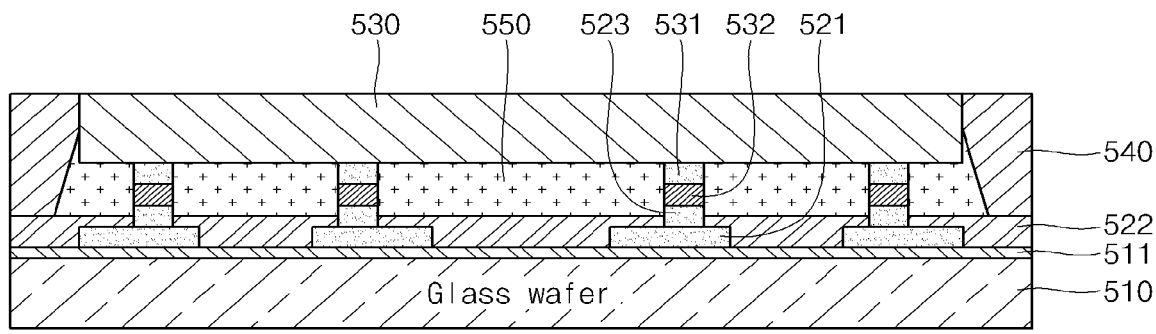

As shown in FIG. 15C, during the attaching of the semiconductor die 530 and the molding with the mold material 540, the semiconductor die 530 is electrically connected to the micro bump pad 523 and is molded with the mold material 540. The semiconductor die 530 and/or the attaching thereof may share any or all characteristics with other semiconductor dies and/or the attaching thereof discussed herein (e.g., the semiconductor die 430 and/or the attaching thereof discussed herein with regard to FIGS. 7-8, etc.).

For example, the conductive bump 531 (or other conductive attachment structure) of the semiconductor die 530 is electrically connected to the micro bump pad 523 through the solder 542. The conductive bump 531 of the semiconductor die 530 may be attached to the micro bump pad 523 (or other pad or landing structure) in any of a variety of manners, non-limiting examples of which are presented herein. For example, the conductive bump 531 may be soldered to the micro bump pad 523 utilizing any of a variety of solder attachment processes (e.g., a mass reflow process, a thermal compression process, etc.). Also for example, the conductive bump 531 may be coupled to the micro bump pad 523 utilizing a conductive adhesive, paste, etc.

In an example implementation, an underfill 550 may be formed between the semiconductor die 530 and the interposer 520 (e.g., the second dielectric layer 522), for example, surrounding portions of the conductive bumps 531 and micro bump pads 523 that are exposed to the underfill 550. The underfill 550 and/or the formation thereof, may share any or all characteristics with other underfills and/or the formation thereof discussed herein (e.g., the underfill 450 discussed herein with regard to FIGS. 7-8, etc.). The underfill 550 may comprise any of a variety of underfill materials. Also the underfill 550 may be formed utilizing any of a variety of processes (e.g., a capillary underfilling process, utilizing a pre-applied underfill material, etc.). The under fill 550 between the semiconductor die 230 and the interposer 520 (as various layers are illustratively grouped in FIG. 17) may, for example prevent or reduce warpage, for example due to thermal expansion coefficient difference between the semiconductor die 530 and the interposer 520.

In the molding process, the semiconductor die 530 and/or interposer 520 may be encapsulated with a mold material 540 (e.g., a molding resin or other mold material). The mold material 540 and/or the forming thereof may, for example, share any or all characteristics with other mold materials and/or the forming thereof discussed herein (e.g., the mold material 440 discussed herein with regard to FIGS. 7-8, etc.). In an example implementation, the mold material 540 covers the side surfaces and top surface of the semiconductor die 530. In another example implementation, the mold material 540 only covers the side surfaces of the semiconductor die 530 (or only respective portions thereof), thus leaving the top surface of the semiconductor die 530 exposed from the mold material 540. The mold material 540 may be formed in any of a variety of manners (e.g., compression molding, transfer molding, flood molding, etc.). The mold material 540 may comprise any of a variety of types of mold material. For example, the mold material 540 may comprise a resin, an epoxy, a thermosetting epoxy molding compound, a room temperature curing type, etc. As discussed herein, the mold material 540 may also be utilized to form a molded underfill, for example instead of the underfill 550.

Figure 15D:
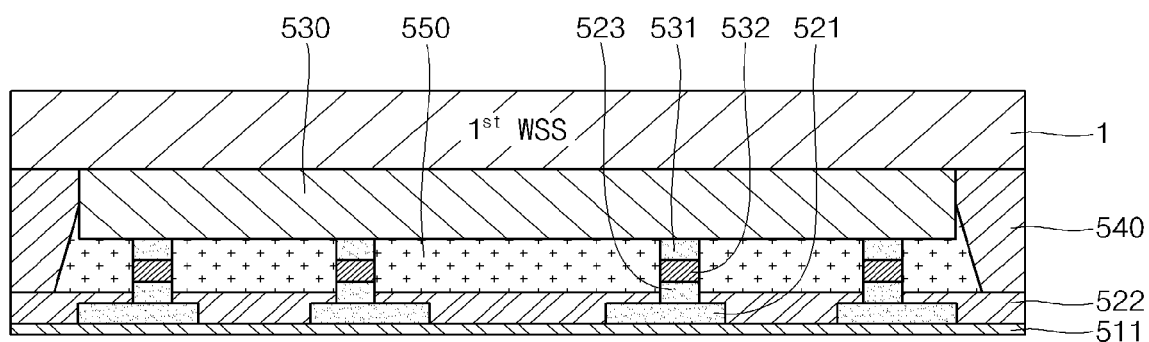

As shown in FIG. 15D, during the attaching of the wafer support system 1 and the removing of the carrier 510, the wafer support system 1 is attached to the top surfaces of the semiconductor die 530 and the mold material 540, and then the carrier 510 (for example, a glass wafer or panel) below the first dielectric layer 511 is removed. The wafer support system 1 and/or the attachment thereof may, for example, share any or all characteristics with other wafer support systems discussed herein (e.g., the example first wafer support system 1 of FIGS. 7-8, etc.).

The carrier 510 may be removed in any of a variety of manners, non-limiting examples of which are provided herein. For example, the carrier 510 may be removed in any manner discussed herein with regard to any of the other carriers discussed herein (e.g., with regard to the carrier 410 of FIG. 13, etc.). In an example implementation, as a laser beam, thermal beam, or infrared beam is provided to the carrier 510, the carrier 510 may be separated from the first dielectric layer 511. For example, in an example implementation, light or thermal energy may be provided to the interface of the carrier 510 and the first dielectric layer 511 to reduce or eliminate adhesion between the carrier 510 and the first dielectric layer 511, at which point the carrier 510 may be separated from the first dielectric layer 511. In another example implementation, most (or all) of the carrier 510 may be removed through a mechanical grinding process and then, the remaining carrier 510 (if any) may be removed through a chemical etching process.

In an example scenario in which the entirety of the carrier 510 is removed, only the first dielectric layer 511 (for example, a polyimide layer) originally formed or provided on the surface of the carrier 510 remains. For example, only the first dielectric layer 511 might remain on the bottom surfaces of the first conductive layer 521 and the second dielectric layer 522.

Figure 15E:
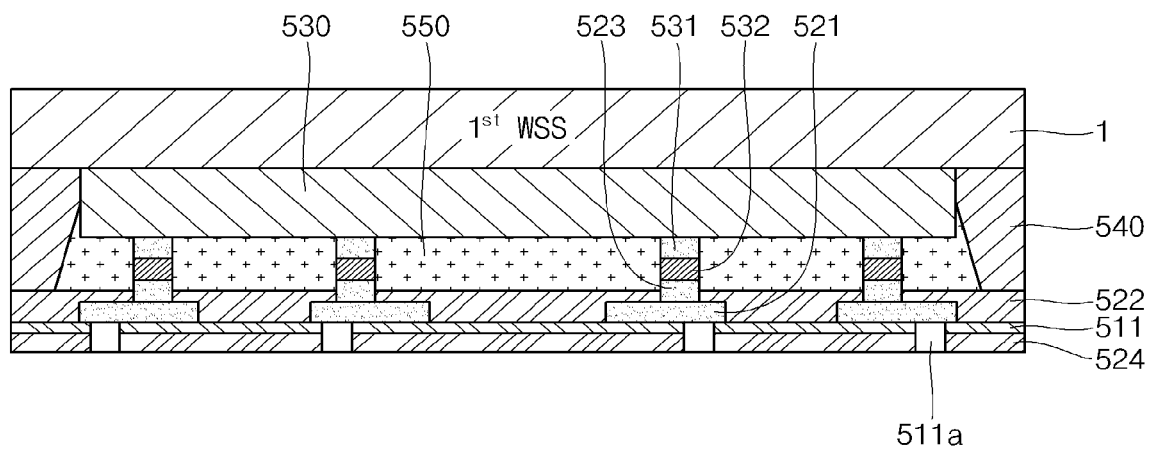

As shown in FIG. 15E, during the forming of the openings 511*a* (or apertures) in the first dielectric layer 511, a plurality of openings 511*a* are selectively formed in the first dielectric layer 511. The openings 511*a* and/or the forming thereof may, for example, share any or all characteristics with other openings and/or the forming thereof discussed herein (e.g., with regard to FIGS. 1-6, etc.). For example, the openings 511*a* may be formed in any of a variety of manners (e.g., mechanical and/or laser ablation, chemical etching, photo etching process, etc.). Each of the openings 511*a* may, for example, correspond to a respective specific area of the first conductive layer 521 exposed to the outside by the opening 511*a*. In an example implementation, an opening 511*a* exposes a respective specific area of the first conductive layer 521 to the outside through the organic first dielectric layer 511. In an example implementation in which the first conductive layer 521 was formed on a first seed layer 521*a*, a specific area of the first seed layer 521*a* on which the first conductive layer 521 was formed is exposed to the outside through the organic first dielectric layer 511.

The example illustration of FIG. 15E also shows a third dielectric layer 524 formed on (e.g., directly on) the first dielectric layer 511. Such a third dielectric layer 524 and/or the forming thereof may share any or all characteristics with the other dielectric layers or the forming thereof discussed herein (e.g., with regard to FIGS. 7-8, etc.). In an example scenario, the third dielectric layer 524 may comprise an organic layer, and the first dielectric layer 511 may also comprise an organic layer. In such an example implementation, the openings 511*a* may be formed through both the third dielectric layer 524 and the first dielectric layer 511 in a same forming process.

Figure 15F:
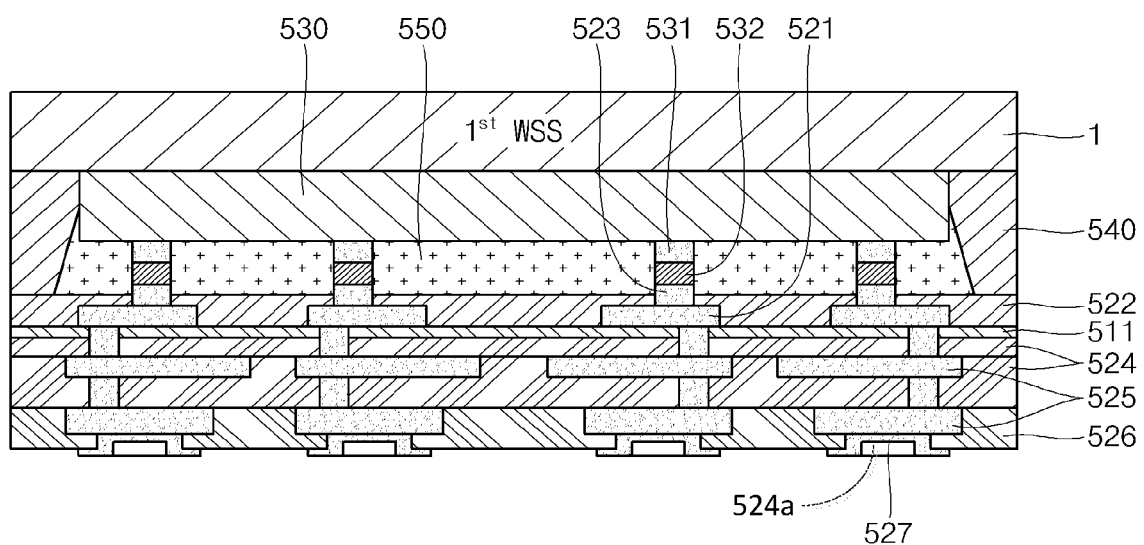

As shown in FIG. 15F, during the forming of the second conductive layer 525 and the under bump metal 527, the second conductive layer 525 and under bump metal 527 of at least one layer are formed below the first conductive layer 521 and/or below the third dielectric layer 524.

In one example implementation, a second seed layer 525*a* (see, e.g., FIG. 17) is formed at the inside of the opening 511*a* (e.g., on side walls of the opening 511*a* formed in the first 511 and/or third dielectric layers 524, and/or on the first conductive layer 521) and/or outside of the opening 511*a* (e.g., on the bottom surface of the third dielectric layer 524. The second seed layer 525*a* may also be referred to herein as a conductive layer. In an example implementation, the second seed layer 525*a* may be formed directly on the first seed layer 521*a*. In various example implementations, however, forming the second seed layer 525*a* may be skipped and the second conductive layer 525 formed on the first seed layer 521*a*.

Continuing the example implementation, the second conductive layer 525 is formed on the second seed layer 525*a*. For example, the second conductive layer 525 may be formed to fill (or at least cover side surfaces of) the opening 511*a* in the third dielectric layer 524 and/or in the first dielectric layer 511. The second conductive layer 525 may, for example, be formed using the same material(s) and/or processes as other conductive layers presented herein (e.g., the second conductive layer 225 of FIGS. 7-8), or may be formed using different respective material(s) and/or process(es). The second conductive layer 225 may also be referred to herein as a redistribution layer.

The second conductive layer 525 may then, for example, be covered with a fourth dielectric layer 526. The fourth dielectric layer 526 may, for example, be formed utilizing the same material(s) and/or process(es) as utilized to form the first 511, second 522, and/or third 524 dielectric layers, or may be formed utilizing different respective material(s) and/or process(es).

Figure 15G:
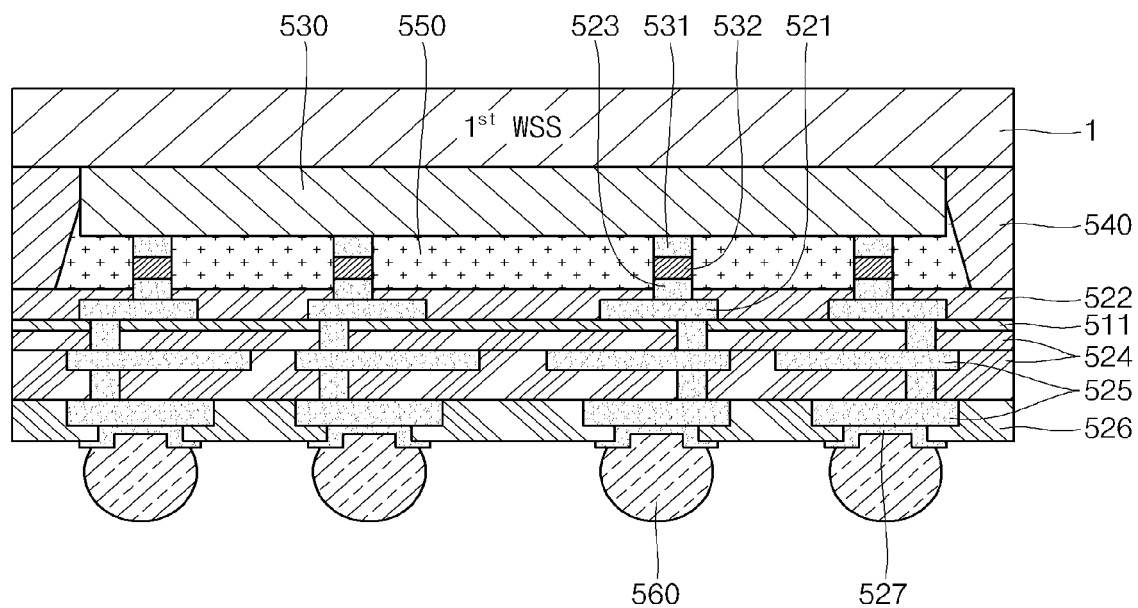
Figure 15H:
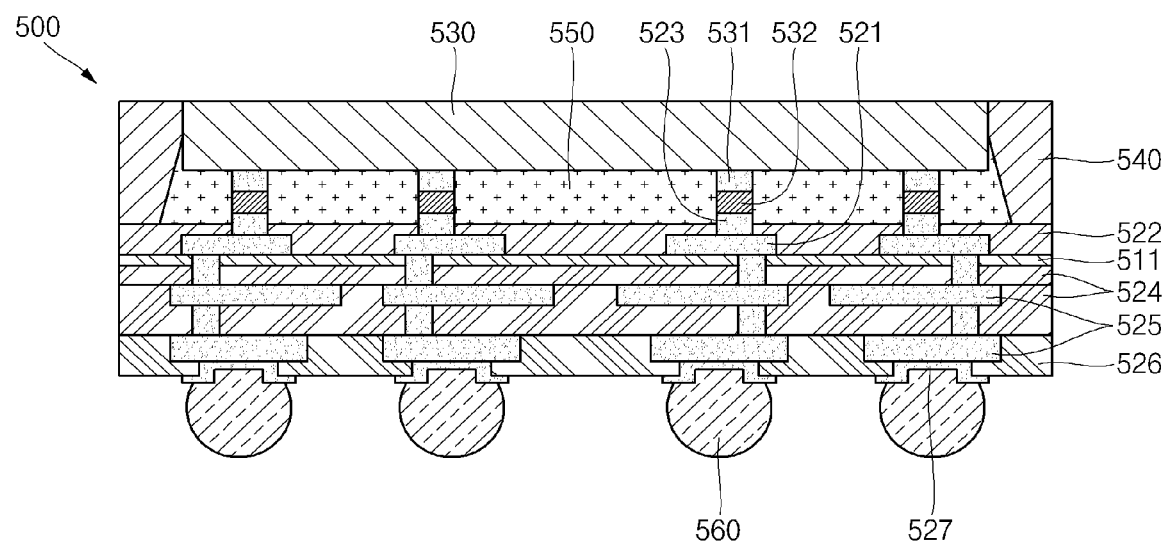

Formation of the third dielectric layer 524 and the second conductive layer 525 (e.g., with or without a seed layer 525a) may be repeated any number of times (e.g., utilizing the same materials and/or processes or different respective materials and/or processes). The example illustrations in FIGS. 15F-15H show two formations of such layers. As such, the layers are provided with similar labels in the figures (e.g., repeating the third dielectric layer 524 and the second conductive layer 525).

An opening 524a (or aperture) may, for example, be formed in the fourth dielectric layer 526, and a specific area of the second conductive layer 525 may be exposed to the outside through the opening 524a. As with all openings discussed herein, the opening 524a may be formed in any of a variety of manners (e.g., mechanical and/or laser ablation, chemical etching, masking during formation of the dielectric layer, etc.).

An under bump seed layer 527a (see, e.g., FIG. 17) may, for example, be formed at the inside of the opening 524a (e.g., on side walls of the opening 524a formed in the fourth dielectric layer 526 and/or on the second conductive layer 525 exposed by the opening 524a) and/or outside of the opening 524a (e.g., on the bottom surface of the fourth dielectric layer 526, for example around and/or encircling the opening 524a). As discussed herein, the under bump seed layer 527a may be formed using the same material(s) and/or process(es) as used to form any of the seed layers discussed herein (e.g., the under bump seed layer 227a of FIGS. 7-8, etc.), or may be formed using different respective material(s) and/or process(es). The under bump seed layer 527a may also be referred to herein as a conductive layer.

An under bump metal 527 is formed on the under bump seed layer 527a. The under bump metal 527 and/or the forming thereof may share any or all characteristics with other under bump metals and/or the forming thereof discussed herein (e.g., the under bump metal 227 of FIGS. 7-8, etc.).

For discussion purposes herein, the first conductive layer 521, the second dielectric layer 522, the second conductive layer 525, the third dielectric layer 524, and the fourth dielectric layer 526 may be considered to be components of the interposer 520. Furthermore, the micro bump pad 523 and under bump metal 527 also may be considered to be components of the interposer 520.

As shown in FIG. 15G, during the attaching of the conductive interconnection structure 560, the conductive interconnection structure 560 is electrically connected to the under bump metal 527. At this point, while the wafer support system 1 is attached to the semiconductor die 530 and the mold material 540, the conductive interconnection structure 560 may be electrically connected to the under bump metal 527. The conductive interconnection structure 560 and/or method of attaching thereof may, for example, share any or all characteristics with any conductive interconnection structure and/or method of attaching thereof discussed herein (e.g., the conductive interconnection structure 260 of FIGS. 7-8, etc.).

As shown in FIG. 15H, during the separating of the wafer support system 1, the wafer support system 1 attached to the semiconductor die 530 and/or the mold material 540 is separated from the semiconductor die 530 and/or mode material 540. The wafer support system 1 and/or the method of separating thereof may, for example, share any or all characteristics with any other wafer support system and/or method of separating thereof discussed herein (e.g., the first wafer support system 1 FIGS. 7-8, etc.).

In the completed example semiconductor device 500, the top surface of the semiconductor die 530 may, for example, be exposed to the outside through the top surface of the mold material 540. For example, the top surface of the semiconductor die 530 and the top surface of the mold material 540 may be coplanar. In another example implementation, the mold material 540 may cover the top surface of the semiconductor die 530.

As with any or all of the examples discussed herein (e.g., with regard to FIGS. 1-6, FIGS. 7-8, etc.), the interposer 520 (or package 500) may, for example, be formed in a mass configuration or as a single unit. As discussed herein, in an example scenario in which the interposer 520 (or package 500) is formed in a mass configuration, a singulation process may be performed.

Figure 16:
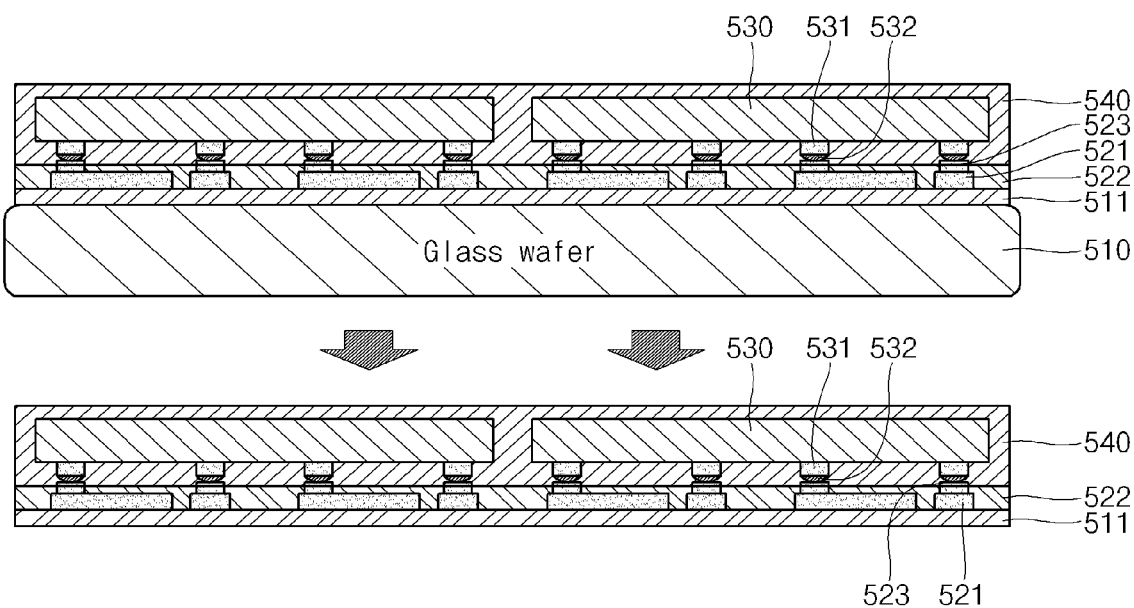
FIG. 16 shows a cross-sectional view illustrating a method of separating a semiconductor die from a carrier, in accordance with various aspects of the present disclosure.

Referring to FIG. 16, such figure shows a cross-sectional view of a method of separating a semiconductor die 530 from a carrier 510, in accordance with various aspects of the present disclosure. The example carrier and/or method of removal thereof illustrated in FIG. 16 and discussed herein may, for example, share any or all characteristics with any carrier and/or removal method discussed herein.

As shown in FIG. 16, a first dielectric layer 511 (for example, a polyimide layer) may be formed on a carrier 510 (for example, a glass wafer), a first conductive layer 521 and a second dielectric layer 522 may be formed on the first dielectric layer 511, a micro bump pad 523 may be formed on the first conductive layer 521, a conductive bump 531 of a semiconductor die 530 may be connected to the micro bump pad 523 through a solder 532, and then the semiconductor die 530 may be molded with a mold material 540.

When a laser beam (for example, an excimer laser beam), thermal beam, infrared beam, etc. is provided to the interface between the carrier 510 and the first dielectric layer 511, an adhesiveness between the carrier 510 and the first dielectric layer 511 may be reduced or eliminated. At such point, the carrier 510 may be easily separated from the first dielectric layer 511.

When the carrier 510 is removed, the first dielectric layer 511 may be exposed to the outside and subsequent processes (for example, the formation of the third dielectric layer 524 and the formation of the second conductive layer 525) may be performed.

Figure 17:
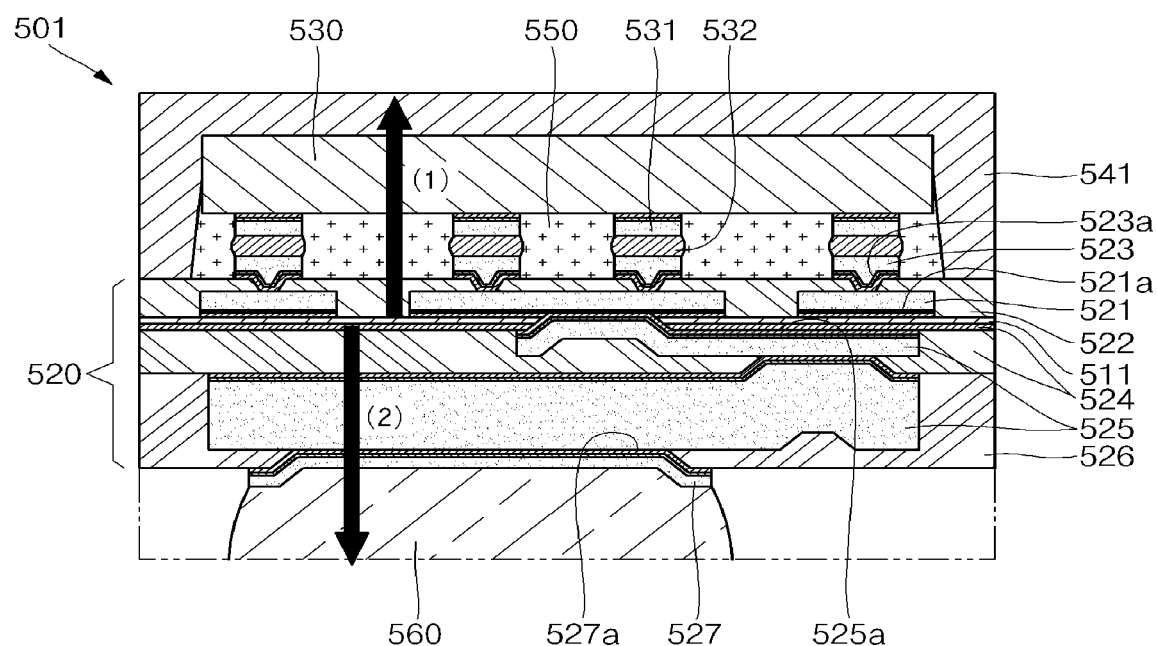
FIG. 17 shows a cross-sectional view illustrating a semiconductor device, in accordance with various aspects of the present disclosure.

Referring to FIG. 17, such figure shows a cross-sectional view of a semiconductor device 501, in accordance with various aspects of the present disclosure.

As shown in FIG. 17, the example semiconductor device 501 may comprise an interposer 520, a semiconductor die 530, a mold material 540, an underfill 550, and a conductive interconnection structure 560. The semiconductor device 501 may, for example, share any or all characteristics with the example semiconductor device 500 shown in FIGS. 15A-15H, and/or with any other semiconductor device presented herein (e.g., with regard to FIGS. 1-16, etc.).

The interposer 520, for example, comprises a first seed layer 521a on a first dielectric layer 511 (for example, a polyimide layer), a first conductive layer 521 on the first seed layer 521a, a second dielectric layer 522 covering the first conductive layer 521, a second seed layer 525a below the first dielectric layer 511 and directly connected to the first seed layer 521a, a second conductive layer 525 below the second seed layer 525a, and a third dielectric layer 524 covering the second conductive layer 525. The line/space/thickness of the first conductive layer 521 may, for example, be smaller than those of the second conductive layer 525.

The interposer 520, or a general grouping of layers, may for example comprise a micro bump seed layer 525a extending into and/or through the second dielectric layer 522 (e.g., via an opening formed therein) and on the first conductive layer 521, a micro bump pad 523 on the micro bump seed layer 525a, an under bump seed layer 527a below the second conductive layer 525, and an under bump metal 527 below the under bump seed layer 527a. In an example implementation, the first seed layer 521a and the second seed layer 525a are directly and electrically connected to each other.

The conductive bump 531 is on the semiconductor die 530 and the conductive bump 531 is electrically connected to the micro bump pad 523 through the solder 532. The underfill 550 is between the semiconductor die 530 and the interposer 520, and the mold material 540 surrounds side parts of the semiconductor die 530 and the underfill 550. In the illustrated example, the mold material 540 surrounds the side surfaces of the semiconductor die 530 and also the top surface thereof.

The conductive interconnection structure 560 may, for example, be connected to the under bump metal 527 and may also be mounted on a substrate as discussed herein.

Labels (1) and (2) shown in FIG. 17 may, for example, show a lamination and/or formation order. For example, in relation to the semiconductor device 501, in accordance with various aspects of the present disclosure, a first portion of the interposer 520 is formed in the direction (1) (e.g., building from the first dielectric layer 511) and the semiconductor die 530 is electrically connected to such first portion, and then the second remaining portion of the interposer 520 is formed in the direction (2) (e.g., building from the first dielectric layer 511) and the conductive interconnection structure 560 is attached to such second remaining portion.

Referring to FIGS. 18A to 18J, such figures show cross-sectional views illustrating a method of manufacturing a semiconductor device 600, in accordance with various aspects of the present disclosure. The example semiconductor devices and/or methods illustrated at FIGS. 18A to 18J may, for example, share any or all characteristics with any or all of the other example semiconductor devices and/or methods presented herein (e.g., with regard to FIGS. 9A-9J, for example substituting a glass, ceramic, metal, or other type of carrier for the illustrated silicon carrier 310, any other figure, or any portion thereof).

The example method of manufacturing the semiconductor device 600 may, for example, comprise providing a carrier 610 with a first dielectric layer 611, forming a first conductive layer 621, forming a second conductive layer 623, forming a micro bump pad 625, attaching a semiconductor die 630 and molding with a mold material 640, attaching a wafer support system 1, removing the carrier 610, forming an opening 611a in the first dielectric layer 611, forming an under bump metal 627 in and/or around the opening 611a, connecting a conductive interconnection structure 660, and separating the wafer support system 1.

Figure 18A:
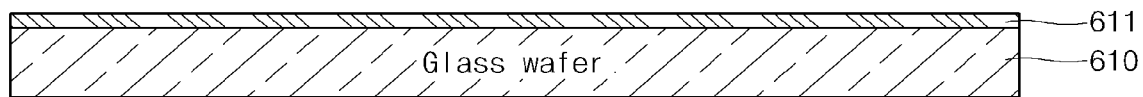
FIGS. 18A to 18J show cross-sectional views illustrating a method of manufacturing a semiconductor device, in accordance with various aspects of the present disclosure.

As shown in FIG. 18A, during the forming or providing of the carrier 610 with the first dielectric layer 611, the carrier 610, such as, for example, a glass, porous ceramic, metal, etc. (e.g., with a planar top surface and a planar bottom surface) is provided. The carrier 610, and the providing or forming thereof, may for example share any or all characteristics with any carrier and discussed herein (e.g., the carrier 110 of FIGS. 1-6, the carrier 210 of FIGS. 7-8, etc.).

A first dielectric layer 611, for example an organic dielectric layer (e.g., formed of polyimide, Benzo Cyclo Butene, Poly Benz Oxazole, etc.) may be (or may have been) formed on the surface of the carrier 610, for example through a coating process. The first dielectric layer 611 and/or the providing or forming thereof may, for example, share any or all characteristics with any dielectric layer and/or the forming thereof discussed herein (e.g., the first dielectric layer 411 of FIGS. 13-14, etc.).

Figure 18B:
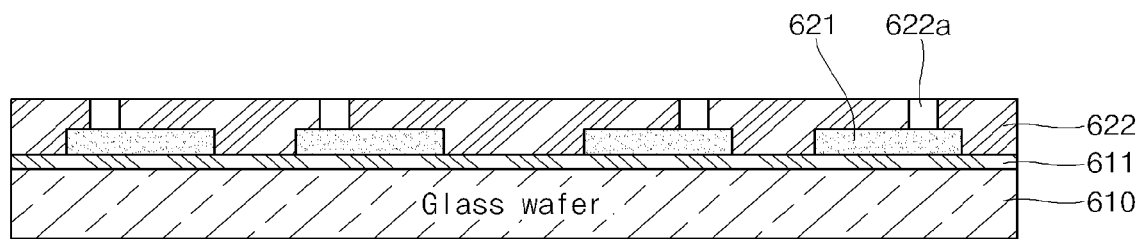

As shown in FIG. 18B, during the forming of the first conductive layer 621, which may also be referred to as a redistribution layer, the first conductive layer 621 may be formed on the first dielectric layer. The first conductive layer 621 and/or the forming thereof may, for example, share any or all characteristics with any other conductive layer and/or the forming thereof discussed herein (e.g., with regard to FIGS. 9-12, etc.). In one example implementation, a first seed layer 621a (see, e.g., FIG. 19) is formed on the first dielectric layer 611, and the first conductive layer 621 is formed on the first seed layer 621a.

The first conductive layer 621 may then be covered with a second dielectric layer 622. The second dielectric layer 622 and/or the forming thereof may, for example, share any or all characteristics with other dielectric layers and/or the forming thereof discussed herein (e.g., with regard to FIGS. 9-12, etc.).

The forming of the first conductive layer 621 (e.g., with or without a seed layer 621a) and the second dielectric layer 622 may be repeated any number of times (e.g., utilizing the same materials and/or processes or different respective materials and/or processes). The example illustrations in FIGS. 18C-18J show two formations of such layers. As such, the layers are provided with similar labels in the figures (e.g., repeating the first conductive layer 621 and the second dielectric layer 622).

In the example illustrated in FIG. 18, since the conductive interconnection structure 660 is later connected to the first conductive layer 621, the line/space/thickness of the first conductive layer 621 may, for example, be formed larger in comparison to the line/space/thickness of the second conductive layer 623 discussed below. The scope of this disclosure, however, is not limited to such relative dimensions.

Figure 18C:
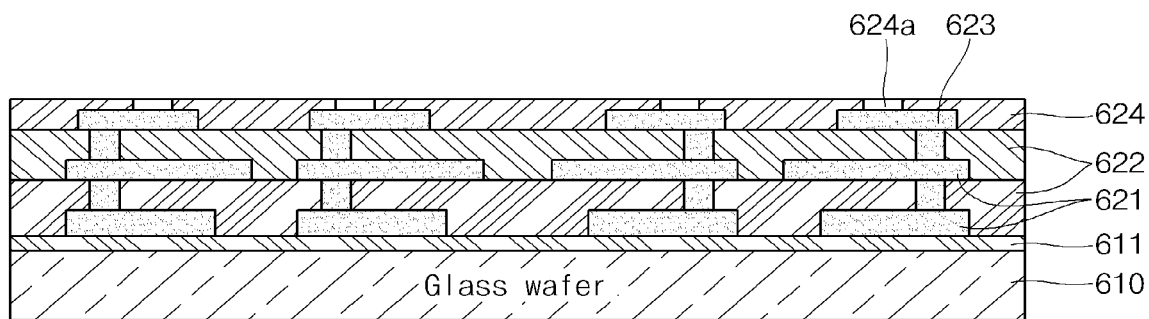

As shown in FIG. 18C, during the forming of the second conductive layer 623, the second conductive layer 623 is formed on the first conductive layer 621 and/or on the second dielectric layer 622. In an example implementation, a second seed layer 623a (see, e.g., FIG. 19) is formed on a top surface the second dielectric layer 622 and/or in an opening (or aperture) thereof extending through the second dielectric layer 622 to the first conductive layer 321, a second conductive layer 623 is formed on the second seed layer 623a, and the second conductive layer 623 is covered with the third dielectric layer 624. Also, an opening 624a may be formed in the third dielectric layer 624 so that a specific area of the second conductive layer 623 corresponding to the opening 624a is exposed to the outside. The second conductive layer 623, the third dielectric layer 624, and/or openings (or apertures) therein, and/or the formation thereof, may share any or all characteristics with the other conductive layers, dielectric layers, and openings, and/or the formation thereof discussed herein (e.g., with regard to FIGS. 1-8, etc.). For example, such formation may be repeated any number of times.

Figure 18D:
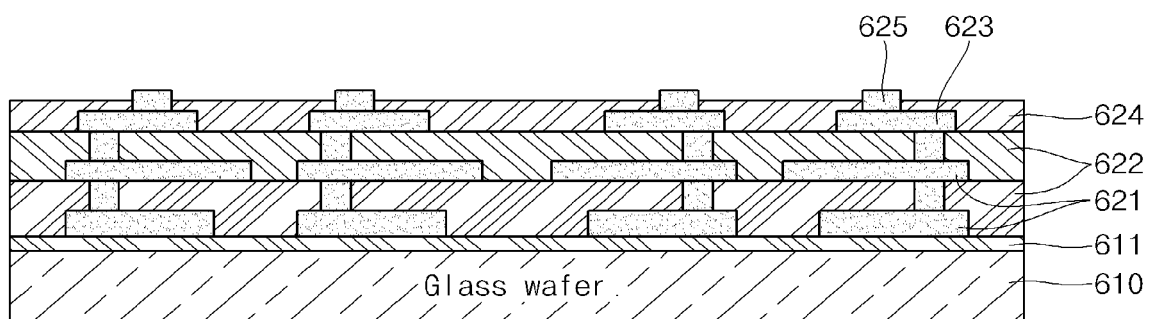

As shown in FIG. 18D, during the forming of the micro bump pad 625 (or other pad, landing, attachment structure, die attachment structure, etc.) in the opening 624*a*, the micro bump pad 625 is formed in the opening 624*a* so that the micro bump pad 625 is electrically connected to the second conductive layer 623. In an example implementation, a micro bump seed layer 625*a* (see, e.g., FIG. 19) is formed at the inside of the opening 624*a* (e.g., on the second conductive layer 623 exposed by the opening 624*a* and/or on side walls of the opening 624*a*) and/or outside of the opening 624*a* (e.g., on the top surface (in FIG. 18D) of the third dielectric layer 624). The micro bump seed layer 625*a* may, for example, be formed utilizing the same material(s) and/or process(es) discussed herein with regard to other seed layers, or may be formed utilizing different respective material(s) and/or process(es). The micro bump seed layer 625*a* and/or micro bump pad 625 may also be referred to herein as a conductive layer.

The micro bump pad 625 may then, for example, be formed on the micro bump seed layer 625*a*. For example, in an example implementation, the micro bump seed layer 625*a* is interposed between the second conductive layer 623 and the micro bump pad 625. The micro bump pad 625 and/or the forming thereof may, for example, share any or all characteristics with any other pad or micro bump pad and/or the forming thereof discussed herein (e.g., with regard to FIGS. 9-12, FIGS. 1-6, etc.). The micro bump seed layer 625*a* and/or micro bump pad 625 may also be referred to herein as a conductive layer.

Though not illustrated in FIGS. 18A-18J, following formation of the under bump metal 625, an edged trim (or profile) process may be performed, for example in which an edge of the wafer being processed is trimmed (or profiled). Such trimming may be performed in a variety of manners, for example by grinding. Such edge trimming may, for example, protect the wafer from chipping and flaking during subsequent processing.

Figure 18E:
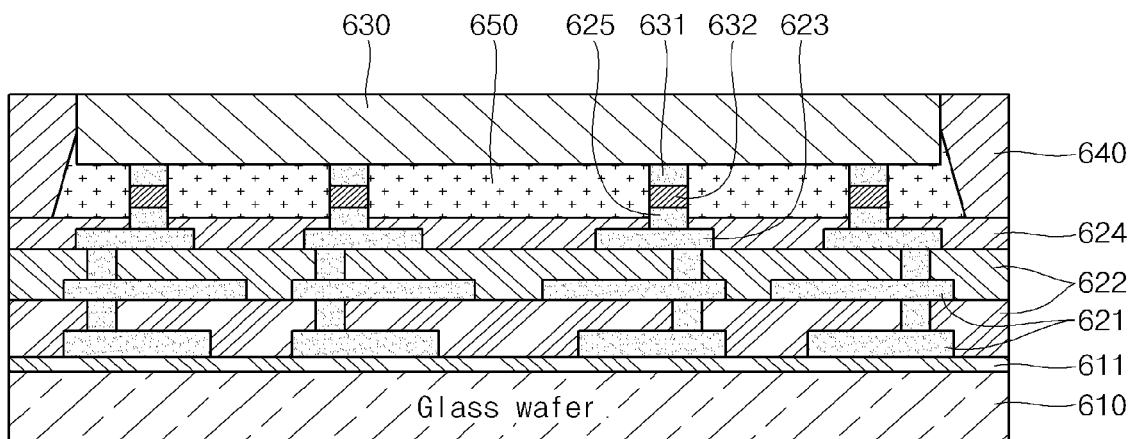

As shown in FIG. 18E, during the attaching of the semiconductor die 630 and the molding with the mold material 640, the semiconductor die 630 is electrically connected to the micro bump pad 625 and is molded with the mold material 640. The semiconductor die 630 and/or the attaching thereof may share any or all characteristics with other semiconductor dies and/or the attaching thereof discussed herein (e.g., with regard to FIGS. 9-12, FIGS. 1-6, etc.). For example, in an example scenario, a solder paste may be applied to the micro bump pad 126 utilizing a stencil and squeegee, the conductive bump 631 of the semiconductor die 630 may be positioned on or in the solder paste (e.g., utilizing a pick-and-place process), and the solder paste may then be reflowed. After attachment of the semiconductor die 630, the assembly may be cleaned (e.g., with hot DI water, etc.), subjected to a flux clean and bake process, subjected to a plasma treatment process, etc.

For example, the conductive bump 631 (or other conductive attachment structure) of the semiconductor die 630 is electrically connected to the micro bump pad 625 through the solder 632. The conductive bump 631 of the semiconductor die 630 may be attached to the micro bump pad 625 (or other pad or landing structure) in any of a variety of manners, non-limiting examples of which are presented herein. For example, the conductive bump 631 may be soldered to the micro bump pad 625 utilizing any of a variety of solder attachment processes (e.g., a mass reflow process, a thermal compression process, etc.), etc. Also for example, the conductive bump 631 may be coupled to the micro bump pad 625 utilizing a conductive adhesive, paste, etc.

In an example implementation, an under fill 650 may be formed between the semiconductor die 630 and the interposer 620 (e.g., the third dielectric layer 624), for example, surrounding portions of the conductive bumps 631 and micro bump pads 625 that are exposed to the underfill 650. The underfill 650, or the formation thereof, may share any or all characteristics with other underfills discussed herein (e.g., with regard to FIGS. 9-12, FIGS. 1-6, etc.).

In the molding process, the semiconductor die 630 and/or interposer 620 may be encapsulated with a mold material 640 (e.g., a molding resin or other mold material or encapsulant), which may then be cured. The mold material 640 and/or the forming thereof, may share any or all characteristics with other mold materials and/or the forming thereof discussed herein (e.g., with regard to FIGS. 9-12, FIGS. 1-6, etc.). In an example implementation, the mold material 640 covers the side surfaces and top surface of the semiconductor die 630. In another example implementation, the mold material 640 only covers the side surfaces of the semiconductor die 630 (or only respective portions thereof), thus leaving the top surface of the semiconductor die 630 exposed from the mold material 640. As discussed herein, the mold material 640 may also be utilized to form a molded underfill, for example instead of the underfill 650.

Figure 18F:
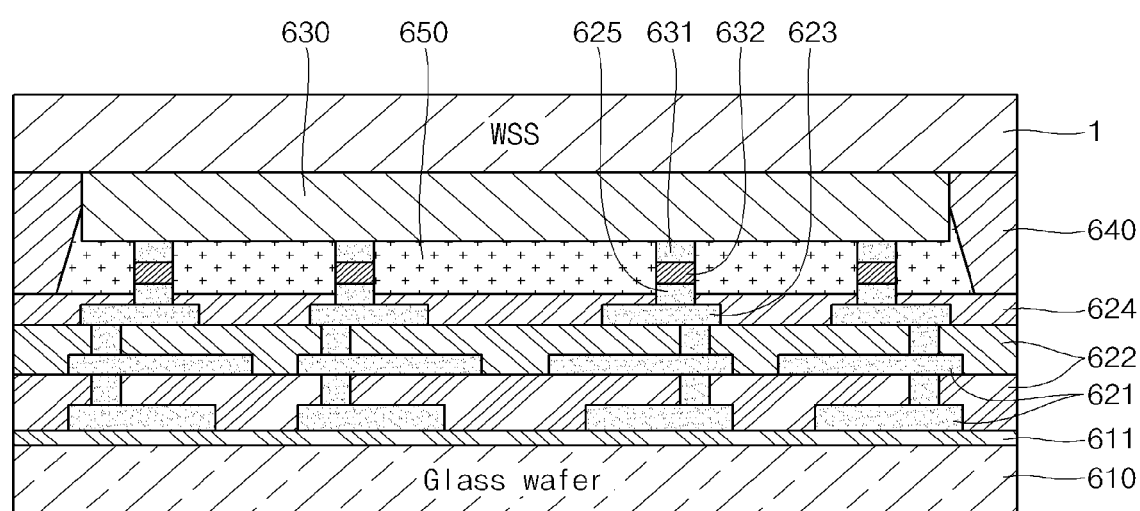

As shown in FIG. 18F, during the attaching of the wafer support system 1, the wafer support system 1 is attached to the top surfaces of the semiconductor die 630 and the mold material 640. In another example implementation, when the mold material 640 covers the top surface of the semiconductor die 630, the wafer support system 1 is attached to the top surface of the mold material 640. The wafer support system 1 and/or the attachment thereof may, for example, share any or all characteristics with other wafer support systems and/or the attachment thereof discussed herein (e.g., with regard to FIGS. 9-12, FIGS. 13-14, FIGS. 15-17, FIGS. 1-8, etc.).

Figure 18G:
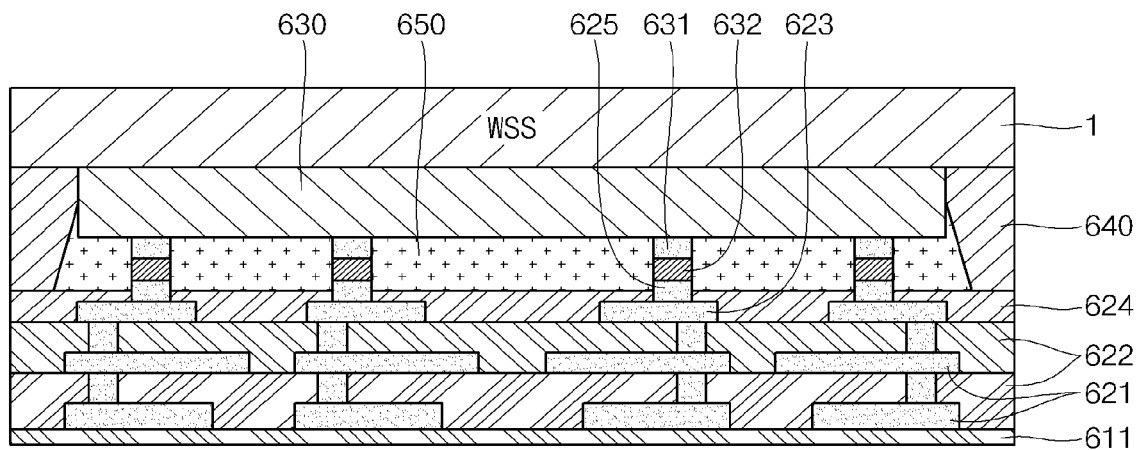

As shown in FIG. 18G, during the removing of the carrier 610, the carrier 610 (for example, a glass wafer or panel) attached to the first dielectric layer 611 is removed. The carrier 610 may be removed in any of a variety of manners, non-limiting examples of which are provided herein. For example, the carrier 610 may be removed in any manner discussed herein with regard to any of the other carriers discussed herein (e.g., with regard to FIGS. 13-14, 1-6, etc.). In an example implementation, as a laser beam, thermal beam, or infrared beam is provided to the carrier 610, the carrier 610 may be separated from the first dielectric layer 611. For example, in an example implementation, light or thermal energy may be provided to the interface of the carrier 610 and the first dielectric layer 611 to reduce or eliminate adhesion between the carrier 610 and the first dielectric layer 611, at which point the carrier 610 may be separated from the first dielectric layer 611. In another example implementation, most (or all) of the carrier 610 may be removed through a mechanical grinding process and then, the remaining carrier 610 (if any) may be removed through a chemical etching process.

In an example scenario in which the entirety of the carrier 610 is removed, only the first dielectric layer 611 (for example, a polyimide layer) originally formed or provided on the surface of the carrier 610 remains. For example, only the first dielectric layer 611 might remain on the bottom surfaces of the first conductive layer 621 and the second dielectric layer 622.

Figure 18H:
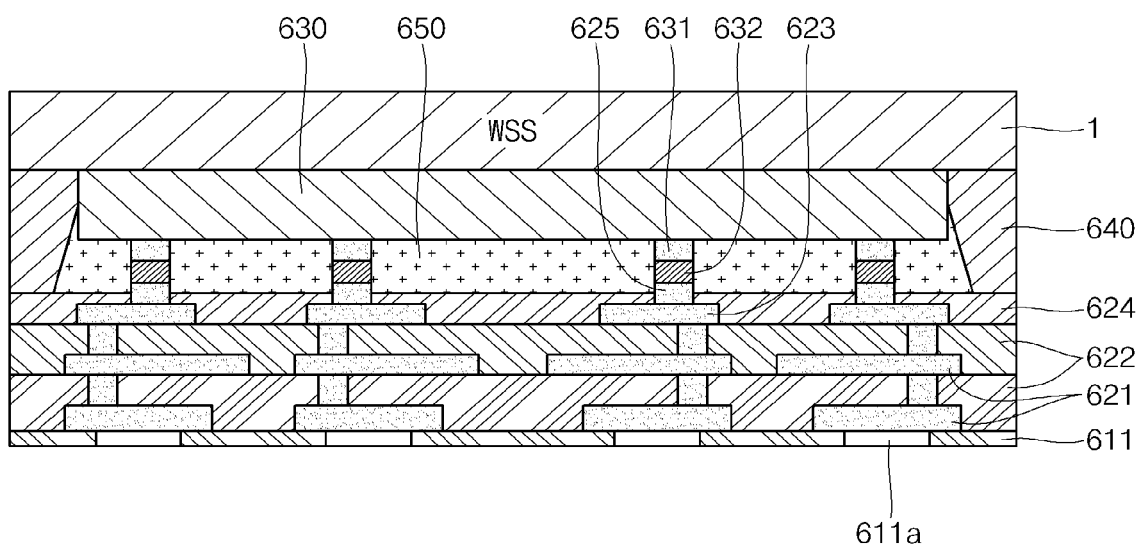

As shown in FIG. 18H, during the forming of the openings 611a (or apertures) in the first dielectric layer 611, a plurality of openings 611a are selectively formed in the first dielectric layer 611. The openings 611a and/or the forming thereof may, for example, share any or all characteristics with other openings and/or the forming thereof discussed herein (e.g., with regard to FIGS. 1-6, FIGS. 7-8, etc.). For example, the openings 611a may be formed in any of a variety of manners (e.g., mechanical and/or laser ablation, chemical etching, photo etching process, photo-masking and etching process, etc.). Each of the openings 611a may, for example, correspond to a respective specific area of the first conductive layer 621 exposed to the outside by the opening 611a. In an example implementation, an opening 611a exposes a respective specific area of the first conductive layer 621 to the outside through the organic first dielectric layer 611. In an example implementation in which the first conductive layer 621 was formed on a first seed layer 621a, a specific area of the first seed layer 621a on which the first conductive layer 621 was formed is exposed to the outside through the organic first dielectric layer 611.

Though the example illustration of FIG. 18H does not show a fourth dielectric layer formed on (e.g., directly on) the first dielectric layer 611, for example as shown in FIG. 9H, such a layer may also be formed in the example of FIG. 18H.

Figure 18I:
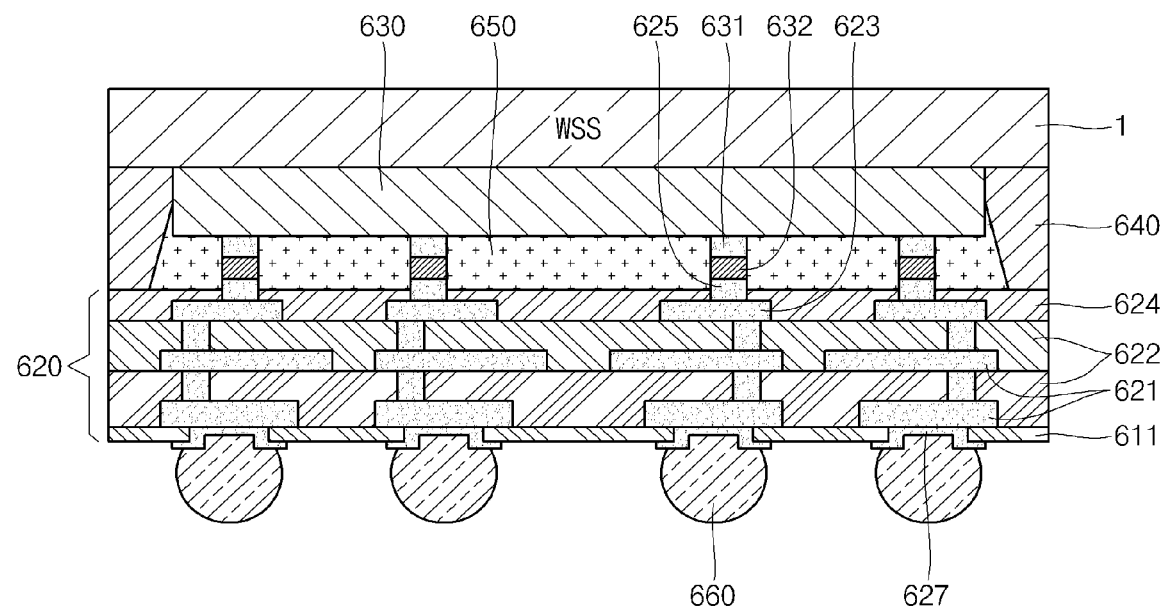

As shown in FIG. 18I, the under bump metal 627 is formed in and/or on the opening 611a, and the conductive interconnection structure 660, is attached to the under bump metal 627. The under bump metal 627 and/or the forming thereof may share any or all characteristics with other under bump metals and/or the forming thereof discussed herein (e.g., with regard to FIGS. 9-12, FIGS. 1-6, etc.). Additionally, the conductive interconnection structure 660 and/or the attachment thereof may share any or all characteristics with other conductive interconnection structures and/or the attachment thereof discussed herein (e.g. with regard to FIGS. 9-12, FIGS. 1-6, etc.).

For example, an under bump seed layer 627a (see, e.g., FIG. 19) may, for example, be formed at the inside of the opening 611a (e.g., on side walls of the opening 611a formed in the first dielectric layer 611, and/or on the first conductive layer 621 or corresponding seed layer 621a) and outside of the opening 611a (e.g., on the bottom surface of the first dielectric layer 611 surrounding or encircling the opening 611a). As discussed herein, the under bump seed layer 627a may be formed using the same material(s) and/or process(es) as used to form any of the seed layers discussed herein (e.g., with regard to FIGS. 9-12, FIGS. 1-6, etc.), or may be formed using different respective material(s) and/or process(es). The under bump seed layer 627a may also be referred to herein as a conductive layer.

As the under bump metal 627 is formed on the opening 611a of the first dielectric layer 611 and the conductive interconnection structure 660 is connected to the under bump metal 627, the conductive interconnection structure 660 is electrically connected to the first conductive layer 621. In the example provided, the first seed layer 621a and the under bump seed layer 627a are directly and electrically connected to each other, mutually facing each other. In an alternative configuration, the first conductive layer 621 may be formed on a first side of the first seed layer 621a, and the under bump metal layer 627 may be formed on a second side of the first seed layer 621a, for example without a dedicated under bump seed layer 627a being formed For discussion purposes herein, the first conductive layer 621, the second dielectric layer 622, the second conductive layer 623, and the third dielectric layer 624 may be considered to be components of an interposer 620. Furthermore, the above-mentioned micro bump pad 625 and under bump metal 627 also may be considered to be components of the interposer 620.

Figure 18J:
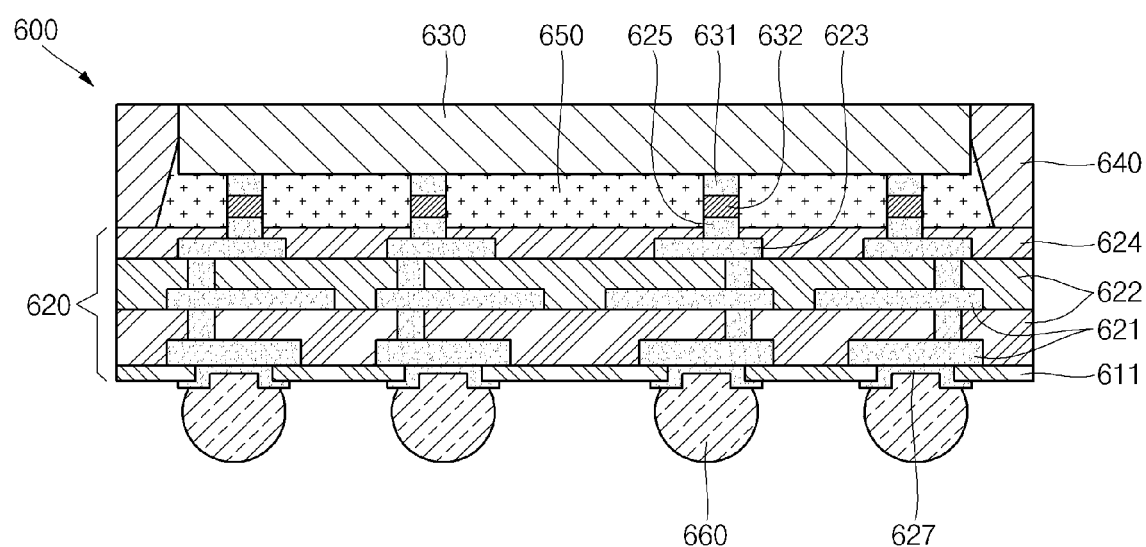

As shown in FIG. 18J, during the separating of the wafer support system 1, the wafer support system 1 is separated from the semiconductor die 630 and/or the mold material 640. The wafer support system 1 and/or the method of separating thereof may, for example, share any or all characteristics with any wafer support system and/or method of separating thereof discussed herein (e.g., with regard to FIGS. 9-12, FIGS. 1-6, etc.).

In the completed example semiconductor device 600, the top surface of the semiconductor die 630 may, for example, be exposed to the outside through the top surface of the mold material 640. For example, the top surface of the semiconductor die 630 and the top surface of the mold material 640 may be coplanar. In another example implementation, the mold material 640 may cover the top surface of the semiconductor die 630.

As with any or all of the examples discussed herein (e.g., with regard to FIGS. 1-17, etc.), the interposer 620 (or package 600) may, for example, be formed in a mass configuration or as a single unit. As discussed herein, in an example scenario in which the interposer 620 (or package 600) is formed in a mass configuration, a singulation process may be performed.

Figure 19:
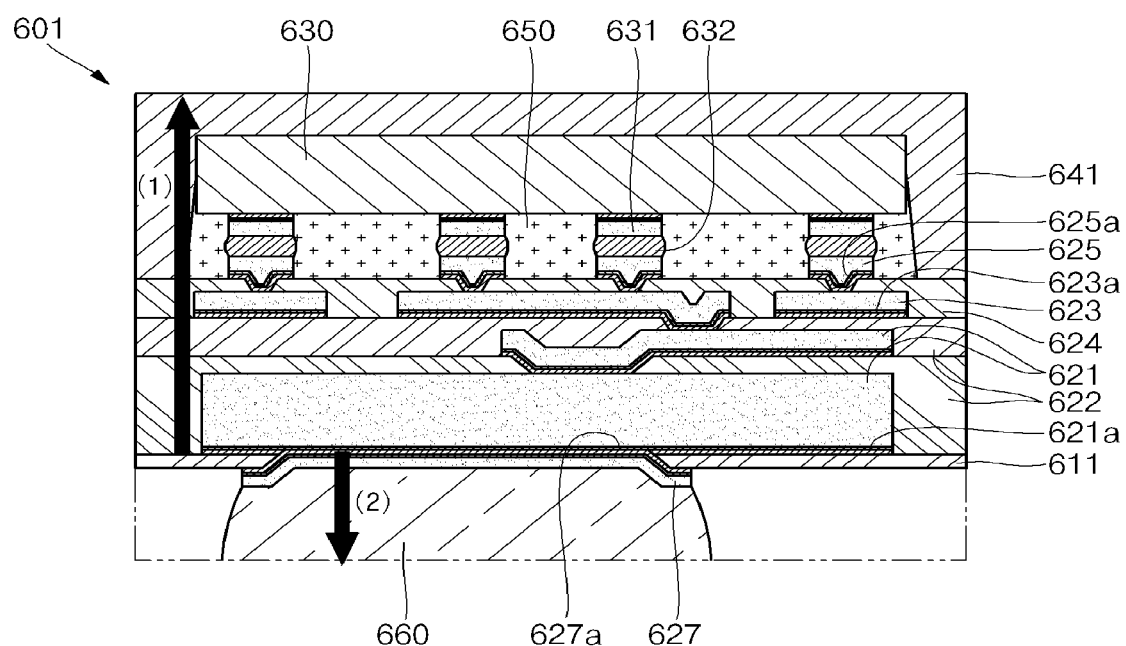
FIG. 19 shows a cross-sectional view illustrating a semiconductor device, in accordance with various aspects of the present disclosure.

Referring to FIG. 19, such figure shows a cross-sectional view illustrating a semiconductor device 601, in accordance with various aspects of the present disclosure.

As shown in FIG. 19, the example semiconductor device 601 may comprise an interposer 620, a semiconductor die 630, a mold material 640, an underfill 650, and a conductive interconnection structure 660. The semiconductor device 601 may, for example, share any or all aspects with the example semiconductor device 600 shown in FIGS. 18A-18J, and/or any other semiconductor device presented herein (e.g., with respect to FIGS. 1-17, etc.).

The interposer 620 may, for example, comprises a first seed layer 621a above a first dielectric layer 611 (for example, a polyimide layer), a first conductive layer 621 on the first seed layer 621a, a second dielectric layer 622 covering the first conductive layer 621, a second seed layer 623a on the first conductive layer 621, a second conductive layer 623 on the second seed layer 623a, and a third dielectric layer 624 covering the second conductive layer 623. The line/space/thickness of the first conductive layer 621 may, for example, be larger than that of the second conductive layer 623.

The interposer 620, or general grouping of layers, may for example comprise a micro bump seed layer 625a extending into and/or through the third dielectric layer 624 (e.g., via an opening formed therein) and on the second conductive layer 623, a micro bump pad 625 on the micro bump seed layer 625a, an under bump seed layer 627a below the first conductive layer 621, and an under bump metal 627 below the under bump seed layer 627a. In an example implementation, the first seed layer 621a and the under bump seed layer 627a are directly and electrically connected to each other.

The conductive bump 631 is on the semiconductor die 630, and the conductive bump 631 is electrically connected to the micro bump pad 625 through the solder 632. The underfill 650 is between the semiconductor die 630 and the interposer 620 (e.g., the third dielectric layer 624), and the mold material 640 surrounds side parts of the semiconductor die 630 and the underfill 650. In the illustrated example, the mold material 640 surrounds the side surfaces of the semiconductor die 630 and also the top surface thereof.

The conductive interconnection structure 660 may, for example, be connected to the under bump metal 627 and may also be mounted on a substrate, as discussed herein.

Labels (1) and (2) shown in FIG. 19 may, for example, show a lamination and/or formation order. For example, in relation to the semiconductor device 601, in accordance with various aspects of the present disclosure, the interposer 620 (or a first portion thereof) is formed in the direction (1) (e.g., building from the first dielectric layer 611) and the semiconductor die 630 is connected to the interposer 620, and then under bump seed layer 627*a* and under bump metal 627 (which may, for example, be considered a second portion of the interposer 620) and the conductive interconnection structure 660 is connected to the interposer 320 in the direction (2) (e.g., building from the first conductive layer 621 or first seed layer 621*a*).

Referring to FIGS. 20A to 20J, such figures show cross-sectional views illustrating a method of manufacturing a semiconductor device 700, in accordance with various aspects of the present disclosure. The example semiconductor devices and/or methods illustrated in FIGS. 20A to 20J may, for example, share any or all characteristics with any or all of the other example semiconductor devices and/or methods presented herein (e.g., with regard to FIGS. 1A to 1J, FIGS. 2-6, etc.).

The example manufacturing method may, for example, comprise providing a carrier 710, forming a first dielectric layer 711, forming a first conductive layer 721, forming a second conductive layer 723 and an under bump metal 725, attaching a first wafer support system 1, removing the carrier 710, forming a micro bump pad 726 at the first conductive layer 721, attaching a semiconductor die 730 and molding with a mold material 740, attaching a second wafer support system 2 and separating the first wafer support system 1 and attaching a conductive interconnection structure 760, and separating the second wafer support system 2.

Figure 20A:
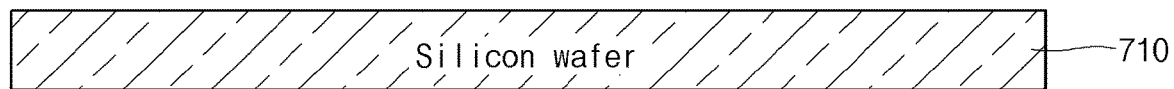
FIGS. 20A to 20J show cross-sectional views illustrating a method of manufacturing a semiconductor device, in accordance with various aspects of the present disclosure.

As shown in FIG. 20A, during the providing (or forming) of the carrier 710, the carrier 710 such as, for example, a silicon wafer with a planar top surface and a planar bottom surface is provided. The carrier 710 may comprise any of a variety of different types of carrier materials. The carrier 710 may, for example, comprise a semiconductor material (e.g., silicon, GaAs, etc.), glass, ceramic (e.g., porous ceramic, etc.), metal, etc. In an example implementation, the carrier 710 does not have any inorganic layer such as silicon oxide, silicon nitride or silicon oxide/silicon nitride on the top surface thereof. Further, if the carrier has a native oxide layer on the top surface, the native oxide layer may be removed using for example a chemical solution. As the result of removing the native oxide layer, the top surface of the carrier 710 may have a clean surface.

Figure 20B:
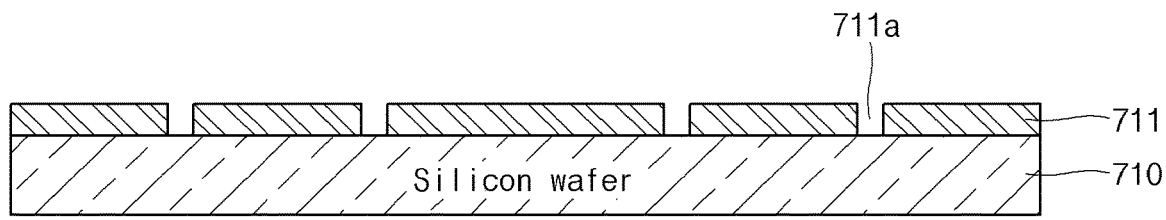

As shown in FIG. 20B, during the forming of the first dielectric layer 711, the first dielectric layer 711 such as, for example, an organic layer (e.g., polymers such as polyimide, Benzocyclobutene (BCB), Polybenzoxazole (PBO), equivalents thereof, combinations thereof, etc.) may be (or may have been) formed on the top surface of the carrier 710. The first dielectric layer 711 may be formed by one or more of, for example, spin coating, spray coating, dip coating, rod coating and equivalents thereof, but the scope of this disclosure is not limited thereto. As an example, the first dielectric layer 711 may be formed by laminating a dry film. The first dielectric layer 711 may also be referred to as a passivation layer. Further, an opening 711*a* (or aperture) may be formed in the first dielectric layer 711 using one or more of, for example, a photolithography process, laser and/or mechanical ablation process, chemical etching, and equivalents thereof, but of the scope of this disclosure is not limited thereto. Therefore, a specific area of the top surface of the carrier 710 is directly and/or partially exposed to the outside through the opening 711*a*.

Figure 20C:
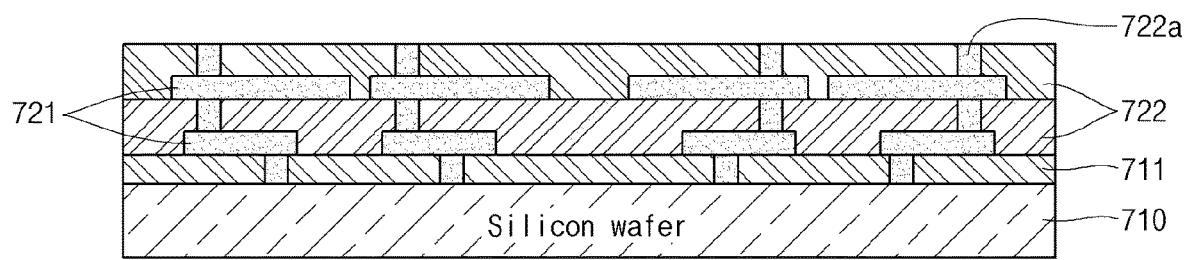

As shown in FIG. 20C, during the forming of the first conductive layer 721 (e.g., a redistribution layer), the first conductive layer 721 may be formed on the top surface of the carrier 710. In one example implementation, a first seed layer 721*a* (see, e.g., FIG. 21) is formed on the exposed surface of the carrier 710 via the opening 711*a* and the first dielectric layer 711, and the first conductive layer 721 is formed on the first seed layer 721*a*. The first conductive layer 721 may then be covered with a second dielectric layer 722, which may also be referred to as a passivation layer.

Figure 20D:
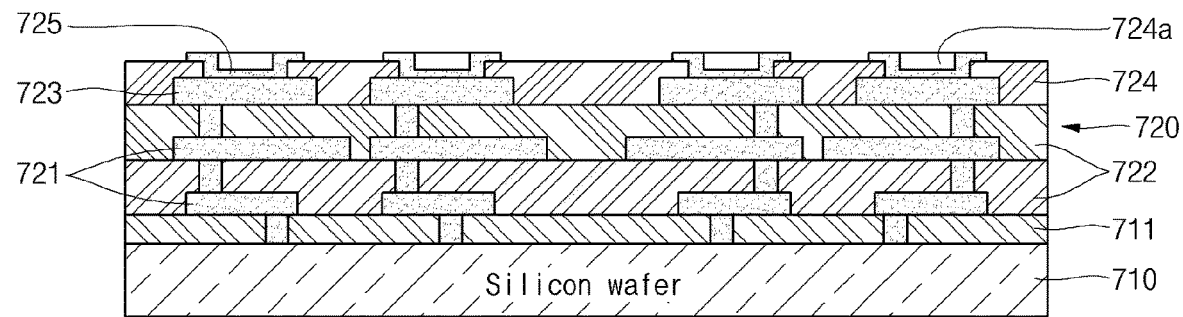

Formation of the first conductive layer 721 (e.g., with or without a seed layer 721*a*) and the second dielectric layer 722 may be repeated any number of times (e.g., utilizing the same materials and/or processes or different respective materials and/or processes). The example illustrations in FIGS. 20C-20D show two formations of such layers. As such, the layers are provided with similar labels in the figures (e.g., repeating the first conductive layer 721 and the second dielectric layer 722).

An opening 722*a* (or aperture) may, for example, be formed in the second dielectric layer 722, and a specific area of the first conductive layer 721 may be exposed to the outside through the opening 722*a*. The opening 722*a* may be formed in any of a variety of manners (e.g., mechanical and/or laser ablation, chemical etching, etc.). Note that the second dielectric layer 722 (or any dielectric layer discussed herein) may also be originally formed having opening 722*a*, for example by masking, or other selective dielectric layer formation process.

As shown in FIG. 20D, during the forming of the second conductive layer 723 and the under bump metal 725, the second conductive layer 723 and under bump metal 725 of at least one layer are formed on the first conductive layer 721 and/or on the second dielectric layer 722. In one example implementation, a second seed layer 723*a* (see, e.g., FIG. 21) is formed at the inside of the opening 722*a* (e.g., on side walls of the opening 722*a* formed in the second dielectric layer 722 and/or on the first conductive layer 721 exposed by the opening 722*a*) and/or outside of the opening 722*a* (e.g., on the top surface of the second dielectric layer 722). As discussed herein, the second seed layer 723*a* may be formed using the same material(s) and/or process(es) as used to form the first seed layer 721*a*, or may be formed using different respective material(s) and/or process(es). The second seed layer 723*a* (or any seed layer discussed herein) may also be referred to herein as a conductive layer.

Continuing the example implementation, the second conductive layer 723 is formed on the second seed layer 723*a*. For example, the second conductive layer 723 may be formed to fill (or at least cover side surfaces of) the opening 722*a* in the second dielectric layer 722. The second conductive layer 723 may, for example, be formed using the same material(s) and/or processes as the first conductive layer 721, or may be formed using different respective material(s) and/or process(es). The second conductive layer 723 may also be referred to herein as a redistribution layer.

The second conductive layer 723 may then, for example, be covered with the third dielectric layer 724. The third dielectric layer 724 may be formed of any of a variety of materials and/or utilizing any of a variety of dielectric-forming processes. For example, the third dielectric layer 724 may be formed utilizing the same material(s) and/or process(es) as utilized to form the second dielectric layer 722.

An opening 724a (or aperture) may, for example, be formed in the third dielectric layer 724, and a specific area of the second conductive layer 723 may be exposed to the outside through the opening 724a. The opening 724a may be formed in any of a variety of manners (e.g., mechanical and/or laser ablation, chemical etching, etc.). Alternatively, for example, the third dielectric layer 724 may be originally formed with the opening 724a therein.

An under bump seed layer 725a (see, e.g., FIG. 21) may, for example, be formed at the inside of the opening 724a and/or outside of the opening 724a. The under bump seed layer 725a and/or the forming thereof may, for example, share any or all characteristics with any other under bump seed layer and/or the forming thereof discussed herein (e.g., the under bump seed layer 125a discussed herein with regard to FIGS. 1, 2-6, etc.).

An under bump metal 725 is formed on the under bump seed layer 725a. The under bump metal 725 and/or the forming thereof may, for example, share any or all characteristics with any under bump metal and/or the forming thereof (e.g., the under bump metal 125 and/or the forming thereof discussed herein with regard to FIGS. 1, 2-6, etc.).

Figure 20E:
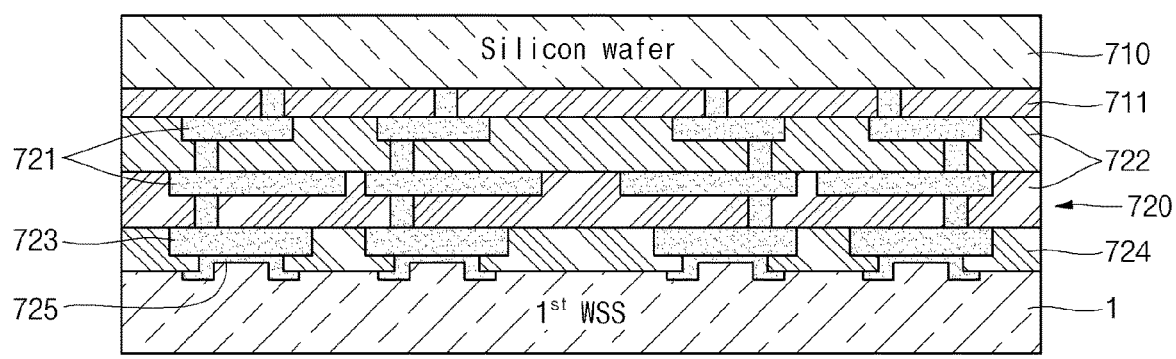

As shown in FIG. 20E, during the attaching of the first wafer support system 1 (WSS), the first wafer support system 1 is attached to the third dielectric layer 724. For example, the first wafer support system 1 may be attached to the third dielectric layer 724 and to the under bump metal 725. At this point, the carrier 110 that is shown at the bottom of FIG. 20D is repositioned to the top of FIG. 20E (e.g., the diagram is inverted). The first WSS 1 and/or the attaching thereof may, for example, share any or all characteristics with any other wafer support system and/or the attaching thereof (e.g., the first WSS 1 discussed herein with regard to FIGS. 1 and 2-6, etc.).

Figure 20F:
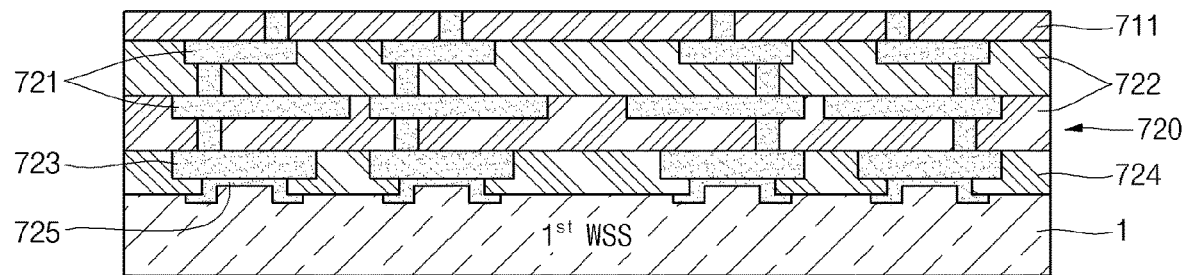

As shown in FIG. 20F, during the removing of the carrier 710, the carrier 710 (for example, a silicon wafer on which the first dielectric layer 711 was formed) on a side of the structure opposite the first wafer support system 1 is removed. In an example implementation, most of the carrier 710 may be removed through a mechanical grinding process and then, the remaining carrier 710 may be removed through a chemical etching process. For example, a silicon carrier may be ground to 10-30 urn thickness, and then the remainder may be removed by a process other than grinding (e.g., by chemical etching, etc.). In such a manner, as a result, the first dielectric layer 711 and a specific area of the first conductive layer 721 (e.g., more specifically the first seed layer 721a, see, e.g., FIG. 21) formed on the surface of the carrier 710 are exposed to the outside. For example, the specific area of the first conductive layer 721 (e.g., more specifically the first seed layer 721a, see, e.g., FIG. 21) is exposed to the outside through the first dielectric layer 711. Note that the first seed layer 721a may be removed at this point if desired.

Figure 20G:
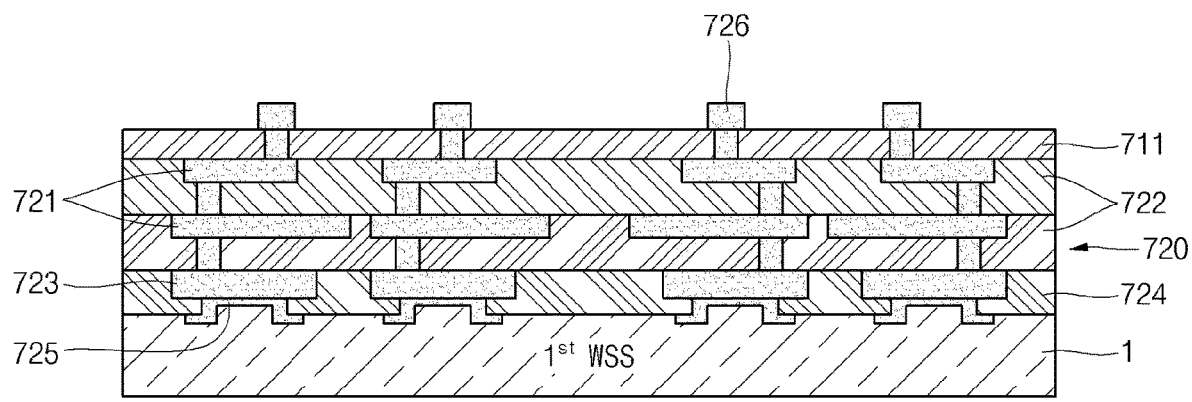
Figure 21:
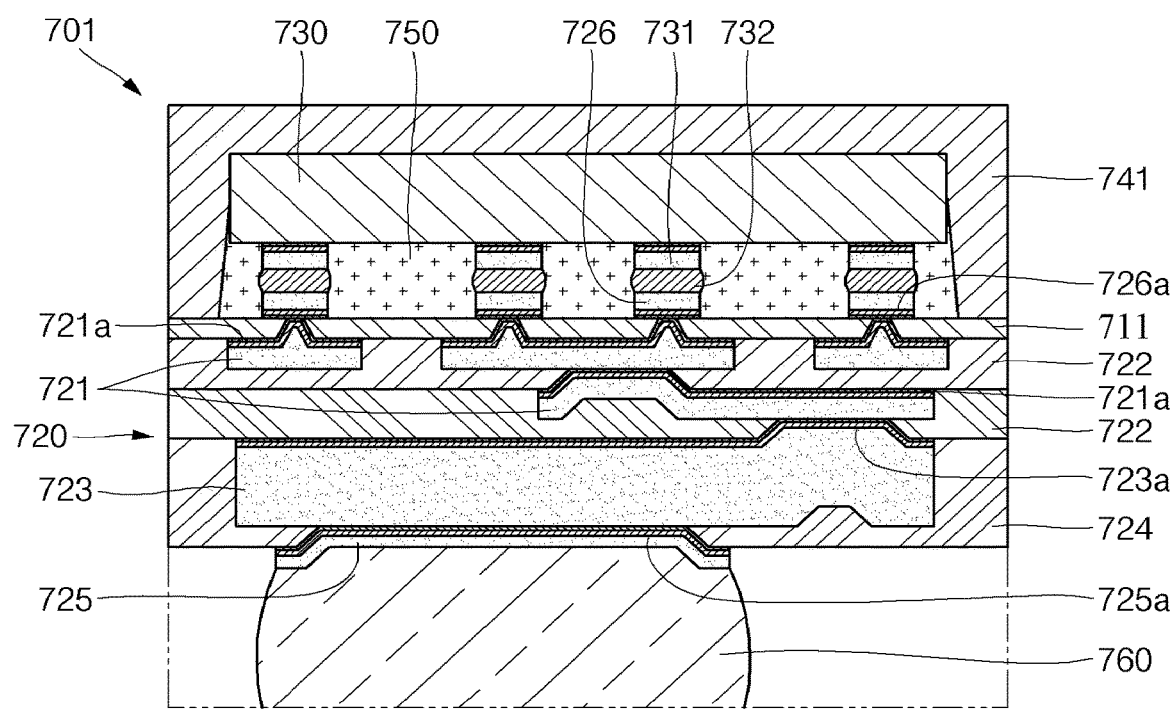
FIG. 21 shows a cross-sectional view illustrating a semiconductor device, in accordance with various aspects of the present disclosure.

As shown in FIG. 20G, during the forming of the micro bump pad 726 (or other pad, land, attachment structure, die attachment structure, etc.), the micro bump pad 726 is formed on the first conductive layer 721 (e.g., more specifically the first seed layer 721a, see, e.g., FIG. 21). For example, the micro bump pad 726 is electrically connected to the first conductive layer 721 (e.g., directly connected, connected via a seed layer, etc.). In an example implementation, the micro bump seed layer 726a (e.g., as shown in FIG. 21) may be formed on the first conductive layer 721 (e.g., more specifically the first seed layer 721a) and/or around the exposed first conductive layer 721 (e.g., on the top surface (in FIG. 20G) of the first dielectric layer 711 surrounding the exposed first conductive layer 721). The micro bump seed layer 726a may, for example, be formed utilizing the same material(s) and/or process(es) discussed herein with regard to other seed layers or conductive layers, or may be formed utilizing different respective material(s) and/or process(es). The micro bump seed layer 726a and/or micro bump pad 726 may also be referred to herein as a conductive layer.

The micro bump pad 726 may then, for example, be formed on the micro bump seed layer 726a. In an example implementation, the first seed layer 721a (e.g., on which the first conductive layer 721 was formed) and the micro bump seed layer 726a (e.g., on which the micro bump pad 726 is formed) may be interposed between the first conductive layer 721 and the micro bump pad 726. For example, the first seed layer 721a and the micro bump seed layer 726a may be directly connected to each other, mutually facing each other. Note that in various example implementations, the forming of the micro bump seed layer 726a might be skipped, and the micro bump pad 726 formed on the first seed layer 721a exposed from the first dielectric layer 711 (e.g., in an example implementation in which the first seed layer 721a is adequately formed to be utilized in such manner). The micro bump pad 726 and/or the forming thereof may, for example, share any or all characteristics with any micro bump and/or the forming thereof discussed herein (e.g., the micro bump pad 126 and/or the forming thereof discussed herein with regard to FIGS. 1 and 2-6, etc.).

For discussion purposes herein, the first dielectric layer 711, the first conductive layer 721, the second dielectric layer 722, the second conductive layer 723, and the third dielectric layer 124 may be considered to be components of an interposer 720. Furthermore, the under bump metal 725 and the micro bump pad 726 described herein may also be considered to be components of the interposer 720.

Figure 20H:
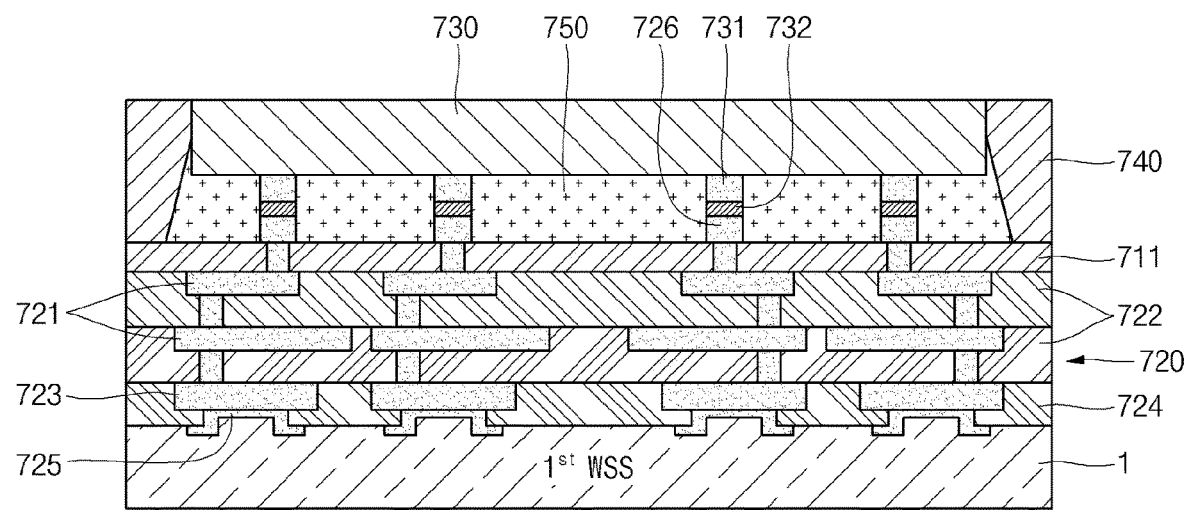

As shown in FIG. 20H, during the attaching of the semiconductor die 730 and the molding with the mold material 740, the semiconductor die 730 is electrically connected to the micro bump pad 726 and is molded with the mold material 740. For example, the conductive bump 731 (or other conductive attachment structure, for example conductive pillar, etc.) of the semiconductor die 730 is electrically connected to the micro bump pad 726 through the solder 732. The conductive bump 731 and/or the forming thereof may, for example, share any or all characteristics with any conductive bump and/or the forming thereof discussed herein (e.g., the conductive bump 131 and/or the forming thereof discussed herein with regard to FIGS. 1 and 2-6, etc.).

In an example implementation, an underfill 750 may be formed between the semiconductor die 730 and the first dielectric layer 711, for example surrounding portions of the conductive bumps 731 and micro bump pads 726 that are exposed to (and thus encapsulated by) the underfill 750. The underfill 750 and/or the forming thereof may, for example, share any or all characteristics with any underfill and/or the forming thereof discussed herein (e.g., the underfill 150 and/or the forming thereof discussed herein with regard to FIGS. 1 and 2-6, etc.).

In the molding (or encapsulating) process, the semiconductor die 730 and/or interposer 720 may be encapsulated with a mold material 740 (e.g., a molding resin or other mold material or encapsulant), which may then be cured. In an example implementation, the mold material 740 only covers the side surfaces of the semiconductor die 730 (or only respective portions thereof), thus leaving the top surface of the semiconductor die 730 exposed from the mold material 740. In another example implementation, the mold material 740 covers the side surfaces and the top surface of the semiconductor die 730. The mold material 740 and/or the forming thereof may, for example, share any or all characteristics with any mold material and/or the forming thereof discussed herein (e.g., the mold material 140 and/or the forming thereof discussed herein with regard to FIGS. 1 and 2-6, etc.).

Figure 20I:
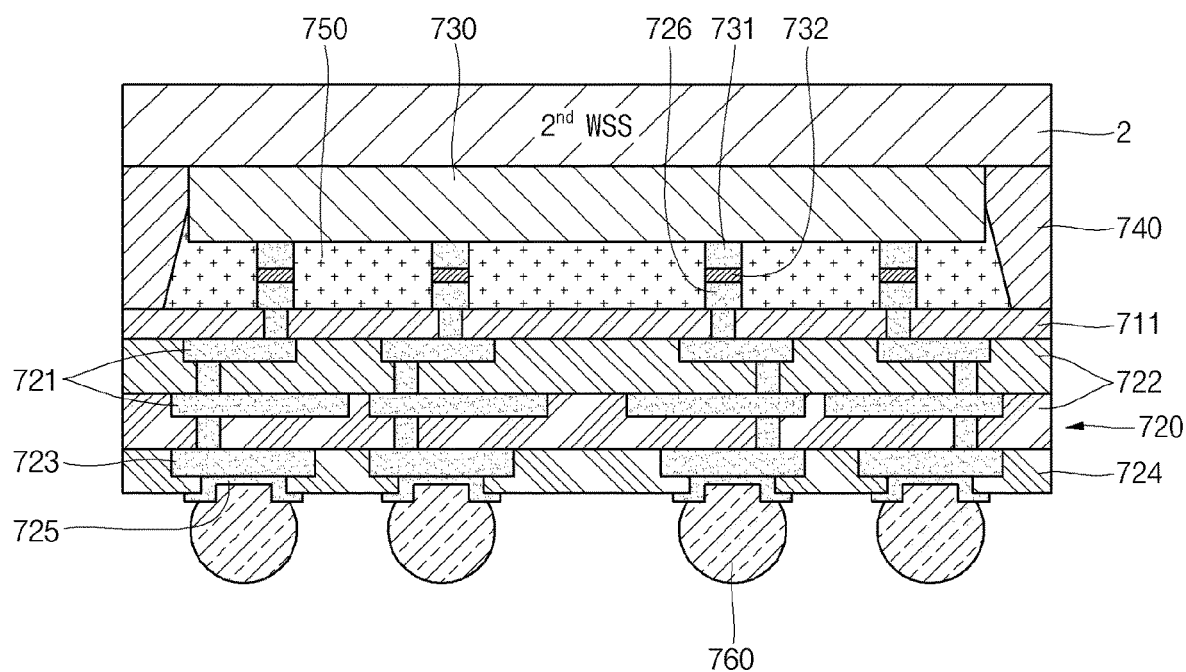

As shown in FIG. 20I, during the attaching of the second wafer support system (WSS) 2, the separating of the first wafer support system 1, and the attaching of the conductive interconnection structure 760, the second WSS 2 may be attached to the semiconductor die 730 and/or mold material 740. The WSS 2 and/or the attaching thereof may, for example, share any or all characteristics with any wafer support system and/or the attaching thereof discussed herein (e.g., the WSS 2 and/or the attaching thereof discussed herein with regard to FIGS. 1 and 2-6, etc.).

After attachment of the second WSS 2, the first wafer support system 1 attached to the third dielectric layer 724 is separated from the third dielectric layer 724 and/or under bump metal 725. Therefore, the under bump metal 725 is exposed to the outside. The separating of the first WSS 1 may, for example, share any or all characteristics with the separating of any wafer support system discussed herein (e.g., the separating of the first WSS 1 discussed herein with regard to FIGS. 1, and 2-6, etc.).

The conductive interconnection structure 760 (or a plurality thereof) may be electrically connected to the exposed under bump metal 725 (e.g., exposed after removal of the first WSS 1). At this point, for example while the second wafer support system 2 is attached to the semiconductor die 730 and the mold material 740, the conductive interconnection structure 760 may be electrically connected to the under bump metal 725. The conductive interconnection structure 760 and/or the forming thereof may, for example, share any or all characteristics with any conductive interconnection structure and/or the forming thereof discussed herein (e.g., the interconnection structure 160 or the formation thereof discussed herein with regard to FIGS. 1 and 2-6, etc.).

Figure 20J:
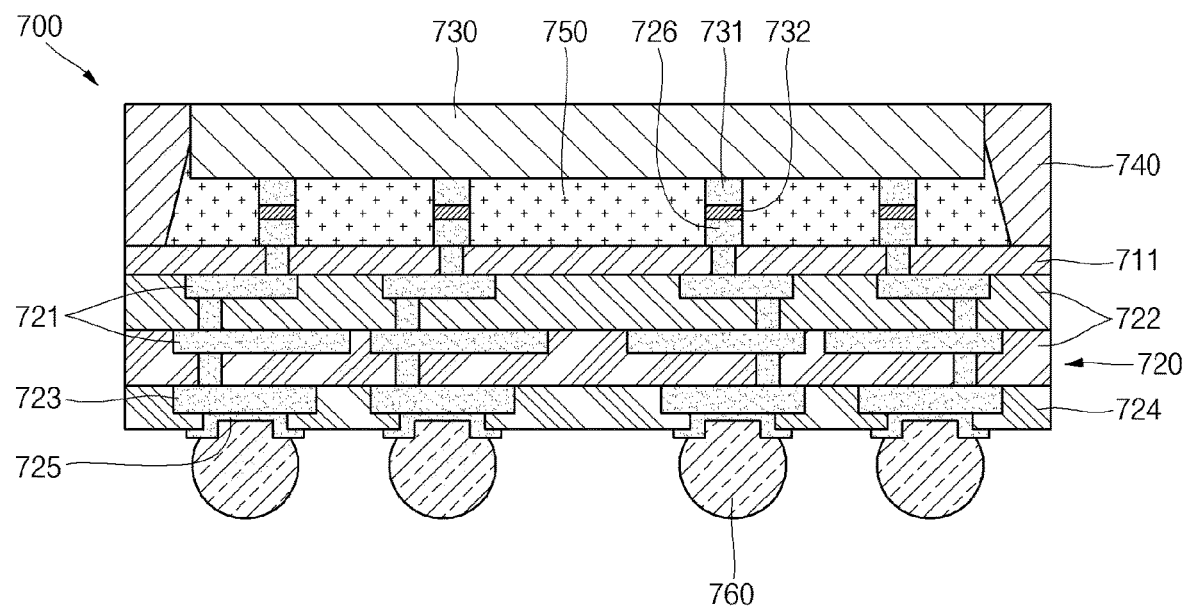

As shown in FIG. 20J, during the separating of the second wafer support system 2, the second wafer support system 2 attached to the semiconductor die 730 and/or the mold material 740 is separated from the semiconductor die 730 and/or mold material 740. The separating of the second WSS 2 may, for example, share any or all characteristics with the separating of any wafer support system discussed herein (e.g., the separating of the second WSS 2 discussed herein with regard to FIGS. 1 and 2-6, etc.).

Referring to FIG. 21, such figure shows a cross-sectional view illustrating a semiconductor device 701, in accordance with various aspects of the present disclosure.

As shown in FIG. 21, the example semiconductor device 701 may comprise an interposer 720, a semiconductor die 730, a mold material 741, an underfill 750, and a conductive interconnection structure 760. The semiconductor device 701 may, for example, share any or all characteristics with any or all other semiconductor devices presented herein (e.g., the example semiconductor device 700 shown in FIGS. 20A-20J, etc.).

The interposer 720, or general grouping of layers, may for example comprise a first seed layer 721a in and/or below a first dielectric layer 711 (e.g., polymers such as polyimide, Benzocyclobutene (BCB), Polybenzoxazole (PBO), equivalents thereof, combinations thereof, etc.), a first conductive layer 721 below the first seed layer 721a, a second dielectric layer 722 covering the first conductive layer 721 (or portions thereof), a second seed layer 723a below the first conductive layer 721, a second conductive layer 723 below the second seed layer 723a, and a third dielectric layer 724 covering the second conductive layer 723 (or portions thereof). The line/space/thickness of the first conductive layer 721 may, for example, be smaller than those of the second conductive layer 723.

The interposer 720 may, for example, comprise a micro bump seed layer 726a extending on the first dielectric layer 111 and on the first seed layer 721a, a micro bump pad 726 on the micro bump seed layer 726a, an under bump seed layer 725a below the second conductive layer 723, and an under bump metal 725 below the under bump seed layer 725a. In an example implementation, the first seed layer 721a and the micro bump seed layer 726a are directly and electrically connected to each other.

The conductive bump 731 is on the semiconductor die 730, and the conductive bump 731 is electrically connected to the micro bump pad 726 through the solder 732. The underfill 750 is between the semiconductor die 730 and the interposer 720 (e.g., the first dielectric layer 711), and the mold material 741 surrounds side and top surfaces of the semiconductor die 730 and the underfill 750.

As discussed herein, the mold material 741 may surround (or cover) the top surface and the side surfaces of the semiconductor die 730. For example, in the example semiconductor device 701, the mold material 741 may completely cover the top surface in addition to the side surfaces of the semiconductor die 730. Since the semiconductor die 730 is generally surrounded at top and side surfaces by the mold material 741, the semiconductor die 730 may be protected from an external environment. In another example implementation, the mold material 741 surrounds only the side surfaces of the semiconductor die 730 but does not surround (or cover) the top surface, therefore the top surface of the semiconductor die 730 may be exposed to the outside. Furthermore, the top surface of the semiconductor die 730 and the top surface of the mold material 741 may be coplanar.

The conductive interconnection structure 760 may, for example, be connected to the under bump metal 726 and may also be mounted on a substrate as discussed herein.

Referring to FIGS. 22A to 22J, such figure show cross-sectional views illustrating a method of manufacturing a semiconductor device 800, in accordance with various aspects of the present disclosure. The example semiconductor devices and/or methods illustrated in FIGS. 22A to 22J may, for example, share any or all characteristics with any or all of the other example semiconductor devices and/or methods presented herein (e.g., with regard to FIGS. 1A to 1J, FIGS. 2-6, 20A to 20J, 21, etc.).

The example method of manufacturing the semiconductor device 800 may, for example, comprise providing a carrier 810, forming an under bump metal 821, forming a first conductive layer 823, forming a second conductive layer 825, forming a micro bump pad 827, attaching a semiconductor die 830 and molding with a mold material 840, attaching a wafer support system 1, removing the carrier 810, connecting a conductive interconnection structure 860, and separating the wafer support system 1.

Figure 22A:
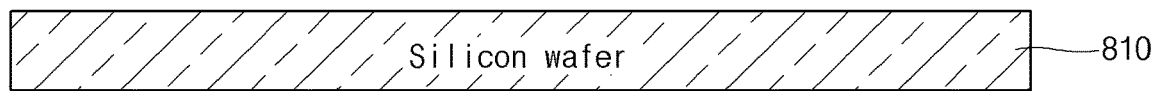
FIGS. 22A to 22J show cross-sectional views illustrating a method of manufacturing a semiconductor device, in accordance with various aspects of the present disclosure.

As shown in FIG. 22A, during the forming or providing of the carrier 810, the carrier 810, such as, for example, a silicon wafer with a planar top surface and a planar bottom surface, is provided.

Figure 22B:
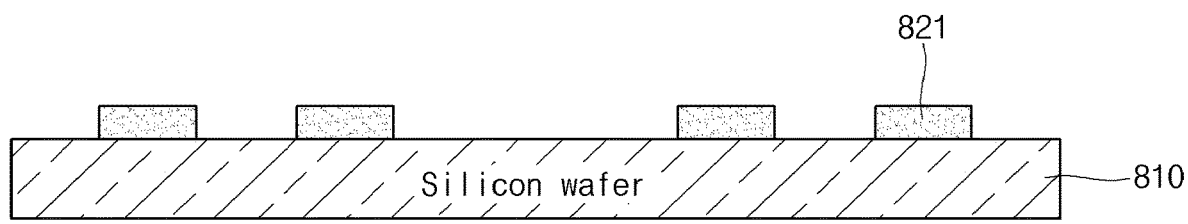
Figure 22C:
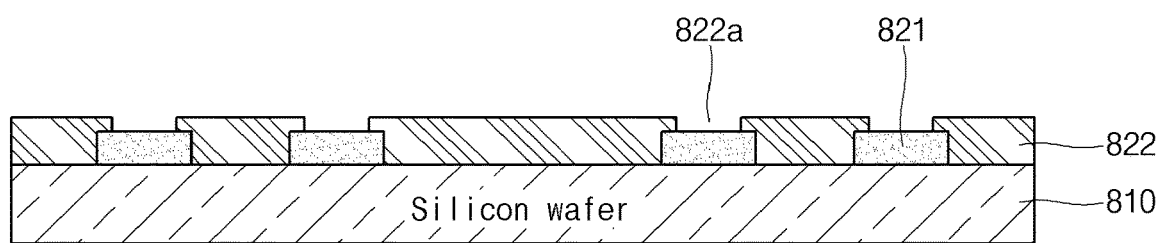

As shown in FIGS. 22B and 22C, during the forming of the under bump metal 821, the under bump metal 821 of at least one layer is directly formed on the carrier 810. In one example implementation, the under bump metal 821 may be formed of any of a variety of materials, non-limiting examples of which are presented herein. For example, the under bump metal 821 may be formed of at least one of chrome, nickel, palladium, gold, silver, alloys thereof, combinations thereof, equivalents thereof, etc. The under bump metal 821 may, for example, comprise Ni and Au. Then under bump metal 821 may also, for example, comprise Cu, Ni, and Au. The under bump metal 821 may be also formed utilizing any of a variety of processes, non-limiting examples of which are presented herein. For example, the under bump metal 821 may be formed utilizing one or more of an electroless plating process, electroplating process, sputtering process, etc. on the carrier 810. The under bump metal 821 may, for example, prevent or inhibit the formation of an intermetallic compound at the interface between the conductive interconnection structure 860 and the first conductive layer 823, thereby improving the reliability of the connection to the conductive interconnection structure 860. Note that the under bump metal 821 may comprise multiple layers on the carrier 810. For example, the under bump metal 821 may comprise a first layer of Ni and a second layer of Au.

Further, the under bump metal 821 may then be covered with a first dielectric layer 822 such as an organic layer (e.g., polymers such as polyimide, Benzocyclobutene (BCB), Polybenzoxazole (PBO), equivalents thereof, combinations thereof, etc.), which may also be referred to as a passivation layer. For example, the first dielectric layer 822 may be formed on the under bump metal 821 and the top surface of the carrier 810. The first dielectric layer 822 may be formed utilizing one or more of spin coating, spray coating, dip coating, rod coating, equivalents thereof, combinations thereof, etc., but the scope of the present disclosure is not limited thereto. As an example, the first dielectric layer 822 may be formed by laminating a dry film.

An opening 822a (or aperture) may, for example, be formed in the first dielectric layer 822, and a specific area of the under bump metal 821 (e.g., the entire top surface, a portion of the top surface, a center region of the top surface, etc.) may be exposed to the outside through the opening 822a. The opening 822a may be formed in any of a variety of manners (e.g., mechanical and/or laser ablation, chemical etching, photolithography, etc.). Note that the second dielectric layer 122 (or any dielectric layer discussed herein) may also be originally formed having opening 122a, for example by masking, or other selective dielectric layer formation process.

Figure 22D:
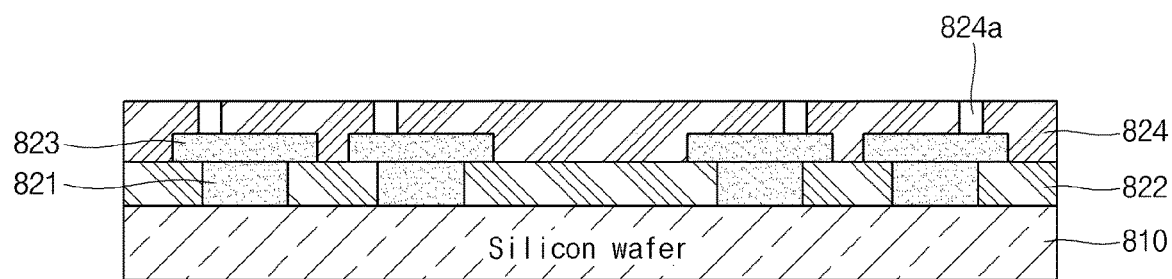

As shown in FIG. 22D, during the forming of the first conductive layer 823, which may also be referred to as a redistribution layer, the first conductive layer 823 may be formed on the under bump metal 821 and the first dielectric layer 822. For example, the first conductive layer 823 may be coupled to the under bump metal 821. In one example implementation, a first seed layer 823a (see, e.g., FIG. 23) is formed on the under bump metal 821 and first dielectric layer 822, and the first conductive layer 823 is formed on the first seed layer 823a. The first conductive layer 823 and/or the forming thereof may, for example, share any or all characteristics with any other conductive layer and/or the forming thereof discussed herein.

The first conductive layer 823 may then be covered with a second dielectric layer 824. The second dielectric layer 824 may also be referred to as a passivation layer. The second dielectric layer 824 and/or the forming thereof may, for example, share any or all characteristics with any other dielectric layer and/or the forming thereof discussed herein.

An opening 824a (or aperture) may, for example, be formed in the second dielectric layer 824, and a specific area of the first conductive layer 823 may be exposed to the outside through the opening 824a. The opening 824a and/or the forming thereof may, for example, share any or all characteristics with any other dielectric layer opening and/or the forming thereof discussed herein.

In the example illustrated in FIG. 22, since the conductive interconnection structure 860 is later connected to the first conductive layer 823 via the under bump metal 821, the line/space/thickness of the first conductive layer 823 may, for example, be formed larger in comparison to the line/space/thickness of the second conductive layer 825 discussed below. The scope of this disclosure, however, is not limited to such relative dimensions.

Figure 22E:
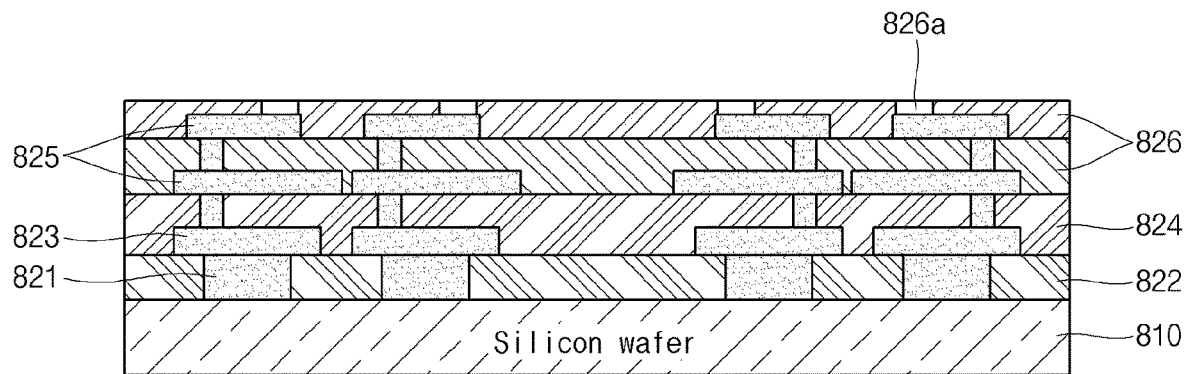

As shown FIG. 22E, forming of a second conductive layer 825, the second conductive layer 825 is formed on the first conductive layer 823 and/or on the second dielectric layer 824. In an example implementation, a second seed layer 825a (see, e.g., FIG. 23) is formed on a top surface of the second dielectric layer 824 and/or in an opening (or aperture) 824a thereof extending through the second dielectric layer 824 to the first conductive layer 823 (e.g., on side walls of the opening 824a). The seed layer 825a and/or the forming thereof may, for example, share any or all characteristics with any seed layer and/or the forming thereof discussed herein. The second conductive layer 825 is then formed on the second seed layer 825a. The second conductive layer 825 and/or the forming thereof may, for example, share any or all characteristics with any conductive layer and/or the forming thereof discussed herein. The second conductive layer 825 is then covered with the third dielectric layer 826, which may also be referred to as a passivation layer. The third dielectric layer 826 and/or the forming thereof may, for example, share any or all characteristics with any dielectric layer and/or the forming thereof discussed herein. Also, an opening 826a may be formed in the third dielectric layer 826 so that a specific area of the second conductive layer 825 corresponding to the opening 826a is exposed to the outside. The opening 826a and/or the forming thereof may, for example, share any or all characteristics with any other dielectric layer opening and/or the forming thereof discussed herein.

Further, the forming of the second conductive layer 825 (e.g., with or without a seed layer 825a) and the third dielectric layer 826 may be repeated any number of times (e.g., utilizing the same materials and/or processes or different respective materials and/or processes). The example illustrations in FIG. 22E shows two formations of such layers. As such, the layers are provided with similar labels in the figures (e.g., repeating the second conductive layer 825 and the third dielectric layer 826).

Figure 22F:
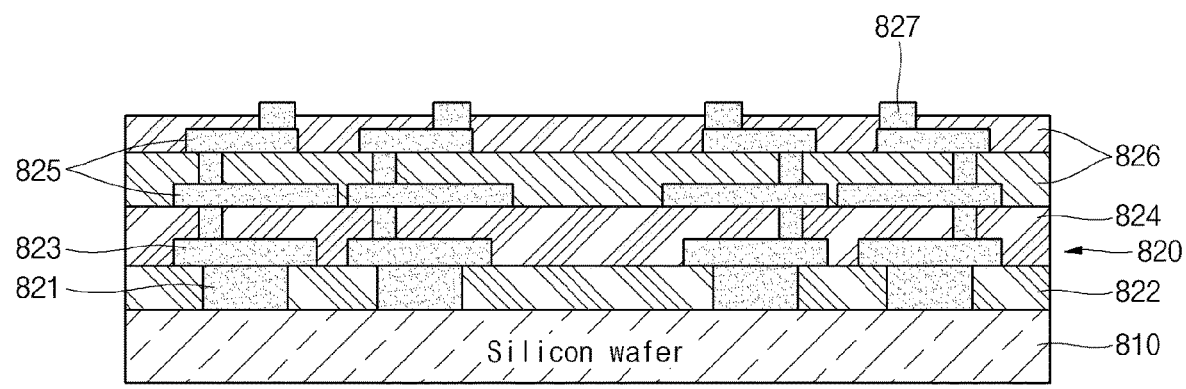

As shown in FIG. 22F, during the forming of the micro bump pad 827 in the opening 826a, the micro bump pad 827 is formed in the opening 826a so that the micro bump pad 827 is electrically connected to the second conductive layer 825. In an example implementation, a micro bump seed layer 827a (see, e.g., FIG. 23) is formed at the inside of the opening 826a (e.g., on the second conductive layer 825 exposed by the opening 826a and/or on side walls of the opening 826a) and/or outside of the opening 826a (e.g., on the top surface (in FIG. 23) of the third dielectric layer 826). The micro bump seed layer 827a and/or the forming thereof may, for example, share any or all characteristics with any other seed layer (e.g., micro bump seed layer, etc.) and/or the forming thereof discussed herein.

The micro bump pad 827 may then, for example, be formed on the micro bump seed layer 827a. For example, in an example implementation, the micro bump seed layer 827a is interposed between the second conductive layer 825 and the micro bump pad 827. The micro bump pad 827 and/or the forming thereof may, for example, share any or all characteristics with any other micro bump pad and/or the forming thereof discussed herein.

For discussion purposes herein, the under bump metal 821, the first dielectric layer 822, the first conductive layer 823, the second dielectric layer 824, the second conductive layer 825, the third dielectric layer 826 and the micro bump pad 827 may be considered to be components of an interposer 820.

Figure 22G:
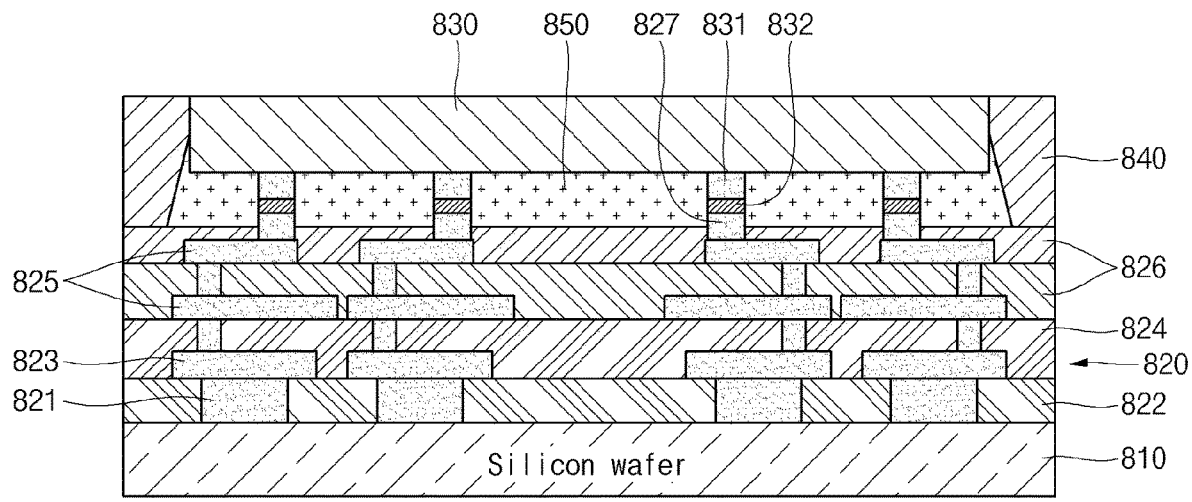

As shown in FIG. 22G, during the attaching of the semiconductor die 830 and the molding with the mold material 840, the semiconductor die 830 is electrically connected to the micro bump pad 827 and is molded with the mold material 840. For example, the conductive bump 831 (or other conductive attachment structure) of the semiconductor die 830 is electrically connected to the micro bump pad 827 through the solder 832. The conductive bump 831 of the semiconductor die 830 may be attached to the micro bump pad 827 in any of a variety of manners, non-limiting examples of which are presented herein. For example, the conductive bump 831 may be soldered to the micro bump pad 827 utilizing any of a variety of solder attachment processes (e.g., a mass reflow process, a thermal compression process, etc.). Also for example, the conductive bump 831 may be coupled to the micro bump pad 827 utilizing a conductive adhesive, paste, etc. The conductive bump 831 and/or the forming thereof may, for example, share any or all characteristics with any conductive bump and/or the forming thereof discussed herein.

In an example implementation, an underfill 850 may be formed between the semiconductor die 830 and the interposer 820 (e.g., the third dielectric layer 826), for example, surrounding portions of the conductive bumps 831 and micro bump pads 827 that are exposed to (and thus encapsulated by) the underfill 850. The underfill 850 and/or the forming thereof may, for example, share any or all characteristics with any underfill and/or the forming thereof discussed herein.

In the molding (or encapsulating) process, the semiconductor die 830 and/or interposer 820 may be encapsulated with a mold material 840 (e.g., a molding resin or other mold material or encapsulant), which may then be cured. In an example implementation, the mold material 840 only covers the side surfaces of the semiconductor die 830 (or only respective portions thereof), thus leaving the top surface of the semiconductor die 330 exposed from the mold material 340. In another example implementation, the mold material 340 covers the side surfaces and the top surface of the semiconductor die 830. The mold material 840 and/or the forming thereof may, for example, share any or all characteristics with any mold material and/or the forming thereof discussed herein.

Figure 22H:
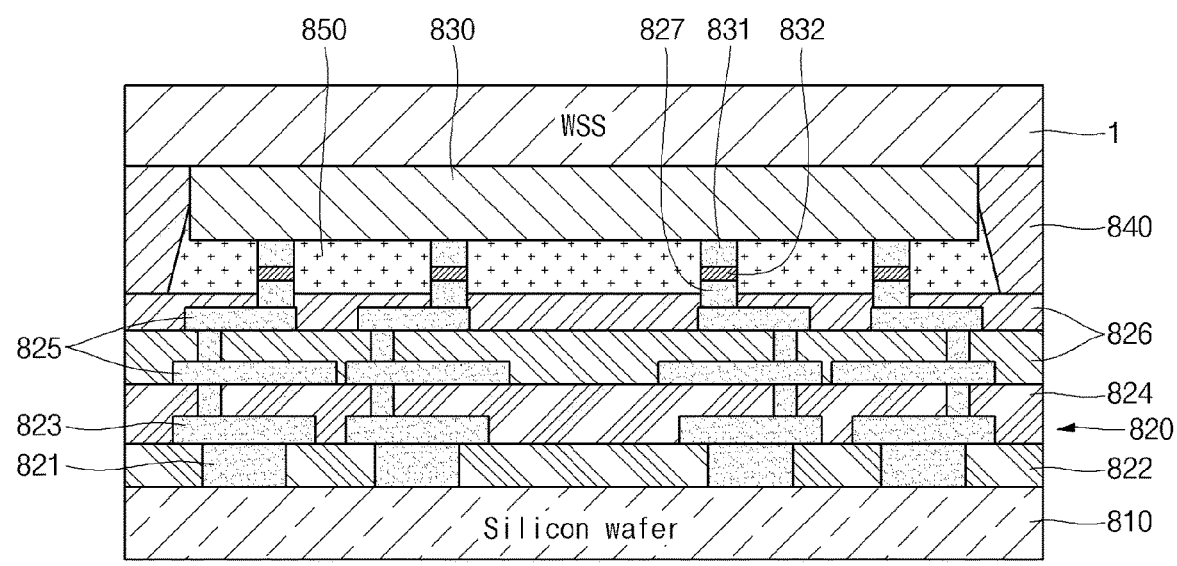

As shown in FIG. 22H, during the attaching of the wafer support system (WSS) 1, the wafer support system 1 is attached to the top surfaces of the semiconductor die 830 and the mold material 840. In another example implementation, when the mold material 840 covers the top surface of the semiconductor die 830, the wafer support system 1 is attached to the top surface of the mold material 840. The wafer support system 1 and/or the attaching thereof may, for example, share any or all characteristics with any wafer support system and/or the attaching thereof discussed herein.

Figure 22I:
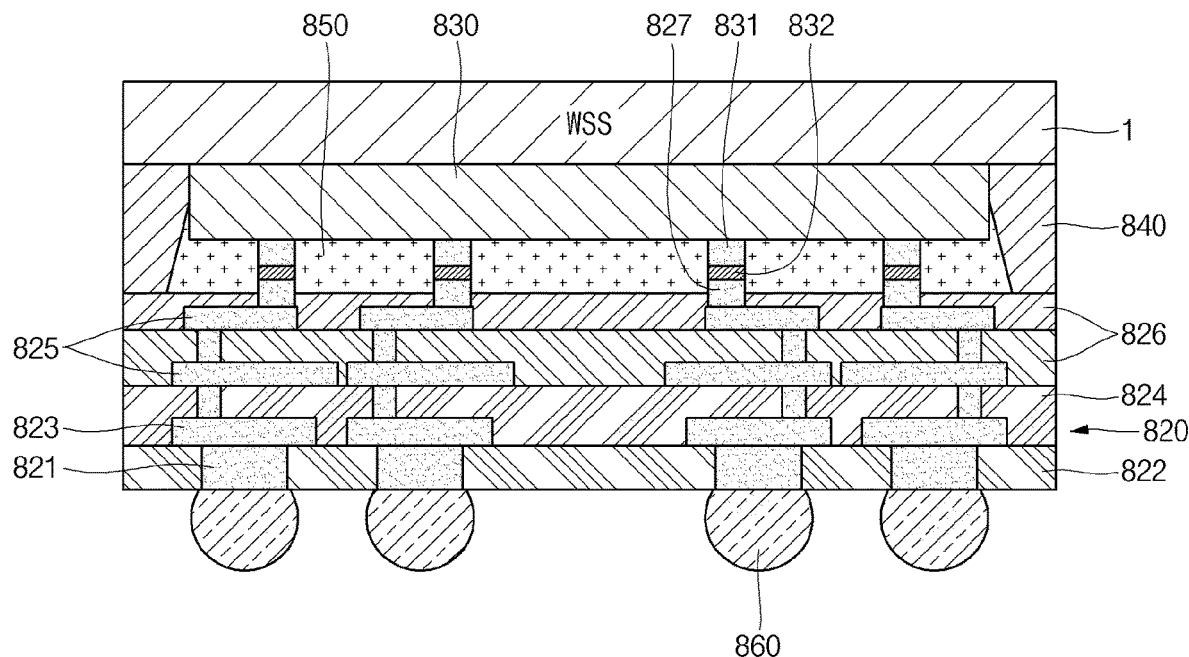

As shown in FIG. 22I, during the removing of the carrier 810, the carrier 810 (for example, a silicon wafer) attached to the under bump metal 821 and the first dielectric layer 822 is removed. For example, most or all of the carrier 810 may be removed through a mechanical grinding process and then, any remaining carrier 810 may be removed completely through a chemical etching process. The removing of the carrier 810 may, for example, share any or all characteristics with any carrier removing discussed herein. In an example implementation, after removal of the carrier 810, the under bump metal 821 may be exposed to the outside through the first dielectric layer 822 (for example, organic layer), and the bottom surfaces of the under bump metal 821 and the first dielectric layer 822 may be coplanar.

As shown in FIG. 22I, during the connecting of the conductive interconnection structure 860, the conductive interconnection structure 860 (or a plurality thereof) is connected to the under bump metal 821. For example, the conductive interconnection structure 860 is electrically connected to the first conductive layer 823 via the under bump metal 821. The conductive interconnection structure 860 and/or the forming thereof may, for example, share any or all characteristics with any other interconnection structure and/or the forming thereof discussed herein.

Figure 22J:
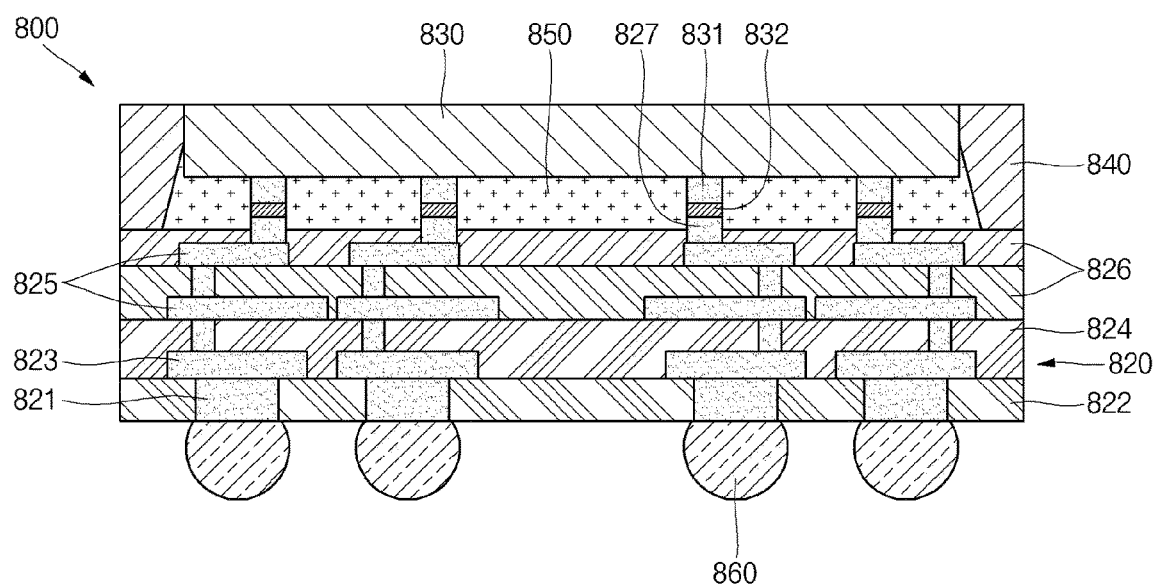

As shown in FIG. 22J, during the separating of the wafer support system 1, the wafer support system 1 is separated from the semiconductor die 830 and/or the mold material 840. The separating of the wafer support system 1 may, for example, share any or all characteristics with any wafer support system separating discussed herein.

In the completed example semiconductor device 800, the top surface of the semiconductor die 830 may, for example, be exposed to the outside through the top surface of the mold material 840. For example, the top surface of the semiconductor die 830 and the top surface of the mold material 840 may be coplanar. In another example implementation, the mold material 840 may cover the top surface of the semiconductor die 830.

As described above, the example semiconductor device 800 according to various aspects of the present disclosure may be completed by forming the interposer on a carrier in a build-up or stack manner, electrically connecting the semiconductor die to the interposer, molding the semiconductor die with molding material, removing the carrier and forming the conductive interconnection structure on the interposer. Therefore, in the semiconductor device 800, misalignment between the first conductive layer and the under bump metal is reduced or eliminated. In addition, in the example semiconductor device 800, the under bump metal is first formed and the conductive layer, dielectric layer, and micro bump are then formed, thereby simplifying overall fabrication process of the semiconductor device 800.

Figure 23:
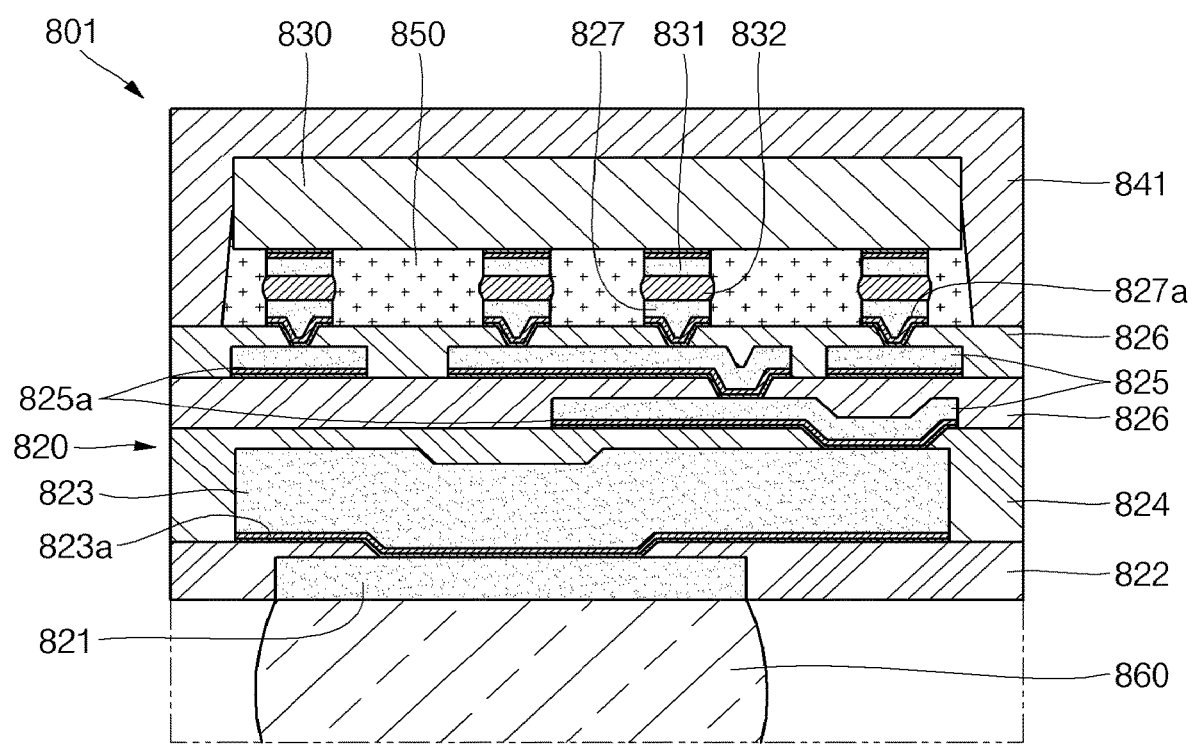
FIG. 23 shows a cross-sectional view illustrating a semiconductor device, in accordance with various aspects of the present disclosure.

Referring to FIG. 23, such figure shows a cross-sectional view illustrating a semiconductor device 801, in accordance with various aspects of the present disclosure.

As shown in FIG. 23, the example semiconductor device 801 may comprise an interposer 820, a semiconductor die 830, a mold material 841, an underfill 850, and a conductive interconnection structure 860. The semiconductor device 801 may, for example, share any or all aspects with the example semiconductor device 800 shown in FIGS. 22A-22J, and/or with any other semiconductor device presented herein.

The interposer 820 may, for example, comprise an under bump metal 821, a first dielectric layer 822, a first seed layer 823a above the under bump metal 821 and the first dielectric layer 822 (for example, an organic layer), a first conductive layer 823 on the first seed layer 823a, a second dielectric layer 824 covering the first conductive layer 823, a second seed layer 825a on the first conductive layer 823, a second conductive layer 825 on the second seed layer 825a, and a third dielectric layer 826 covering the second conductive layer 825. The line/space/thickness of the first conductive layer 823 may, for example, be larger than those of the second conductive layer 825. Further, the interposer 820, or general grouping of layers, may for example comprise a micro bump seed layer 827a extending into and/or through the third dielectric layer 826 (e.g., via an opening formed therein) and on the second conductive layer 825 and a micro bump pad 827 on the micro bump seed layer 827a. In an example implementation, the micro bump seed layer 827a and the second conductive layer 825 are directly and electrically connected to each other.

The conductive bump 831 is on the semiconductor die 830, and the conductive bump 831 is electrically connected to the micro bump pad 827 through the solder 832. The underfill 850 is between the semiconductor die 830 and the interposer 820 (e.g., the third dielectric layer 826), and the mold material 841 surrounds side and top surfaces of the semiconductor die 830 and the underfill 850.

The conductive interconnection structure 860 may, for example, be connected to the under bump metal 821 and may also be mounted on a substrate, as discussed herein.

In summary, various aspects of this disclosure provide a method for manufacturing a semiconductor device, for example comprising providing an interposer without through silicon vias. Various aspects of this disclosure also provide a semiconductor device, for example comprising an interposer without through silicon vias. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A method of manufacturing a semiconductor package, the method comprising:
   providing a first structure (S1) comprising:
     a front side support structure; and
     an S1 dielectric layer directly on the front side support structure,
     wherein the first structure comprises a first S1 side facing away from the front side support structure, and a second S1 side opposite the first S1 side;
   forming a first signal distribution structure (SDS1) on the first S1 side by, at least in part, sequentially forming a first plurality of layers of the first signal distribution structure on the first S1 side in a first direction, the first plurality of layers comprising a first SDS1 conductive layer that laterally routes electrical signals;
   after said forming the first signal distribution structure, removing the front side support structure from the first structure;
   coupling a semiconductor die to the first signal distribution structure in the first direction; and
   after said coupling the semiconductor die and said removing the front side support structure from the first structure, forming a second signal distribution structure (SDS2) on the first signal distribution structure by, at least in part, sequentially forming a second plurality of layers of the second signal distribution structure in a second direction opposite the first direction, the second signal distribution structure comprising a first SDS2 conductive layer that laterally distributes electrical signals.

2. The method of claim 1, wherein said forming the first signal distribution structure on the first S1 side comprises, after said providing the first structure, forming the first signal distribution structure directly on the first S1 side.

3. The method of claim 1, wherein upon completion of the semiconductor package, at least a portion of the S1 dielectric layer remains between the first signal distribution structure and the second signal distribution structure.

4. The method of claim 1 wherein said forming the first signal distribution structure is performed before said coupling the semiconductor die, and said forming the second signal distribution structure is performed after said coupling the semiconductor die.

5. The method of claim 1, wherein the S1 dielectric layer of the provided first structure has no apertures.

6. The method of claim 1, wherein the first signal distribution structure and the second signal distribution structure are TSV-less.

7. The method of claim 1, wherein the front side support structure comprises glass.

8. The method of claim 1, comprising after said removing the front side support structure, removing at least a portion of the S1 dielectric layer.

9. The method of claim 8, wherein said removing at least a portion of the S1 dielectric layer comprises removing only a portion of the S1 dielectric layer.

10. The method of claim 1, wherein said forming the first signal distribution structure comprises sequentially forming the first plurality of layers of the first signal distribution structure after said providing the first structure.

11. The method of claim 1, wherein:
    the semiconductor die comprises a front die side;
    the semiconductor die comprises a die pad at the front die side; and
    said coupling the semiconductor die to the first signal distribution structure comprises coupling the die pad to the first signal distribution structure through a conductive pillar.

12. The method of claim 11, comprising forming an encapsulating material comprising a second encapsulant side facing toward the front side support structure, and a first encapsulant side opposite the second encapsulant side, where the encapsulating material laterally surrounds the semiconductor die and the conductive pillar.

13. The method of claim 11, comprising prior to removing the front side support structure, coupling a back side support structure to the semiconductor die.

* * * * *